United States Patent
De Jager et al.

(10) Patent No.: US 9,645,502 B2
(45) Date of Patent: May 9, 2017

(54) LITHOGRAPHIC APPARATUS, PROGRAMMABLE PATTERNING DEVICE AND LITHOGRAPHIC METHOD

(75) Inventors: Pieter Willem Herman De Jager, Middelbeers (NL); Vadim Yevgenyevich Banine, Deurne (NL); Johannes Onvlee, 's-Hertogenbosch (NL); Lucas Henricus Johannes Stevens, Eindhoven (NL); Sander Frederik Wuister, Eindhoven (NL); Nikolay Nikolaevich Iosad, Geldrop (NL)

(73) Assignee: ASML NETHERLANDS B.V., Veldhoven (NL)

(*) Notice: Subject to any disclaimer, the term of this patent is extended or adjusted under 35 U.S.C. 154(b) by 294 days.

(21) Appl. No.: 14/006,292

(22) PCT Filed: Mar. 7, 2012

(86) PCT No.: PCT/EP2012/053918
§ 371 (c)(1),
(2), (4) Date: Sep. 19, 2013

(87) PCT Pub. No.: WO2012/136434
PCT Pub. Date: Oct. 11, 2012

(65) Prior Publication Data
US 2014/0071421 A1    Mar. 13, 2014

Related U.S. Application Data

(60) Provisional application No. 61/473,636, filed on Apr. 8, 2011, provisional application No. 61/594,875, filed on Feb. 3, 2012.

(51) Int. Cl.
G03B 27/42    (2006.01)
G03F 7/20    (2006.01)
(Continued)

(52) U.S. Cl.
CPC .......... *G03F 7/70191* (2013.01); *G03F 7/704* (2013.01); *G02F 1/1303* (2013.01); *G02F 1/29* (2013.01)

(58) Field of Classification Search
CPC ........ G03F 7/702; G03F 7/70058; G03F 7/20; G03F 7/70025; G03F 7/70291;
(Continued)

(56) References Cited

U.S. PATENT DOCUMENTS 4,090,206 A   5/1978  Pfeifer
4,447,126 A   5/1984  Heidrich
(Continued)

FOREIGN PATENT DOCUMENTS

CN   1503062   6/2004
CN   1602451   3/2005
(Continued)

OTHER PUBLICATIONS

Matusvsky (WO 2009/153792 A2) document is attached.*
(Continued)

*Primary Examiner* — Mesfin Asfaw
(74) *Attorney, Agent, or Firm* — Pillsbury Winthrop Shaw Pittman LLP

(57) ABSTRACT

In an embodiment, a lithographic apparatus is disclosed that includes a modulator configured to expose an exposure area of the substrate to a plurality of beams modulated according to a desired pattern and a projection system configured to project the modulated beams onto the substrate. The modulator includes a deflector to displace the plurality of beams with respect to an exposure area.

21 Claims, 34 Drawing Sheets

(51) Int. Cl.
  *G02F 1/29* (2006.01)
  *G02F 1/13* (2006.01)
(58) Field of Classification Search
  CPC ........ G03F 7/16; G03F 7/7005; G03F 7/7035;
       G03F 7/7055; G03F 7/70558; G03F
       7/707; G03F 7/70716; G02F 1/29; G02F
       1/292; G02F 1/1341; G02F 1/1339; G02F
       2203/12; G02F 1/133504
  See application file for complete search history.

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,541,712 A | 9/1985 | Whitney | |
| 4,640,573 A | 2/1987 | Kataoka | |
| 4,780,730 A | 10/1988 | Dodge | |
| 4,796,038 A | 1/1989 | Allen | |
| 4,844,568 A | 7/1989 | Suzuki | |
| 4,864,216 A | 9/1989 | Kalata | |
| 4,895,735 A | 1/1990 | Cook | |
| 4,952,949 A | 8/1990 | Uebbing | |
| 5,051,762 A | 9/1991 | Lea | |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,317,446 A | 5/1994 | Mir et al. | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,802,223 A * | 9/1998 | Nashimoto ........................ 385/8 |
| 5,838,024 A | 11/1998 | Masuda | |
| 5,840,451 A | 11/1998 | Moore | |
| 5,851,709 A | 12/1998 | Grande et al. | |
| 5,865,115 A | 2/1999 | Fassler et al. | |
| 6,037,965 A | 3/2000 | Gross | |
| 6,060,127 A | 5/2000 | Tatah et al. | |
| 6,133,986 A | 10/2000 | Johnson | |
| 6,140,660 A * | 10/2000 | Mermelstein ................. 250/550 |
| 6,159,832 A | 12/2000 | Mayer | |
| 6,177,151 B1 | 1/2001 | Chrisey et al. | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,531,681 B1 | 3/2003 | Markle | |
| 6,559,438 B1 | 5/2003 | Drobot | |
| 6,566,032 B1 | 5/2003 | Boroson et al. | |
| 6,683,727 B1 | 1/2004 | Goring | |
| 6,765,647 B1 | 7/2004 | Nishi | |
| 6,766,764 B1 | 7/2004 | Chrisey et al. | |
| 6,795,169 B2 | 9/2004 | Tanaka | |
| 6,873,398 B2 * | 3/2005 | Sievers ........................... 355/47 |
| 6,967,711 B2 | 11/2005 | Gui | |
| 7,116,402 B2 | 10/2006 | Gui | |
| 7,141,340 B2 | 11/2006 | Bleeker | |
| 7,379,579 B2 | 5/2008 | Van Der Mast et al. | |
| 7,626,181 B2 | 12/2009 | Visser | |
| 7,816,649 B2 | 10/2010 | Kim et al. | |
| 7,876,420 B2 | 1/2011 | Tsacoyeanes et al. | |
| 7,969,636 B2 | 6/2011 | Naito | |
| 8,531,648 B2 | 9/2013 | De Jager et al. | |
| 8,587,766 B2 | 11/2013 | Mulder et al. | |
| 2002/0012153 A1 | 1/2002 | Sunagawa | |
| 2002/0115021 A1 | 8/2002 | Piao | |
| 2002/0126479 A1 | 9/2002 | Zhai | |
| 2002/0167751 A1 * | 11/2002 | Lee et al. .................... 360/72.1 |
| 2002/0171047 A1 | 11/2002 | Chan | |
| 2003/0043582 A1 | 3/2003 | Chan | |
| 2003/0086141 A1* | 5/2003 | Glaser-Inbari ..... G11B 7/08564 |
| | | | 359/205.1 |
| 2003/0091277 A1 | 5/2003 | Mei | |
| 2004/0124372 A1 | 7/2004 | Gil | |
| 2004/0135159 A1 | 7/2004 | Siegel | |
| 2004/0145712 A1 | 7/2004 | Bleeker | |
| 2004/0257629 A1 | 12/2004 | Noehte | |
| 2005/0062948 A1 | 3/2005 | Van Der Mast et al. | |
| 2005/0167508 A1 | 8/2005 | Syms | |
| 2005/0266172 A1* | 12/2005 | Kay et al. ..................... 427/561 |
| 2006/0001855 A1 | 1/2006 | Lof | |
| 2006/0103719 A1 | 5/2006 | Katzir | |
| 2006/0108508 A1 | 5/2006 | Khalid | |
| 2006/0121275 A1 | 6/2006 | Poulin et al. | |
| 2006/0121375 A1 | 6/2006 | Tsacoyeanes et al. | |
| 2007/0034890 A1 | 2/2007 | Daschner | |
| 2007/0150778 A1 | 6/2007 | Visser | |
| 2007/0182808 A1 | 8/2007 | Stiblert | |
| 2007/0202423 A1 | 8/2007 | Tanabe et al. | |
| 2007/0242253 A1* | 10/2007 | Visser et al. ................... 355/67 |
| 2007/0281247 A1 | 12/2007 | Phillips et al. | |
| 2007/0296936 A1 | 12/2007 | Kato | |
| 2008/0032066 A1 | 2/2008 | Stiblert et al. | |
| 2008/0042969 A1 | 2/2008 | Baker | |
| 2008/0047445 A1 | 2/2008 | Berner | |
| 2008/0137051 A1 | 6/2008 | Maly | |
| 2008/0160211 A1 | 7/2008 | Siegel | |
| 2008/0210888 A1 | 9/2008 | Inoue | |
| 2009/0174877 A1 | 7/2009 | Mulder et al. | |
| 2009/0296063 A1 | 12/2009 | Opower | |
| 2010/0142757 A1 | 6/2010 | Sandstrom | |
| 2010/0227133 A1 | 9/2010 | Liu et al. | |
| 2010/0265557 A1 | 10/2010 | Sallander | |
| 2011/0051211 A1 | 3/2011 | Walther | |
| 2011/0089412 A1 | 4/2011 | Fujimori et al. | |
| 2011/0188016 A1 | 8/2011 | De Jager | |

FOREIGN PATENT DOCUMENTS

| | | |
|---|---|---|
| DE | 4315580 | 11/1994 |
| DE | 4315581 | 11/1994 |
| DE | 19813127 | 10/1998 |
| EP | 1 380 897 | 1/2007 |
| EP | 1 795 966 | 6/2007 |
| EP | 1 826 616 | 8/2007 |
| EP | 1 835 347 | 9/2007 |
| EP | 1 637 915 | 11/2007 |
| EP | 1 647 413 | 8/2008 |
| EP | 1 449 032 | 12/2008 |
| GB | 1308030 | 2/1973 |
| JP | 57-152273 | 9/1982 |
| JP | S58-122543 | 7/1983 |
| JP | 02-034916 | 2/1990 |
| JP | H03-120815 | 5/1991 |
| JP | H04-021826 | 1/1992 |
| JP | 06-275936 | 9/1994 |
| JP | 3144270 | 3/2001 |
| JP | 2003-220484 | 8/2003 |
| JP | 2007-187903 | 7/2007 |
| JP | 2007-234822 | 9/2007 |
| JP | 2009-539251 | 11/2009 |
| JP | 2010-093263 | 4/2010 |
| JP | 2012-503325 | 2/2012 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/071985 | 6/2007 |
| WO | 2007/098935 | 9/2007 |
| WO | 2008/071347 | 6/2008 |
| WO | 2010/032224 | 3/2010 |

(56) References Cited

FOREIGN PATENT DOCUMENTS

| | | |
|---|---|---|
| WO | 2010/151123 | 12/2010 |
| WO | 2011/026610 | 3/2011 |
| WO | 2011/145930 | 11/2011 |

OTHER PUBLICATIONS

International Preliminary Report on Patentability mailed Oct. 17, 2013 in corresponding International Patent Application No. PCT/EP2012/053918.
Taiwan Office Action dated Oct. 27, 2014 in corresponding Taiwan Patent Application No. 101109954.
Japanese Office Action dated Sep. 2, 2014 in corresponding Japanese Patent Application No. 2014-503048.
Taiwan Office Action dated Feb. 6, 2015 in corresponding Taiwan Patent Application No. 101109954.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.
JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Search Report and Written Opinion mailed Oct. 30, 2012 in International Patent Application No. PCT/EP2012/053918.
Chinese Office Action dated Aug. 31, 2015 in corresponding Chinese Patent Application No. 201280027886.8.

\* cited by examiner

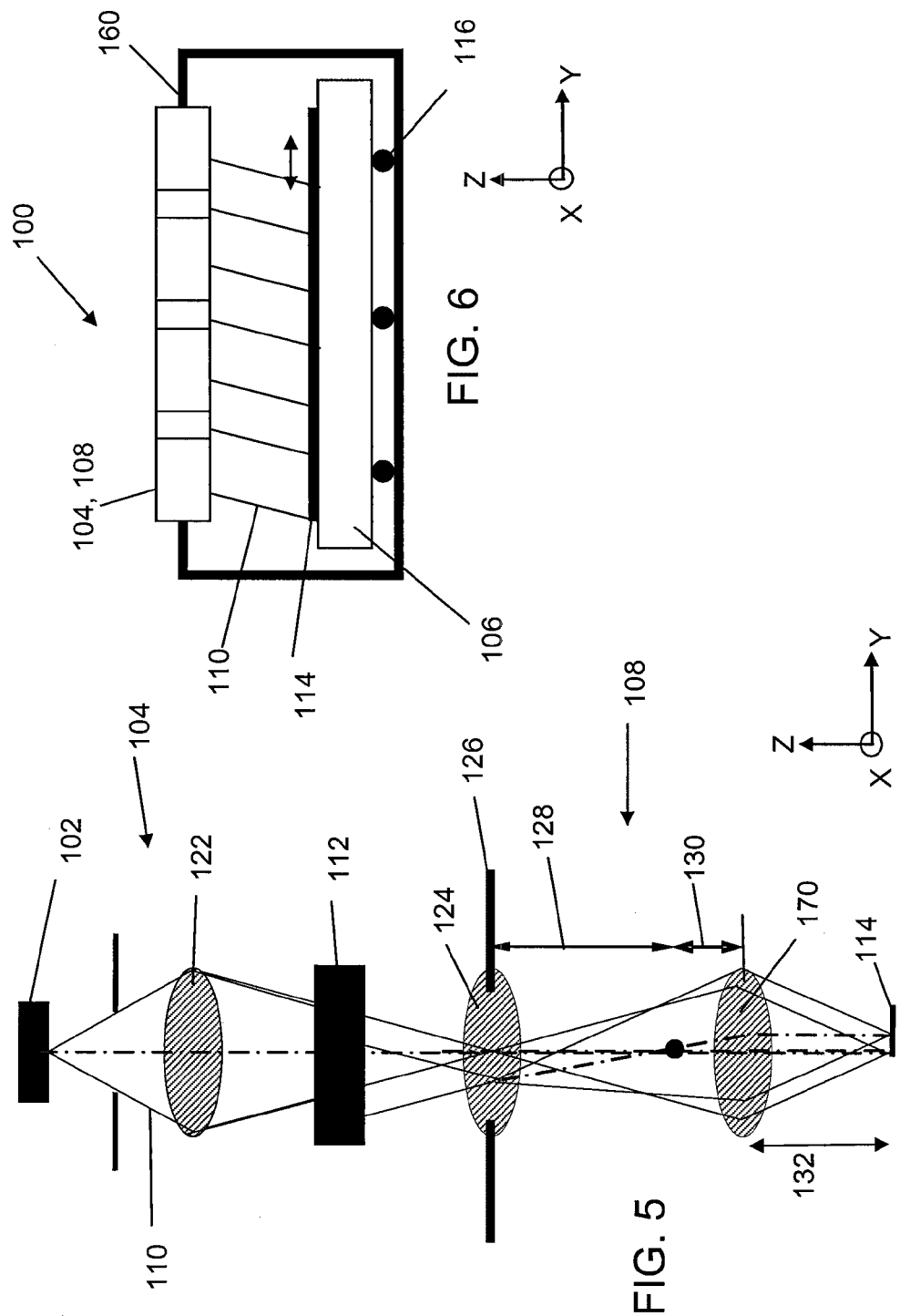

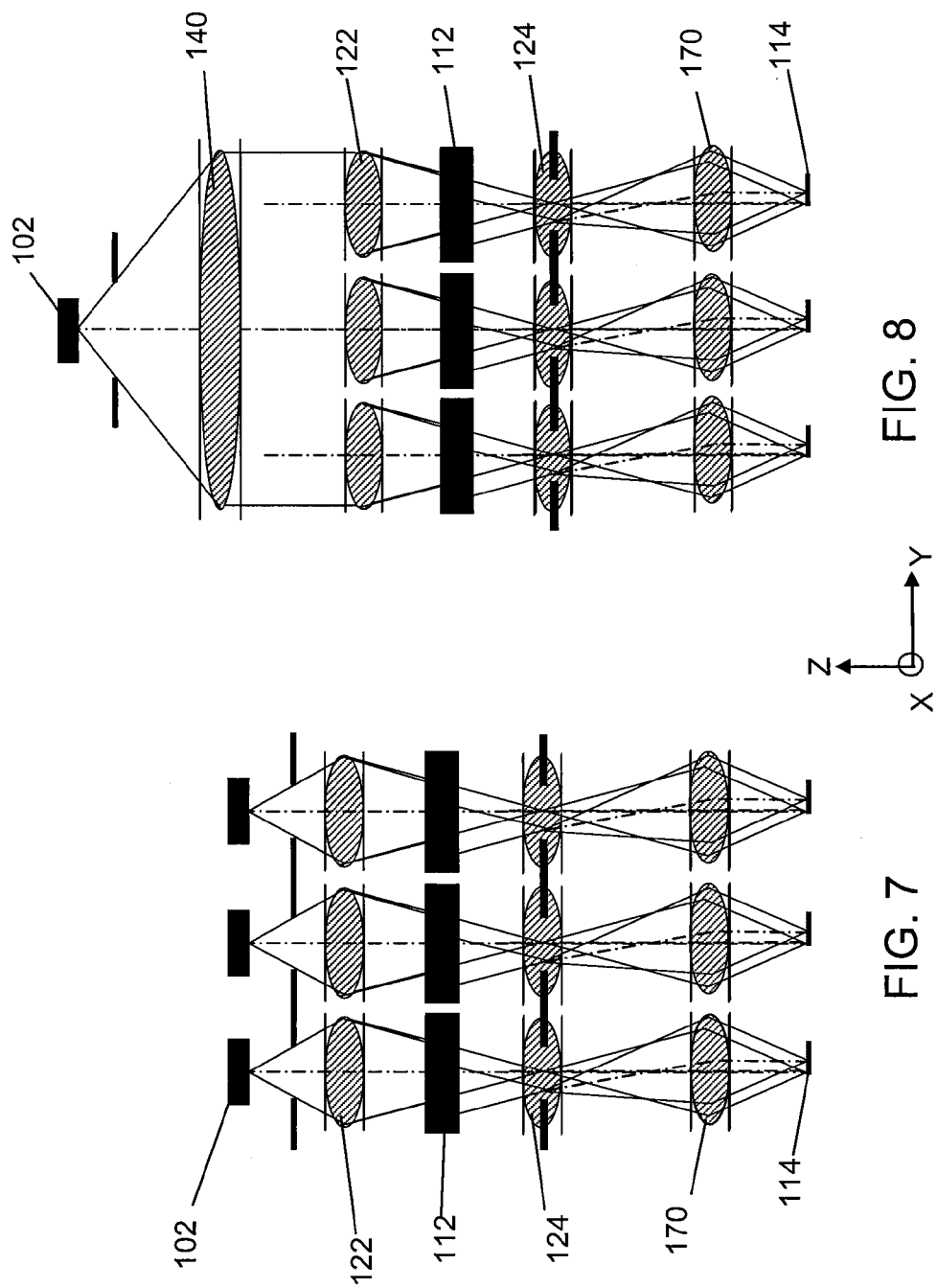

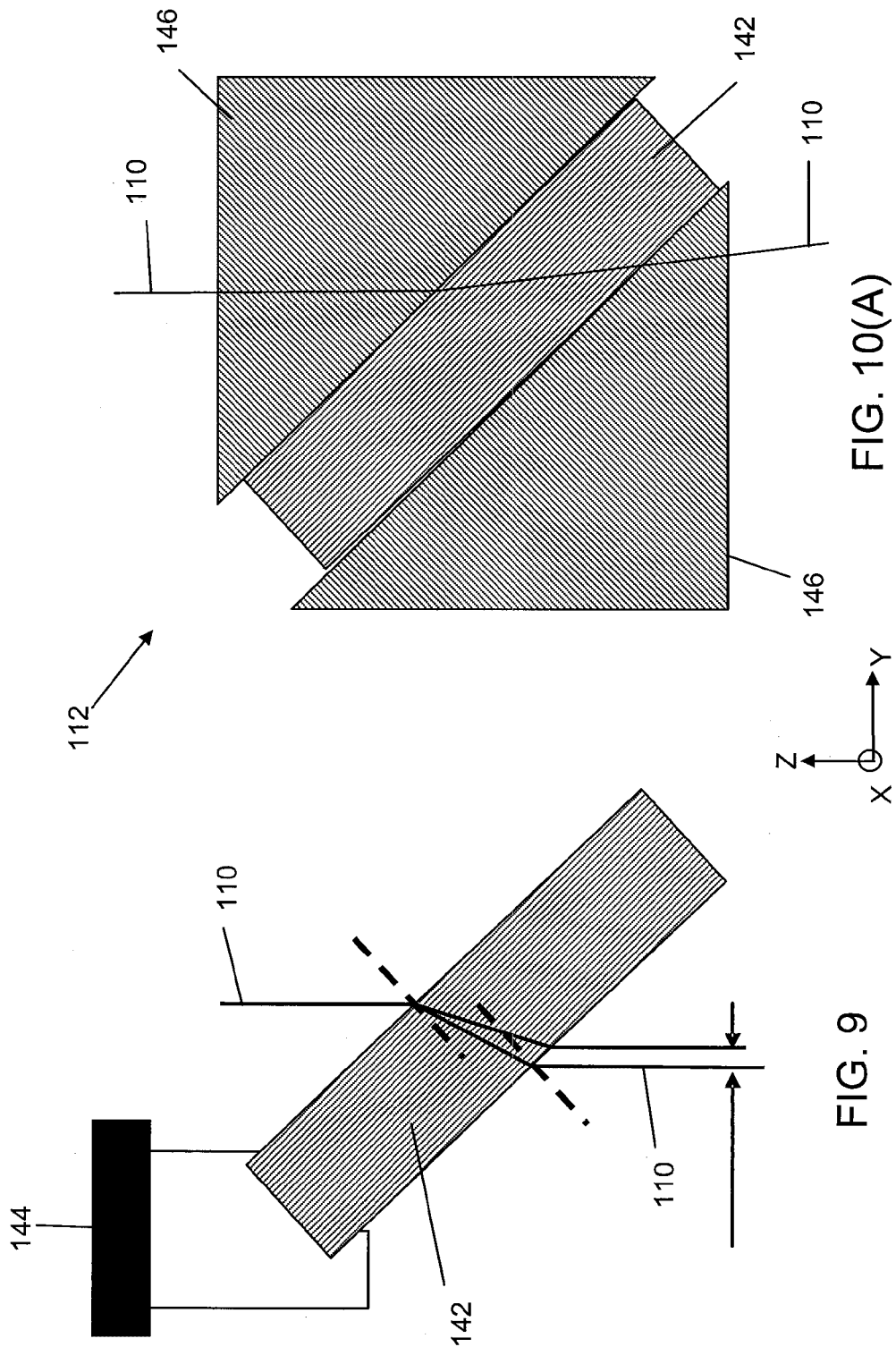

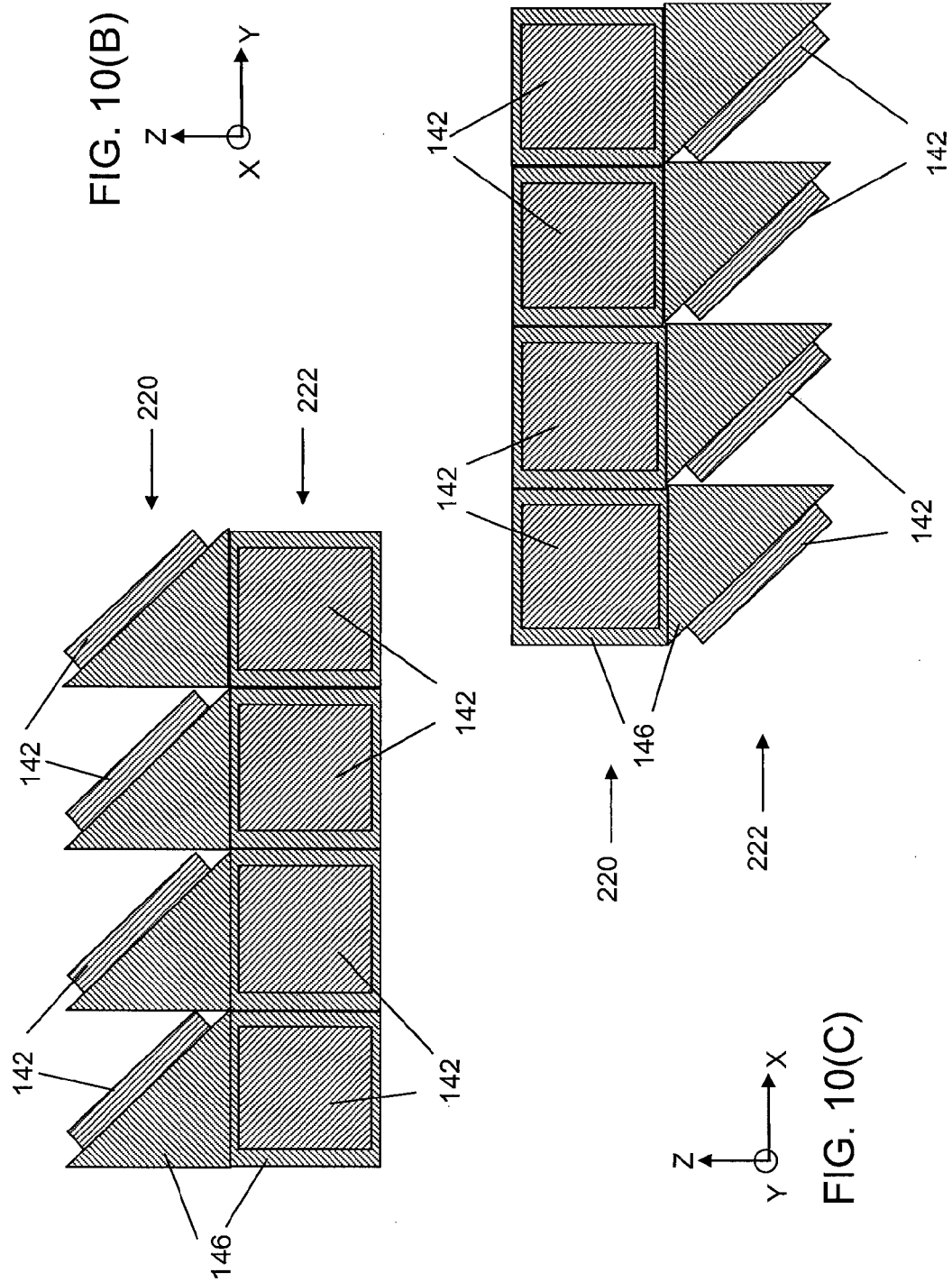

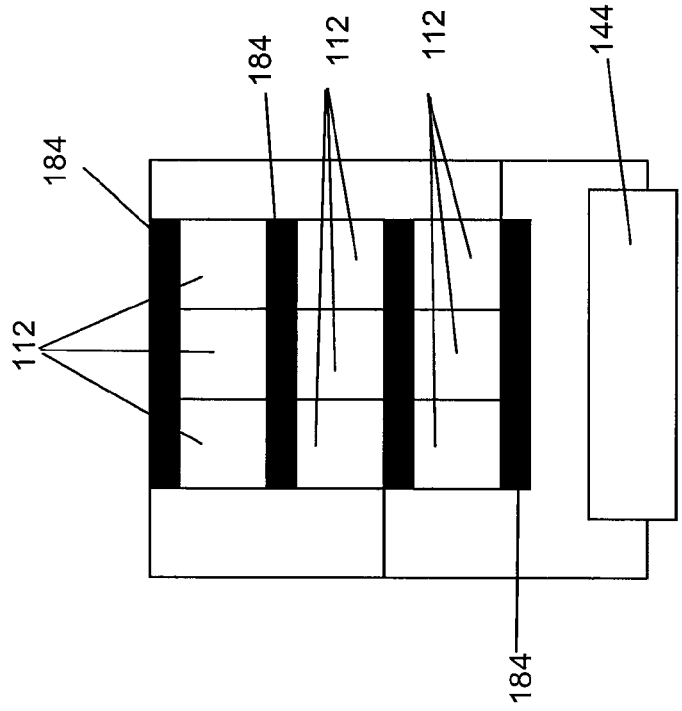
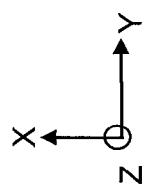
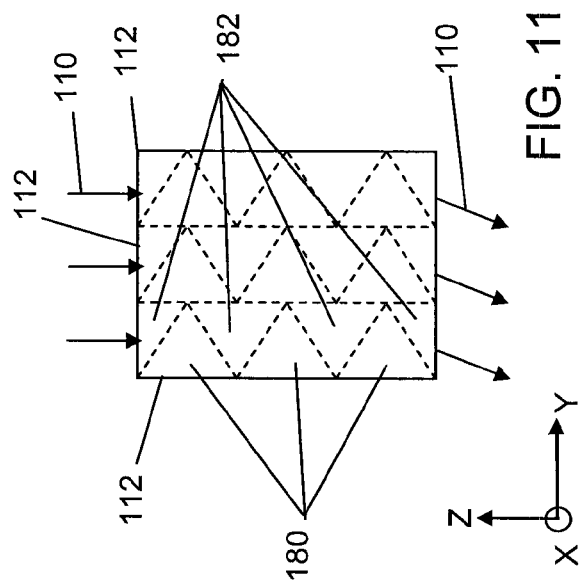
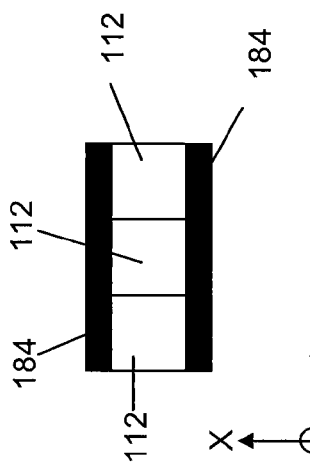
FIG. 11
FIG. 12
FIG. 13

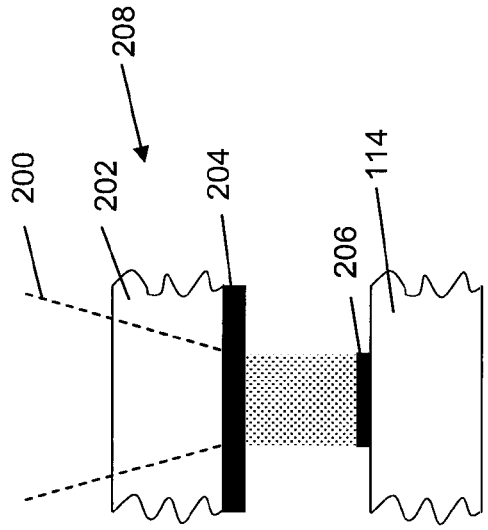
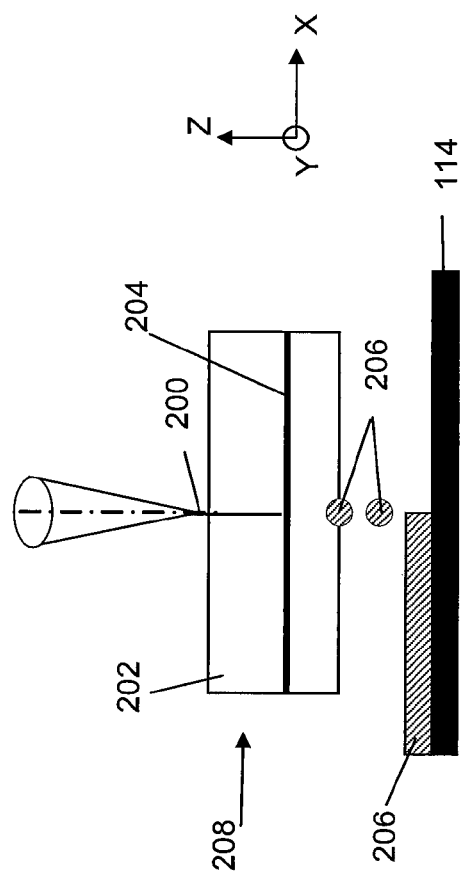
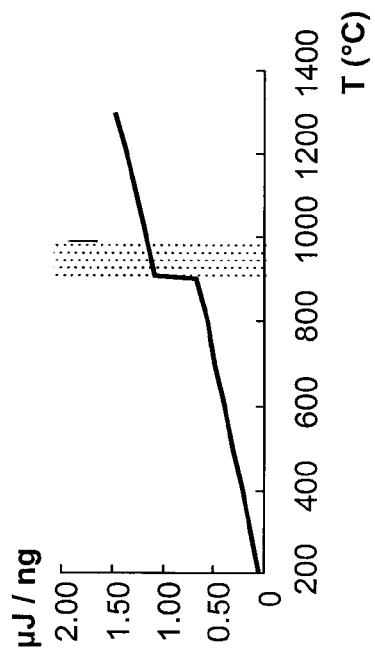
FIG. 21
FIG. 20
FIG. 22

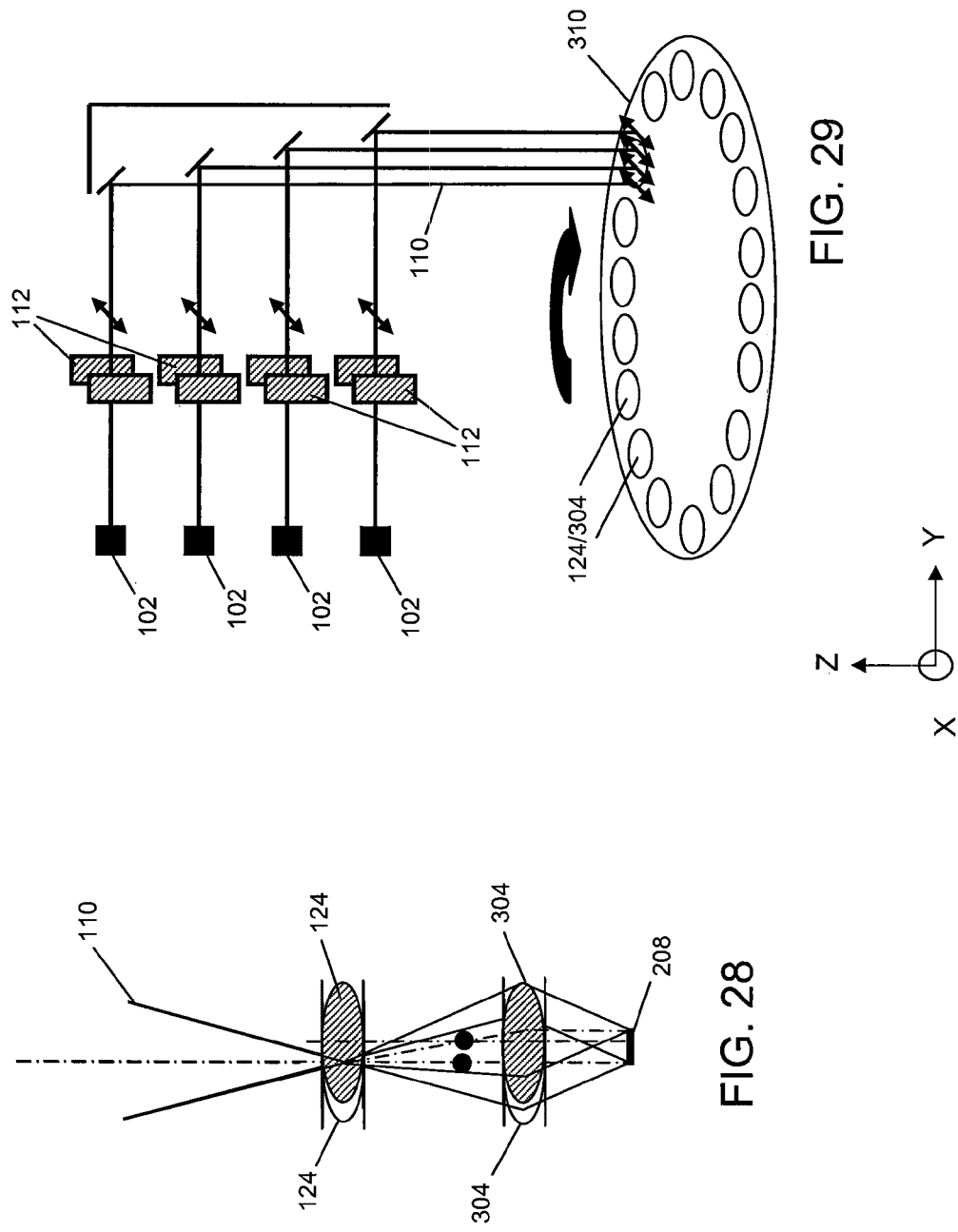

US 9,645,502 B2

LITHOGRAPHIC APPARATUS, PROGRAMMABLE PATTERNING DEVICE AND LITHOGRAPHIC METHOD

CROSS REFERENCE TO RELATED APPLICATIONS

This application is the U.S. national phase entry of PCT Patent Application No. PCT/EP2012/053918, filed on Mar. 7, 2012, which claims the benefit of priority of U.S. Provisional Patent Application No. 61/473,636, filed Apr. 8, 2011 and U.S. Provisional Application No. 61/594,875 filed Feb. 3, 2012, which are incorporated by reference herein in their entirety.

FIELD

The present invention relates to a lithographic apparatus, a programmable patterning device, and a device manufacturing method.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may be transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, and the like.

SUMMARY

It is desirable, for example, to provide a flexible, low-cost lithography apparatus that includes a programmable patterning device.

In an embodiment, a lithographic apparatus is disclosed that includes a modulator configured to expose an exposure area of the substrate to a plurality of beams modulated according to a desired pattern and a projection system configured to project the modulated beams onto the substrate. The modulator may move the beams with respect to the exposure area. The lithographic apparatus may have an array of lenses to receive the plurality of beams, the array of lenses moveable with respect to the exposure area.

In an embodiment, the lithographic apparatus may, for example be provided with an optical column capable of creating a pattern onto a target portion of a substrate. The optical column may be provided with: a self emissive contrast device configured to emit a plurality of beams; and a projection system configured to project at least a portion of the plurality of beams onto the target portion. The apparatus may be provided with a deflector to move the beam with respect to the target portion.

BRIEF DESCRIPTION OF THE DRAWINGS

The accompanying drawings, which are incorporated herein and form a part of the specification, illustrate an embodiment of the present invention and, together with the description, further serve to explain the principles of the invention and to enable a person skilled in the pertinent art to make and use the invention.

FIG. 5 depicts a schematic side view of a lithographic apparatus according to an embodiment of the present invention.

FIG. 6 depicts a schematic side view of a lithographic apparatus according to an embodiment of the present invention.

FIG. 7 depicts a schematic side view of a lithographic apparatus according to an embodiment of the present invention.

FIG. 8 depicts a schematic side view of a lithographic apparatus according to an embodiment of the present invention.

FIG. 9 depicts a schematic side view of a beam deflector according to an embodiment of the present invention.

FIG. 10(A) depicts a schematic side view of a beam deflector according to an embodiment of the present invention.

FIG. 10(B) depicts a schematic side view of a beam deflector according to an embodiment of the present invention.

FIG. 10(C) depicts a schematic further side view of the beam deflector of FIG. 10(B).

FIG. 11 depicts a schematic side view of a one-dimensional array of beam deflectors according to an embodiment of the present invention.

FIG. 12 depicts a schematic top view of a one-dimensional array of beam deflectors according to an embodiment of the present invention.

FIG. 13 depicts a schematic top view of a two-dimensional array of beam deflectors according to an embodiment of the present invention.

FIG. 20 depicts a side view of a material deposition apparatus and process.

FIG. 21 depicts a side view of a material deposition apparatus and process, which is a close up view of the material deposition apparatus and process depicted in FIG. 20.

FIG. 22 is a graph of thermal heat capacity versus temperature of aluminum.

FIG. 28 is a schematic side view of a part of a lithographic apparatus according to an embodiment of the present invention.

FIG. 29 is a schematic perspective view of a part of a lithographic apparatus according to an embodiment of the present invention.

One or more embodiments of the present invention will now be described with reference to the accompanying drawings. In the drawings, like reference numbers may indicate identical or functionally similar elements.

DETAILED DESCRIPTION

One or more embodiments of a maskless lithographic apparatus, a maskless lithographic method, a programmable patterning device and other apparatus, articles of manufacture and methods are described herein. In an embodiment, a low cost and/or flexible maskless lithographic apparatus is provided. As it is maskless, no conventional mask is needed to expose, for example, ICs or flat panel displays. Similarly, one or more rings are not needed for packaging applications; the programmable patterning device can provide digital edge-processing "rings" for packaging applications to avoid edge projection. Maskless (digital patterning) can enable use with flexible substrates.

In an embodiment, the lithographic apparatus is capable of super-non-critical applications. In an embodiment, the lithographic apparatus is capable of $\geq 0.1$ µm resolution, e.g. $\geq 0.5$ µm resolution or $\geq 1$ µm resolution. In an embodiment, the lithographic apparatus is capable of $\leq 20$ µm resolution, e.g. $\leq 10$ µm resolution, or $\leq 5$ µm resolution. In an embodiment, the lithographic apparatus is capable of ~0.1-10 µm resolution. In an embodiment, the lithographic apparatus is capable of $\geq 50$ nm overlay, e.g. $\geq 100$ nm overlay, $\geq 200$ nm overlay, or $\geq 300$ nm overlay. In an embodiment, the lithographic apparatus is capable of $\leq 500$ nm overlay, e.g. $\leq 400$ nm overlay, $\leq 300$ nm overlay, or $\leq 200$ nm overlay. These overlay and resolution values may be regardless of substrate size and material.

In an embodiment, the lithographic apparatus is highly flexible. In an embodiment, the lithographic apparatus is scalable to substrates of different sizes, types and characteristics. In an embodiment, the lithographic apparatus has a virtually unlimited field size. Thus, the lithographic apparatus can enable multiple applications (e.g., IC, flat panel display, packaging, etc.) with a single lithographic apparatus or using multiple lithographic apparatus using a largely common lithographic apparatus platform. In an embodiment, the lithographic apparatus allows automated job generation to provide for flexible manufacture. In an embodiment, the lithographic apparatus provides 3D integration.

In an embodiment, the lithographic apparatus is low cost. In an embodiment, only common off-the-shelf components are used (e.g., radiation emitting diodes, a simple movable substrate holder, and a lens array). In an embodiment, pixel-grid imaging is used to enable simple projection optics. In an embodiment, a substrate holder having a single scan direction is used to reduce cost and/or reduce complexity.

Figure 1:
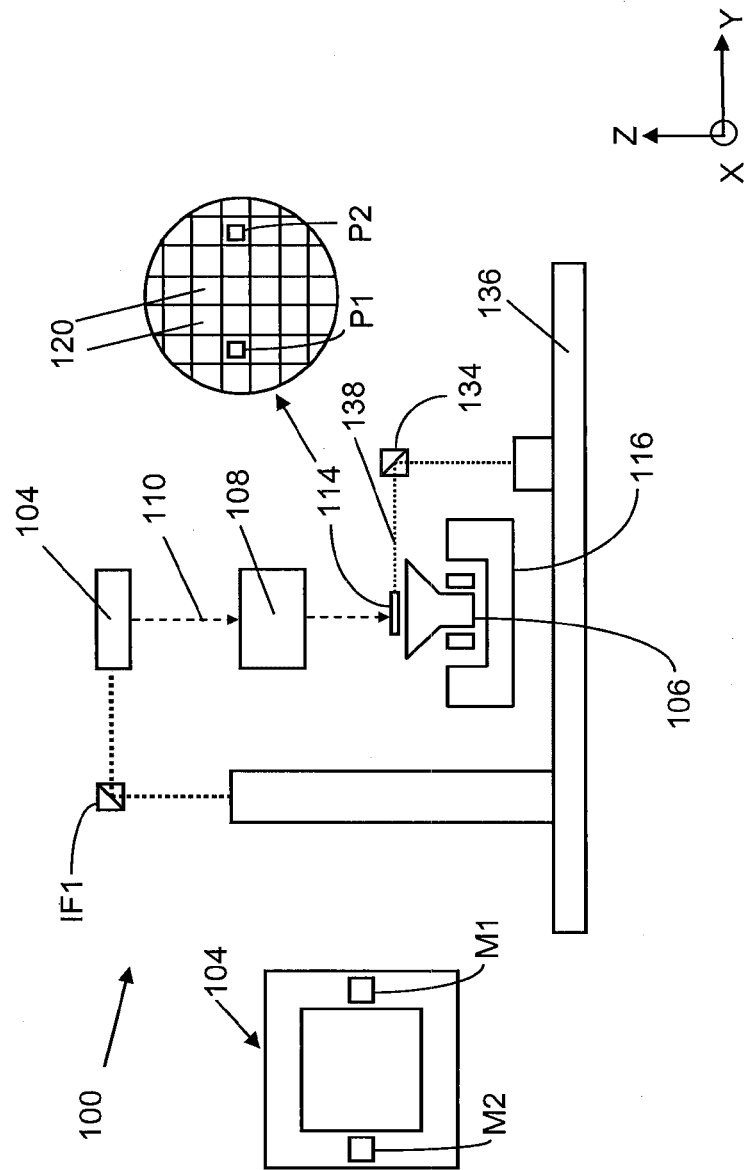
FIG. 1 depicts a schematic side view of a lithographic apparatus according to an embodiment of the present invention.

FIG. 1 schematically depicts a lithographic projection apparatus 100 according to an embodiment of the invention. Apparatus 100 includes a patterning device 104, an object holder 106 (e.g., an object table, for instance a substrate table), and a projection system 108.

In an embodiment, the patterning device 104 comprises a plurality of individually controllable elements 102 to modulate radiation to apply a pattern to beam 110. In an embodiment, the position of the plurality of individually controllable elements 102 can be fixed relative to projection system 108. However, in an alternative arrangement, a plurality of individually controllable elements 102 may be connected to a positioning device (not shown) to accurately position one or more of them in accordance with certain parameters (e.g., with respect to projection system 108).

In an embodiment, the patterning device 104 is a self-emissive contrast device. Such a patterning device 104 obviates the need for a radiation system, which can reduce, for example, cost and size of the lithographic apparatus. For example, each of the individually controllable elements 102 is a radiation emitting diode, such a light emitting diode (LED), an organic LED (OLED), a polymer LED (PLED), or a laser diode (e.g., solid state laser diode). In an embodiment, each of the individually controllable elements 102 is a laser diode. In an embodiment, each of the individually controllable elements 102 is a blue-violet laser diode (e.g., Sanyo model no. DL-3146-151). Such diodes are supplied by companies such as Sanyo, Nichia, Osram, and Nitride. In an embodiment, the diode emits radiation having a wavelength of about 365 nm or about 405 nm. In an embodiment, the diode can provide an output power selected from the range of 0.5-100 mW. In an embodiment, the size of laser diode (naked die) is selected from the range of 250-600 micrometers. In an embodiment, the laser diode has an emission area selected from the range of 1-5 micrometers. In an embodiment, the laser diode has a divergence angle selected from the range of 7-44 degrees. In an embodiment, the diode may be modulated at 100 MHz.

In an embodiment, the self-emissive contrast device comprises more individually addressable elements 102 than needed to allow a "redundant" individually controllable element 102 to be used if another individually controllable element 102 fails to operate or doesn't operate properly.

In an embodiment, the individually controllable elements 102 of a self-emissive contrast device are operated in the steep part of the power/forward current curve of the individually controllable elements 102 (e.g., a laser diode). This may be more efficient and lead to less power consumption/heat. In an embodiment, the optical output per individually controllable element, when in use, is at least 1 mW, e.g. at least 10 mW, at least 25 mW, at least 50 mW, at least 100 mW, or at least 200 mW. In an embodiment, the optical output per individually controllable element, when in use, is less than 300 mW, less than 250 mW, less than 200 mW, less than 150 mW, less than 100 mW, less than 50 mW, less than 25 mW, or less than 10 mW. In an embodiment, the power consumption per programmable patterning device, when in use, to operate the individually controllable elements is less than 10 kW, e.g. less than 5 kW, less than 1 kW, or less than 0.5 kW. In an embodiment, the power consumption per programmable patterning device, when in use, to operate the individually controllable elements is at least 100 W, e.g. at least 300 W, at least 500 W, or at least 1 kW.

The lithographic apparatus 100 comprises an object holder 106. In this embodiment, the object holder comprises an object table 106 to hold a substrate 114 (e.g., a resist-coated silicon wafer or glass substrate). The object table 106 may be movable and be connected to a positioning device 116 to accurately position substrate 114 in accordance with certain parameters. For example, positioning device 116 may accurately position substrate 114 with respect to projection system 108 and/or the patterning device 104. In an embodiment, movement of object table 106 may be realized with a positioning device 116 comprising a long-stroke module (coarse positioning) and optionally a short-stroke module (fine positioning), which are not explicitly depicted in FIG. 1. In an embodiment, the apparatus is absent at least a short stroke module to move the object table 106. A similar system may be used to position the individually controllable elements 102, such that, for example, the individually controllable elements 102 scan in a direction substantially parallel with a scanning direction of the object table 106. Beam 110 may alternatively/additionally be moveable, while the object table 106 and/or the individually controllable elements 102 may have a fixed position to provide the required relative movement. Such an arrangement may assist in limiting the size of the apparatus. In an embodiment, which may e.g. be applicable in the manufacture of flat panel displays, the object table 106 may be stationary and positioning device 116 is configured to move substrate 114 relative to (e.g., over) object table 106. For example, the object table 106 may be provided with a system to scan the substrate 114 across it at a substantially constant velocity. Where this is done, object table 106 may be provided with a multitude of openings on a flat uppermost surface, gas being fed through the openings to provide a gas cushion which is capable of supporting substrate 114. This is conventionally referred to as a gas bearing arrangement. Substrate 114 is moved over object table 106 using one or more actuators (not shown), which are capable of accurately positioning substrate 114 with respect to the path of beam 110. Alternatively, substrate 114 may be moved with respect to the object table 106 by selectively starting and stopping the passage of gas through the openings. In an embodiment, the object holder 106 can be a roll system onto which a substrate is rolled and positioning device 116 may be a motor to turn the roll system to provide the substrate onto an object table 106.

Projection system 108 (e.g., a quartz and/or $CaF_2$ lens system or a catadioptric system comprising lens elements made from such materials, or a mirror system) can be used to project the patterned beam modulated by the individually controllable elements 102 onto a target portion 120 (e.g., one or more dies) of substrate 114. Projection system 108 may project image the pattern provided by the plurality of individually controllable elements 102 such that the pattern is coherently formed on the substrate 114. Alternatively, projection system 108 may project images of secondary sources for which the elements of the plurality of individually controllable elements 102 act as shutters.

In this respect, the projection system may comprise a focusing element, or a plurality of focusing elements (herein referred to generically as a lens array) e.g., a micro-lens array (known as an MLA) or a Fresnel lens array, e.g. to form the secondary sources and to image spots onto the substrate 114. In an embodiment, the lens array (e.g., MLA) comprises at least 10 focusing elements, e.g. at least 100 focusing elements, at least 1,000 focusing elements, at least 10,000 focusing elements, at least 100,000 focusing elements, or at least 1,000,000 focusing elements. In an embodiment, the number of individually controllable elements in the patterning device is equal to or greater than the number of focusing elements in the lens array. In an embodiment, the lens array comprises a focusing element that is optically associated with one or more of the individually controllable elements in the array of individually controllable elements, e.g. with only one of the individually controllable elements in the array of individually controllable elements, or with 2 or more of the individually controllable elements in the array of individually controllable elements, e.g., 3 or more, 5 or more, 10 or more, 20 or more, 25 or more, 35 or more, or 50 or more; in an embodiment, the focusing element is optically associated with less than 5,000 individually controllable elements, e.g. less than 2,500, less than 1,000, less than 500, or less than 100. In an embodiment, the lens array comprises more than one focusing element (e.g. more than 1,000, the majority, or about all) that is optically associated with one or more of the individually controllable elements in the array of individually controllable elements.

In an embodiment, the lens array is movable at least in the direction to and away from the substrate, e.g. with the use of one or more actuators. Being able to move the lens array to and away from the substrate allows, e.g., for focus adjustment without having to move the substrate. In an embodiment, individual lens element in the lens array, for instance each individual lens element in the lens array, are movable at least in the direction to and away from the substrate (e.g. for local focus adjustments on non-flat substrates or to bring each optical column into the same focus distance).

In an embodiment, the lens array comprises plastic focusing elements (which may be easy to make, e.g. injection molding, and/or affordable), where, for example, the wavelength of the radiation is greater than or equal to about 400 nm (e.g. 405 nm). In an embodiment, the wavelength of the radiation is selected from the range of about 400 nm-500 nm. In an embodiment, the lens array comprises quartz focusing elements. In an embodiment, each or a plurality of the focusing elements may be an asymmetrical lens. The asymmetry may be the same for each of the plurality of focusing elements or may be different for one or more focusing elements of a plurality of focusing elements than for one or more different focusing elements of a plurality of focusing elements. An asymmetrical lens may facilitate converting an oval radiation output into a circular projected spot, or vice versa.

In an embodiment, the focusing element has a high numerical aperture (NA) that is arranged to project radiation onto the substrate out of the focal point to obtain low NA for system. A higher NA lens may be more economic, prevalent and/or better quality than an available low NA lens. In an embodiment, low NA is less than or equal to 0.3, in an embodiment 0.18, 0.15 or less. Accordingly, a higher NA lens has a NA greater than the design NA for the system, for example, greater than 0.3, greater than 0.18, or greater than 0.15.

While, in an embodiment, the projection system 108 is separate from the patterning device 104, it need not be. The projection system 108 may be integral with the patterning device 108. For example, a lens array block or plate may be attached to (integral with) with a patterning device 104. In an embodiment, the lens array may be in the form of individual spatially separated lenslets, each lenslet attached to (integral with) with an individually addressable element of the patterning device 104 as discussed in more detail below.

Optionally, the lithographic apparatus may comprise a radiation system to supply radiation (e.g., ultraviolet (UV) radiation) to the plurality of individually controllable elements 102. If the patterning device is a radiation source itself, e.g. a laser diode array or a LED array, the lithographic apparatus may be designed without a radiation system, i.e. without a radiation source other than the patterning device itself, or at least a simplified radiation system.

The radiation system includes an illumination system (illuminator) configured to receive radiation from a radiation source. The illumination system includes one or more of the following elements: a radiation delivery system (e.g., suitable directing mirrors), a radiation conditioning device (e.g., a beam expander), an adjusting device to set the angular intensity distribution of the radiation (generally, at least the outer and/or inner radial extent (commonly referred to as σ-outer and σ-inner, respectively) of the intensity distribution in a pupil plane of the illuminator can be adjusted), an integrator, and/or a condenser. The illumination system may be used to condition the radiation that will be provided to the individually controllable elements 102 to have a desired uniformity and intensity distribution in its cross-section. The illumination system may be arranged to divide radiation into a plurality of sub-beams that may, for example, each be associated with one or more of the plurality of the individually controllable elements. A two-dimensional diffraction grating may, for example, be used to divide the radiation into sub-beams. In the present description, the terms "beam of radiation" and "radiation beam" encompass, but are not limited to, the situation in which the beam is comprised of a plurality of such sub-beams of radiation.

The radiation system may also include a radiation source (e.g., an excimer laser) to produce the radiation for supply to or by the plurality of individually controllable elements 102. The radiation source and the lithographic apparatus 100 may be separate entities, for example when the radiation source is an excimer laser. In such cases, the radiation source is not considered to form part of the lithographic apparatus 100 and the radiation is passed from the source to the illuminator. In other cases the radiation source may be an integral part of the lithographic apparatus 100, for example when the source is a mercury lamp. Both of these scenarios are contemplated within the scope of the present invention.

In an embodiment, the radiation source, which in an embodiment may be the plurality of individually controllable elements 102, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365 nm, 405 nm and 436 nm. A 355 nm laser source could be used. In an embodiment, the radiation has a wavelength of about 405 nm.

In an embodiment, radiation is directed from the illumination system at the patterning device 104 at an angle between 0 and 90°, e.g. between 5 and 85°, between 15 and 75°, between 25 and 65°, or between 35 and 55°. The radiation from the illumination system may be provided directly to the patterning device 104. In an alternative embodiment, radiation may be directed from the illumination system to the patterning device 104 by means of a beam splitter (not shown) configured such that the radiation is initially reflected by the beam splitter and directed to the patterning device 104. The patterning device 104 modulates the beam and reflects it back to the beam splitter which transmits the modulated beam toward the substrate 114. However, alternative arrangements may be used to direct radiation to the patterning device 104 and subsequently to the substrate 114. In particular, an illumination system arrangement may not be required if a transmissive patterning device 104 (e.g. a LCD array) is used or the patterning device 104 is self-emissive (e.g., a plurality of diodes).

In operation of the lithographic apparatus 100, where the patterning device 104 is not radiation emissive (e.g., comprising LEDs), radiation is incident on the patterning device 104 (e.g., a plurality of individually controllable elements) from a radiation system (illumination system and/or radiation source) and is modulated by the patterning device 104. The patterned beam 110, after having been created by the plurality of individually controllable elements 102, passes through projection system 108, which focuses beam 110 onto a target portion 120 of the substrate 114.

With the aid of positioning device 116 (and optionally a position sensor 134 on a base 136 (e.g., an interferometric measuring device that receives an interferometric beam 138, a linear encoder or a capacitive sensor)), substrate 114 can be moved accurately, e.g., so as to position different target portions 120 in the path of beam 110. Where used, the positioning device for the plurality of individually controllable elements 102 can be used to accurately correct the position of the plurality of individually controllable elements 102 with respect to the path of beam 110, e.g., during a scan.

Although lithography apparatus 100 according to an embodiment of the invention is herein described as being for exposing a resist on a substrate, apparatus 100 may be used to project a patterned beam 110 for use in resistless lithography.

The lithographic apparatus 100 may be of a reflective type (e.g. employing reflective individually controllable elements). Alternatively, the apparatus may be of a transmissive type (e.g. employing transmissive individually controllable elements).

The depicted apparatus 100 can be used in one or more modes e.g.,:

1. In step mode, the individually controllable elements 102 and the substrate 114 are kept essentially stationary, while an entire patterned radiation beam 110 is projected onto a target portion 120 at one go (i.e. a single static exposure). The substrate 114 is then shifted in the X- and/or Y-direction so that a different target portion 120 can be exposed to the patterned radiation beam 110. In step mode, the maximum size of the exposure field limits the size of the target portion 120 imaged in a single static exposure.

2. In scan mode, the individually controllable elements 102 and the substrate 114 are scanned synchronously while a pattern radiation beam 110 is projected onto a target portion 120 (i.e. a single dynamic exposure). The velocity and direction of the substrate relative to the individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the individually controllable elements 102 are kept essentially stationary and the entire pattern is projected onto a target portion 120 of the substrate 114 using pulsing (e.g., provided by a pulsed radiation source or by pulsing the individually controllable elements). The substrate 114 is moved with an essentially constant speed such that the patterned beam 110 is caused to scan a line across the substrate 114. The pattern provided by the individually controllable elements is updated as required between pulses and the pulses are timed such that successive target portions 120 are exposed at the required locations on the substrate 114. Consequently, patterned beam 110 can scan across the substrate 114 to expose the complete pattern for a strip of the substrate 114. The process is repeated until the complete substrate 114 has been exposed line by line.

4. In continuous scan mode, essentially the same as pulse mode except that the substrate 114 is scanned relative to the modulated beam of radiation B at a substantially constant speed and the pattern on the array of individually controllable elements is updated as the patterned beam 110 scans across the substrate 114 and exposes it. A substantially constant radiation source or a pulsed radiation source, synchronized to the updating of the pattern on the array of individually controllable elements may be used.

Combinations and/or variations on the above described modes of use or entirely different modes of use may also be employed.

Figure 2:
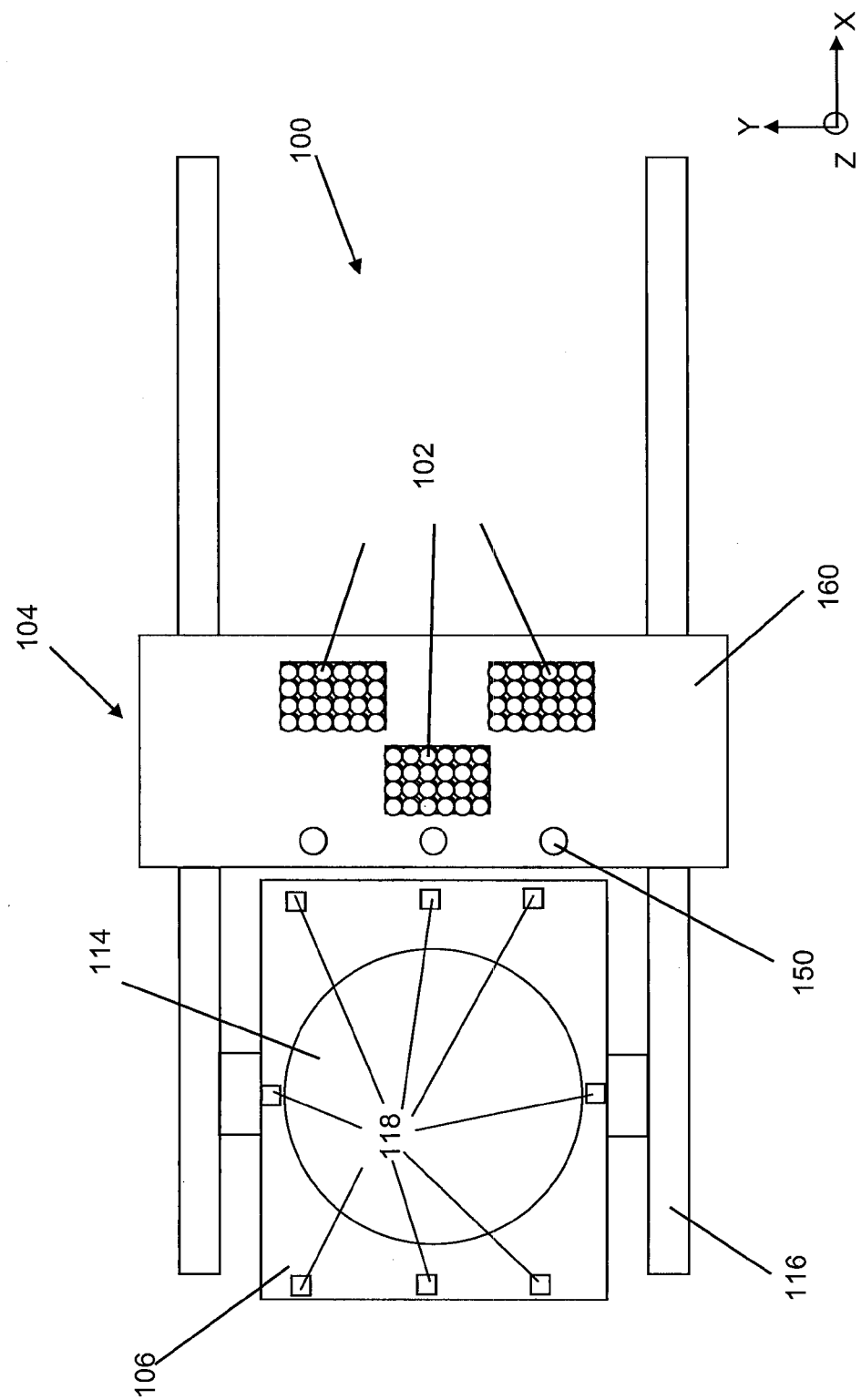
FIG. 2 depicts a schematic top view of a lithographic apparatus according to an embodiment of the present invention.

FIG. 2 depicts schematic top view of a lithographic apparatus according to an embodiment of the invention for use with wafers (e.g., 300 mm wafers). As shown in FIG. 2, the lithographic apparatus 100 comprises a substrate table 106 to hold a wafer 114. Associated with the substrate table 106 is a positioning device 116 to move the substrate table 106 in at least the X-direction. Optionally, the positioning device 116 may move the substrate table 106 in the Y-direction and/or Z-direction. The positioning device 116 may also rotate the substrate table 106 about the X-, Y- and/or Z-directions. Accordingly, the positioning device 116 may provide motion in up to 6 degrees of freedom. In an embodiment, the substrate table 106 provides motion only in the X-direction, an advantage of which is lower costs and less complexity. In an embodiment, the substrate table 106 comprises relay optics.

The lithographic apparatus 100 further comprises a plurality of individually addressable elements 102 arranged on a frame 160. Frame 160 may be mechanically isolated from the substrate table 106 and its positioning device 116. Mechanical isolation may be provided, for example, by connecting the frame 160 to ground or a firm base separately from the frame for the substrate table 106 and/or its positioning device 116. In addition or alternatively, dampers may be provided between frame 160 and the structure to which it is connected, whether that structure is ground, a firm base or a frame supporting the substrate table 106 and/or its positioning device 116.

In this embodiment, each of the individually addressable elements 102 is a radiation emitting diode, e.g., a blue-violet laser diode. As shown in FIG. 2, the individually addressable elements 102 may be arranged into at least 3 separate arrays of individually addressable elements 102 extending along the Y-direction. In an embodiment, an array of individually addressable elements 102 is staggered in the X-direction from an adjacent array of individually addressable elements 102. The lithographic apparatus 100, particularly the individually addressable elements 102, may be arranged to provide pixel-grid imaging as described in more detail herein. However, in an embodiment, the lithographic apparatus 100 need not provide pixel-grid imaging. Rather, the lithographic apparatus 100 may project the radiation of the individually controllable elements 102 onto the substrate in a manner that does not form individual pixels for projection onto the substrate but rather a substantially continuous image for projection onto the substrate.

Each of the arrays of individually addressable elements 102 may be part of an individual optical engine component, which may be manufactured as a unit for easy replication. Moreover, frame 160 may be configured to be expandable and configurable to easily adopt any number of such optical engine components. The optical engine component may comprise a combination of an array of individually addressable elements 102 and lens array 170. For example, in FIG. 2, there are depicted 3 optical engine components (with an associated lens array 170 below each respective array of individually addressable elements 102). Accordingly, in an embodiment, a multi-column optical arrangement may be provided, with each optical engine forming a column.

Further, the lithographic apparatus 100 comprises an alignment sensor 150. The alignment sensor is used to determine alignment between the substrate 114 and, for example, the individually addressable elements 102 before and/or during exposure of the substrate 114. The results of the alignment sensor 150 can be used by a controller of the lithographic apparatus 100 to control, for example, the positioning device 116 to position the substrate table 106 to improve alignment. In addition or alternatively, the controller may control, for example, a positioning device associated with the individually addressable elements 102 to position one or more of the individually addressable elements 102 to improve alignment and/or to control a deflector 112 associated with the individually addressable elements 102 to position one or more of the beams to improve alignment. In an embodiment, the alignment sensor 150 may include pattern recognition functionality/software to perform alignment.

The lithographic apparatus 100, in addition or alternatively, comprises a level sensor 150. The level sensor 150 is used to determine whether the substrate 106 is level with respect to the projection of the pattern from the individually addressable elements 102. The level sensor 150 can determine level before and/or during exposure of the substrate 114. The results of the level sensor 150 can be used by a controller of the lithographic apparatus 100 to control, for example, the positioning device 116 to position the substrate table 106 to improve leveling. In addition or alternatively, the controller may control, for example, a positioning device associated with a projection system 108 (e.g., a lens array) to position an element of the projection system 108 (e.g., a lens array) to improve leveling. In an embodiment, the level sensor may operate by projecting an ultrasonic beam at the substrate 106 and/or operate by projecting an electromagnetic beam of radiation at the substrate 106.

In an embodiment, results from the alignment sensor and/or the level sensor may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc. Thus, results from the alignment sensor and/or the level sensor can be used to alter the projected pattern to effect a non-linear distortion correction. Non-linear distortion correction may be useful, for example, for flexible displays, which may not have consistent linear or non-linear distortion.

In operation of the lithographic apparatus 100, a substrate 114 is loaded onto the substrate table 106 using, for example, a robot handler (not shown). The substrate 114 is then displaced in the X-direction under the frame 160 and the individually addressable elements 102. The substrate 114 is measured by the level sensor and/or the alignment sensor 150 and then is exposed to a pattern using individually addressable elements 102. For example, the substrate 114 is scanned through the focal plane (image plane) of the projection system 108, while the sub-beams, and hence the image spots S (see, e.g., FIG. 12), are switched at least partially ON or fully ON or OFF by the patterning device 104. Features corresponding to the pattern of the patterning device 104 are formed on the substrate 114. The individually addressable elements 102 may be operated, for example, to provide pixel-grid imaging as discussed herein.

In an embodiment, the substrate 114 may be scanned completely in the positive X-direction and then scanned completely in the negative X-direction. In such an embodiment, an additional level sensor and/or alignment sensor 150 on the opposite side of the individually addressable elements 102 may be required for the negative X-direction scan.

Figure 3:
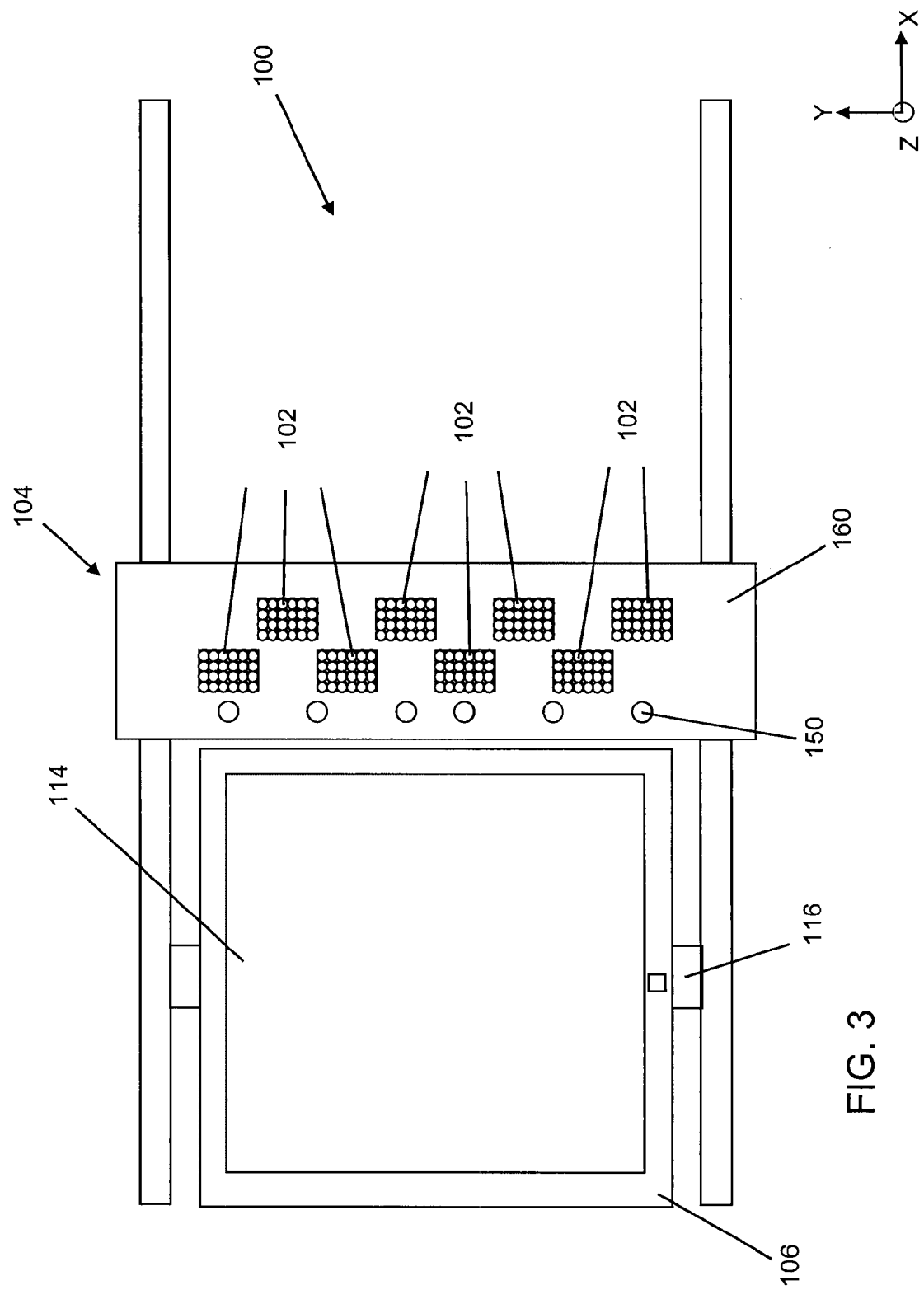
FIG. 3 depicts a schematic top view of a lithographic apparatus according to an embodiment of the present invention.

FIG. 3 depicts a schematic top view of a lithographic apparatus according to an embodiment of the invention for exposing substrates in the manufacture of, for instance, flat panel displays (e.g., LCDs, OLED displays, etc.). Like the lithographic apparatus 100 shown in FIG. 2, the lithographic apparatus 100 comprises a substrate table 106 to hold a flat panel display substrate 114, a positioning device 116 to move the substrate table 106 in up to 6 degrees of freedom, an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus 100 further comprises a plurality of individually addressable elements 102 arranged on a frame 160. In this embodiment, each of the individually addressable elements 102 is a radiation emitting diode, e.g., a blue-violet laser diode. As shown in FIG. 3, the individually addressable elements 102 are arranged into a number (e.g., at least 8) of stationary separate arrays of individually addressable elements 102 extending along the Y-direction. In an embodiment, the arrays are substantially stationary, i.e., they do not move significantly during projection. Further, in an embodiment, a number of the arrays of individually addressable elements 102 are staggered in the X-direction from adjacent array of individually addressable elements 102 in an alternating fashion. The lithographic apparatus 100, particularly the individually addressable elements 102, may be arranged to provide pixel-grid imaging.

In operation of the lithographic apparatus 100, a panel display substrate 114 is loaded onto the substrate table 106 using, for example, a robot handler (not shown). The substrate 114 is then displaced in the X-direction under the frame 160 and the individually addressable elements 102. The substrate 114 is measured by the level sensor and/or the alignment sensor 150 and then is exposed to a pattern using individually addressable elements 102. The individually addressable elements 102 may be operated, for example, to provide pixel-grid imaging as discussed herein.

Figure 4:
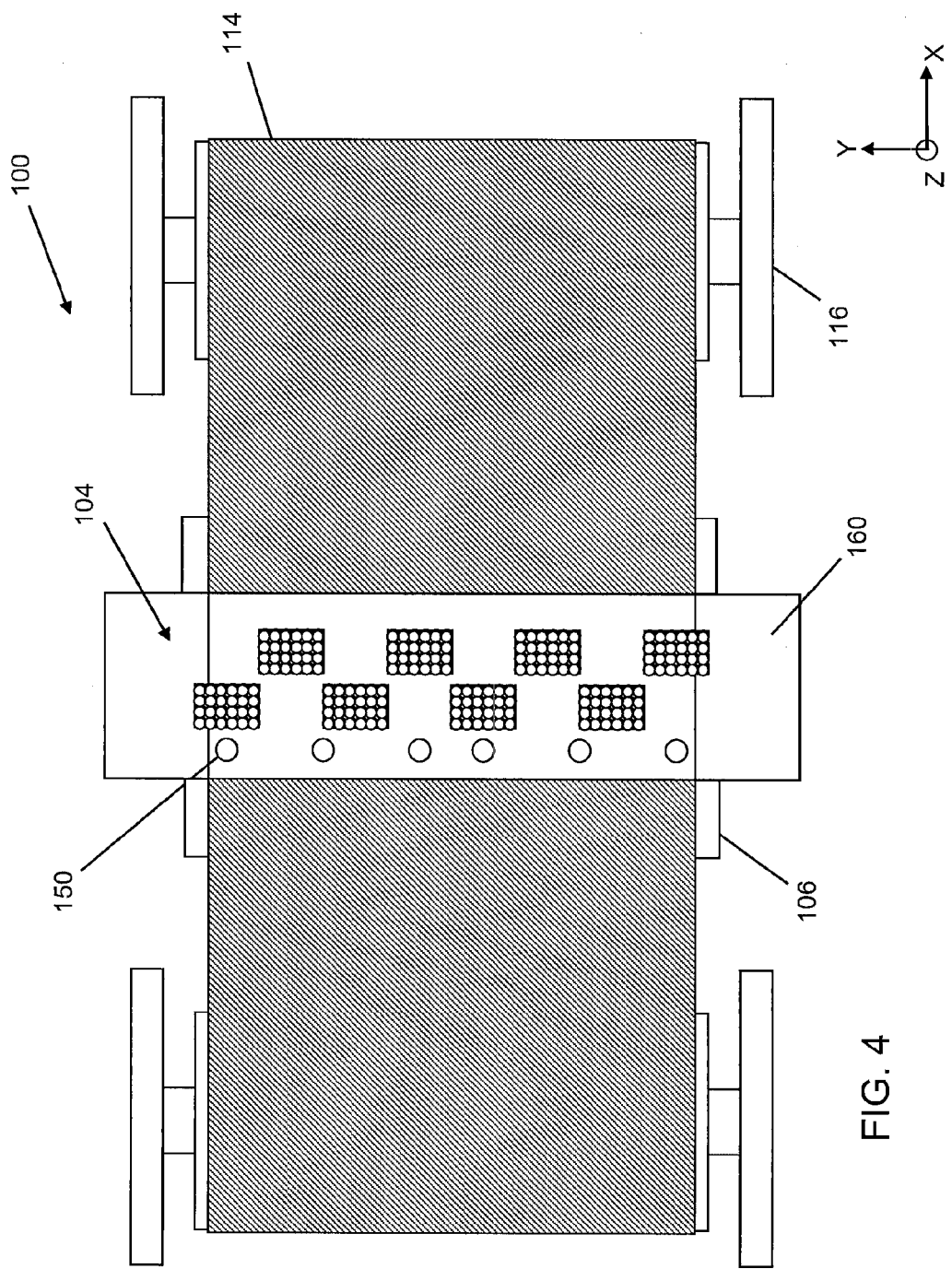
FIG. 4 depicts a schematic top view of a lithographic apparatus according to an embodiment of the present invention.

FIG. 4 depicts a schematic top view of a lithographic apparatus according to an embodiment of the invention for use with roll-to-roll flexible displays/electronics. Like the lithographic apparatus 100 shown in FIG. 3, the lithographic apparatus 100 comprises a plurality of individually addressable elements 102 arranged on a frame 160. In this embodiment, each of the individually addressable elements 102 is a radiation emitting diode, e.g., a blue-violet laser diode. Further, the lithographic apparatus comprises an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus may also comprise an object holder having an object table 106 over which a substrate 114 is moved. The substrate 114 is flexible and is rolled onto a roll connected to positioning device 116, which may be a motor to turn the roll. In an embodiment, the substrate 114 may, in addition or alternatively, be rolled from a roll connected to positioning device 116, which may be a motor to turn the roll. In an embodiment, there are at least two rolls, one from which the substrate is rolled and another onto which the substrate is rolled. In an embodiment, object table 106 need not be provided if, for example, substrate 114 is stiff enough between the rolls. In such a case, there would still be an object holder, e.g., one or more rolls. In an embodiment, the lithographic apparatus can provide substrate carrier-less (e.g., carrier-less-foil (CLF)) and/or roll to roll manufacturing. In an embodiment, the lithographic apparatus can provide sheet to sheet manufacturing.

In operation of the lithographic apparatus 100, flexible substrate 114 is rolled onto, and/or from a roll, in the X-direction under the frame 160 and the individually addressable elements 102. The substrate 114 is measured by the level sensor and/or the alignment sensor 150 and then is exposed to a pattern using individually addressable elements 102. The individually addressable elements 102 may be operated, for example, to provide pixel-grid imaging as discussed herein.

FIG. 5 depicts a schematic side view of a lithographic apparatus according to an embodiment of the invention. As shown in FIG. 5, the lithographic apparatus 100 comprises a patterning device 104 and a projection system 108. The patterning device 104 comprises an individually addressable element 102 (such as a diode as discussed herein) and a deflector 112. The deflector 112 receives the beam from the individually addressable element 102 and causes the beam 110 to laterally displace in the X- and/or Y-directions as shown by the displaced sets of rays of beam 110. In an embodiment, the patterning device 104 may include a lens to image the radiation beam 110 from the individually addressable element 102 to the deflector 112. In an embodiment, each individually addressable element 102 has an associated deflector 112.

The deflected beam from the deflector 112 is received by the projection system 108. The projection system 108 comprises two lenses 124, 170. The first lens 124, a field lens, is arranged to receive the modulated radiation beam 110 from the patterning device 104. In an embodiment, the lens 124 is located in an aperture stop 126. The radiation beam 110 diverges from field lens 124 and is received by a second lens 170, an imaging lens. The lens 170 focuses the beam 110 onto the substrate 114. In an embodiment, the focal plane of the lens 124 at a first focal distance 128 is substantially optically conjugate with the back focal plane of the lens 170 at a second focal distance 130. In an embodiment, the lens 170 can provide a NA of 0.15 or 0.18. In an embodiment, the lens 124 and/or the lens 170 may be moved in up to 6 degrees of freedom (e.g., in the X-Y-Z directions) using an actuator.

In an embodiment, each individually addressable element 102 has an associated deflector 112 and associated lens 170. Accordingly, referring to FIG. 7, in an embodiment of a plurality of individually addressable elements 102 arranged in an array, there may be an array of deflectors 112 and an array of lenses 170. Different portions of the modulated radiation beam 110, corresponding to one or more of the individually controllable elements in the patterning device 104, pass via respective different deflectors 112 through respective different lenses in the array of lenses 170. Each lens focuses the respective portion of the modulated radiation beam 110 to a point that lies on the substrate 114. In this way an array of radiation spots (of, for example, spot size around 1.6 μm) is exposed onto the substrate 114. The individually addressable elements of the patterning device 104 may be arranged at a pitch, which may result in an associated pitch of imaging spots at substrate 114. The array of deflectors and/or lenses may comprise many hundreds or thousands of deflectors and/or lenses (the same is true of the individually controllable elements used as the patterning device 104). As will be apparent, there may also be a plurality of lenses 122 and 124. In an embodiment, the beamlets 110 from a plurality of individually addressable elements 102 are deflected by a single deflector 112.

In an embodiment, there may not be number correspondence between the various elements, such as individually addressable elements 102 and deflectors 112. For example, referring to FIG. 8, there may a single individually addressable element 102 for a plurality of deflectors 112. In such an embodiment, there may be a plurality of lenses 170 associated with the plurality of deflectors 112. There may also be a plurality of associated lenses 122 and 124. A lens 140 may be provided to couple the beam from the individually addressable element 102 into the plurality of deflectors 112 (and optionally the plurality of lenses 122 prior to the deflectors 112).

As shown in FIG. 5, a free working distance 128 is provided between the substrate 114 and the lens 170. This distance allows the substrate 114 and/or the lens 170 to be moved to allow, for example, focus correction. In an embodiment, the free working distance is in the range of 1-3 mm, e.g., about 1.4 mm.

In an embodiment, the projection system 108 can be a 1:1 projection system in that the array spacing of the image spots on the substrate 114 is the same as the array spacing of the pixels of the patterning device 104. To provide improved resolution, the image spots can be much smaller than the pixels of the patterning device 104.

Referring to FIG. 6, a side view of the lithographic apparatus depicted in FIG. 5 as implemented into, for example, the arrangement of any of FIGS. 2-5 is depicted. As shown, the lithographic apparatus 100 comprises a substrate table 106 to hold a substrate 114, a positioning device 116 to move the substrate table 106 in up to 6 degrees of freedom, and a patterning device 104 and projection system 108 arranged on a frame 160. In this embodiment, the substrate 114 is scanned in the X-direction by the positioning device 116. Further, as shown by the arrow, the beam 110 modulated by the patterning device 104 and projected by the projection system 108 is laterally displaced in the Y-direction (and optionally also in the X-direction) by the deflector 112 of the patterning device 104.

As discussed above, the deflector 112 facilitates deflection of the radiation beam from the individually addressable element 102 in the X- and/or Y-direction. In other words, this type of deflector can scan the beam 110 or point the beam 110 towards a specific location on the substrate 114. In an embodiment, the deflector 112 may deflect the radiation in only the Y-direction or only the X-direction. In an embodiment, the deflector 112 may deflect the radiation in both X- and Y-directions. In an embodiment, sequential deflectors 112, each capable of deflecting the radiation in only one, but different, direction, are capable of deflecting the radiation in both the X- and Y-directions. For example, two of the same type of deflector may be mounted perpendicularly to and underneath each other, resulting in deflection in both X- and Y-directions. An example of such a deflector 112 that deflects the radiation in both X- and Y-directions is depicted in FIGS. 10(B) and 10(C).

In an embodiment, the deflector 112 may be a mechanical (i.e., galvanometer-type), an electro-optic, and/or acousto-optic deflector. A mechanical deflector tends to provide the largest number of resolvable radiation spots (i.e., a resolvable spot means that the beam is deflected by an angle equal to its own angular spread), but tends to be slowest in terms of spot scan rate. An electro-optic deflector tends to be the fastest in terms of spot scan rate, but tends to have the smallest number of resolvable radiation spots.

In an embodiment, the deflector 112 is an electro-optical deflector. An electro-optical deflector may provide a switching speed of up to a few nanoseconds. In an embodiment, the electro-optical deflector may provide deflection angles of +/−15 degrees. In an embodiment, this may yield about 600 radiation spots for an input beam divergence of 0.05 degrees. In an embodiment, use of an electro-optical deflector may avoid having a fast moving mechanical part for radiation deflection. In an embodiment, there may be no moving optical elements between the radiation source 102 and the substrate 114.

The electro-optical deflector may comprise an optically transparent piezo material. Thus, in an embodiment, a radiation beam is steered due to a potential difference applied over the material. For example, when a potential difference is applied across such an optically transparent material, the index of refraction of the material changes, which changes the direction of beam propagation (i.e., the radiation beam can be deflected). In an embodiment, the material is selected from the following: $LiNbO_3$, $LiTaO_3$, $KH_2PO_4$ (KDPO), or $NH_4H_2PO_4$ (ADP). $LiTaO_3$ is transparent at the 405 nm wavelength.

Referring to FIG. 9, in an embodiment, the electro-optical deflector 112 comprises a prism 142 of electro-optic material. In an embodiment, the prism is a plate. As shown in FIG. 9, the prism 142 is situated non-perpendicularly (i.e., under angle) with respect to the beam 110. Once a potential difference is applied by a controller 144 between different surfaces of the prism 142, the refractive index of the material changes causing the beam 110 to laterally shift as shown by the displacement between the arrows in FIG. 9.

In an embodiment where the electro-optical element 112 is situated under angle with respect to the beam 110, there may be radiation loss due to reflection under the grazing incidence. Thus, referring to FIG. 10(A), the electro-optical element 112 may be fitted with a prism 146 on one or more sides of the prism 142, the prism 146 having a refractive index substantially the same as that of the prism 142. In an embodiment, a refractive index substantially the same as that of prism 142 means a refractive index that is within 1%, within 2%, within 3%, within 4%, within 5%, or within 10% of the highest or lowest refractive index of prism 142. In FIG. 10(A), a prism 146 is provided on opposite sides of the prism 142. Thus, in this embodiment, incoming beam 110 couples into prism 146 on the entrance surface of prism 142 and then passes into the entrance surface of prism 142, where it is deflected by virtue of the potential difference applied. The beam 110 exits from the exit surface of prism 142 into prism 146 where it then passes on towards the substrate 114. The prism 146 on the entrance surface of prism 142 or the prism 146 on the exit surface of prism 142 may be omitted. This arrangement of prism 146 should prevent unnecessary loss of power and provide improved radiation coupling into the electro-optical element 112.

In an embodiment, the deflector 112 may deflect the radiation in both X- and Y-directions. Referring to FIGS. 10(B) and 10(C), a first set 220 of deflectors 112 and a second set 222 of deflectors 112, each set capable of deflecting the radiation in only one, but different, direction. For example, two of the same type of deflector may be mounted perpendicularly to and underneath each other, resulting in deflection in both X- and Y-directions. In the embodiment shown in FIGS. 10(B) and 10(C), a two-dimensional array of deflectors 112 are provided, with a first set 220 of deflectors 112 arranged in a two-dimensional array over a second set 222 of deflectors 112 arranged in a two-dimensional array. In an embodiment, referring to FIG. 10(B), the second set 222 of deflectors 112 are the same as the first set 220 of deflectors except flipped over the X axis and rotated 90 degrees. FIGS. 10(B) and 10(C) show respective side views of the first and second sets 220, 222. In this embodiment, each deflector 112 comprises a combination of a prism 142 and a prism 146 (e.g., transparent glass such as quartz). In an embodiment, there may not be the prism 146. Further, while FIGS. 10(B) and 10(C) depict a 4 by 4 array of deflectors, the array may be of different dimensions. For example, the array may be a 15 by 20 array of deflectors to cover, for example, a 120 mm exposure width.

The deflection by the electro-optical deflector 112 may be limited. Therefore enhancement may be used. This is illustrated in FIG. 5 with a combination of a field lens 124 and an imaging lens 170. For example, the lateral shift (i.e., deflection) can be magnified by, for example, about 10× at the substrate by such lenses for an image field of about 60 to 400 microns, where magnification M=f2/f1, where f2 is the focal length 128 and f1 is focal length 130. In an embodiment, a field scanned by a single beamlet may be from about 60 microns×60 micrson to about 400×400 microns with a resolution of about 3 microns. In an embodiment, there may be 7500 beamlets.

An additional or alternative way to increase the deflection angle (and thus the number of resolvable points) is to use a plurality of prisms in sequence and/or to utilize the total internal reflection effect. Referring to FIG. 11, a plurality of deflectors 112 are depicted in side view. Each deflector 112 comprises a plurality of prisms 180, 182 arranged in sequence, each alternating prism 180, 182 having an opposite domain. In other words, the domain of prisms 180 is opposite to the domain of the prisms 182. That is, the refractive index change for prisms 180 will have an opposite sign to the refractive index change for prisms 182. Through the application of a potential difference across such a deflector 112, the beam 110 will essentially keep "bending" the further it passes through the deflector 112, thus increasing the deflection angle. A top view of the deflectors 112 shown in FIG. 11 is depicted in FIG. 12, with the connections 184 for application of the potential difference being shown. FIG. 13 shows a further top view of a plurality of the one dimensional arrays of deflectors 112 depicted in FIG. 12 arranged in a two-dimensional array with associated connections 184 to a controller 144. Thus, a plurality of beamlets in a two-dimensional layout may be deflected. In an embodiment, each of the deflectors 112 may be separately controlled (i.e., separate potential difference applied) to provide customized deflection of the beamlets traversing the deflectors 112.

Figures 14, 15:
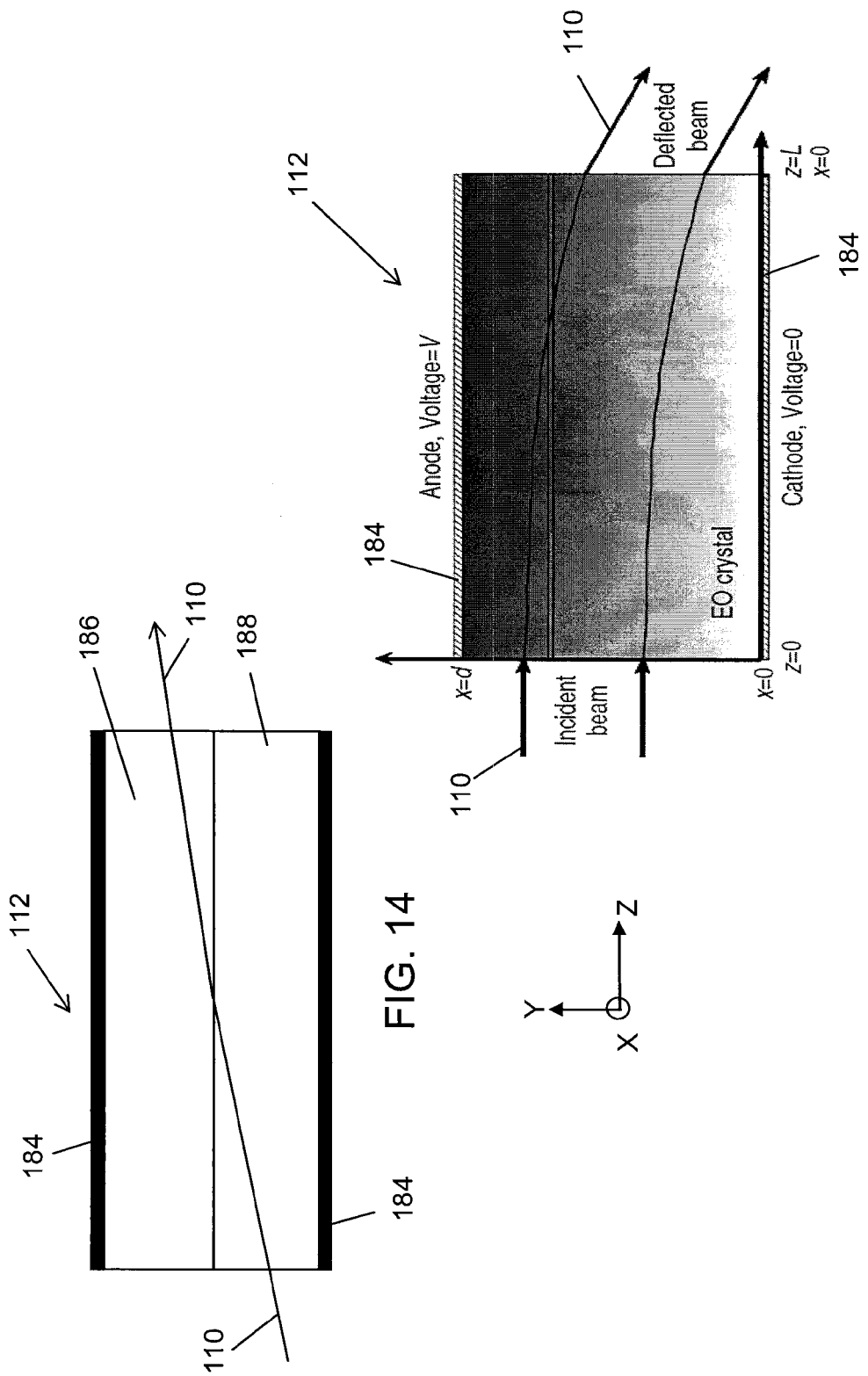
FIG. 14 depicts a schematic side view of a beam deflector according to an embodiment of the present invention.
FIG. 15 depicts a schematic side view of a beam deflector according to an embodiment of the present invention.

Referring to FIG. 14, the deflection angle is increased by having the beam enter the deflector 112 at the grazing incidence angle with respect to the border of two different materials 186, 188 forming the deflector 112.

In an embodiment, referring to FIG. 15, the deflector 112 comprises an electro-optical material that has a refractive index gradient upon application of a potential difference. In other words, rather than having a substantially uniform refractive index change across the entire material on application of a potential difference, a varying refractive index change is provided across the material on application of a potential difference. Due to the varying change of the refractive index in the direction of the applied potential difference, the beam 110 'experiences' a different refractive index as it passes through the material, resulting in a bending of the beam 110. In an embodiment, the material comprises a potassium tantalate niobate ($KTa_{1-x}Nb_xO_3$, KTN)

In an embodiment, the refractive index change is largest at one electrode 184 (e.g., the anode) and smallest at the other electrode 184 (e.g., the cathode). Reversing the potential difference also reverses the direction of deflection (e.g. from +x to −x). Further, deflection is in principle possible in two different directions if two potential differences are applied (e.g., deflection in X- and Y-directions for a beam propagating in the Z-direction). Thus, a compact two-dimensional deflector may be realized.

Using, for example, KTN, a smaller deflector 112 may be realized thus reducing the chance of distortion of the beam profile due to the length of the deflector 112 along the beam propagation path. For example, a deflector 112 of 5×5×0.5 mm may be provided. Further, high deflection angles may be obtained, for example 150 mrad @ 250 V. Such a deflector 112 may also be modulated at MHz frequency, has high transparency at, for example, 532 nm, ~800 nm and 1064 nm, and has a high damage threshold of, for example, >500 MW/cm2 @ 1064 nm.

Referring back to FIG. 5, in an embodiment, there is provided a two-dimensional array of diodes as individually addressable elements 102. Further, a two-dimensional array of deflectors 112 is provided. In an embodiment, each of the diodes 102 is associated with a deflector 112. In an embodiment, the array of diodes is modulated with a substantially same clock frequency and duty cycle, while intensity of each of the diodes can be varied individually. Thus, the array of diodes generates an array of beamlets 110 that are deflected by the array of deflectors 112. A diffractive optical element 124 may be provided to provide appropriate spatial distribution of the beamlets 110. The beamlets 110 are focused by lens 170 into a two-dimensional array of beamlets 110 with a distance between spots equal to a number of resolvable spots of one deflector 112 multiplied by the exposure grid.

As discussed above and referring to, for example, FIG. 3, a plurality of arrays of diodes 102 may be arranged in a staggered configuration (as shown in FIG. 3) or adjacent to each other as optical columns. Further, each of the optical columns has an associated array of deflectors 112 and associated projection system 108 optics. In an embodiment, the exposure areas of each optical column are arranged such that they can be stitched (i.e., they overlap). In this configuration, the same clock frequency for diode 102 modulation and the same voltage generator for deflector 112 driving can be used.

Figure 16:
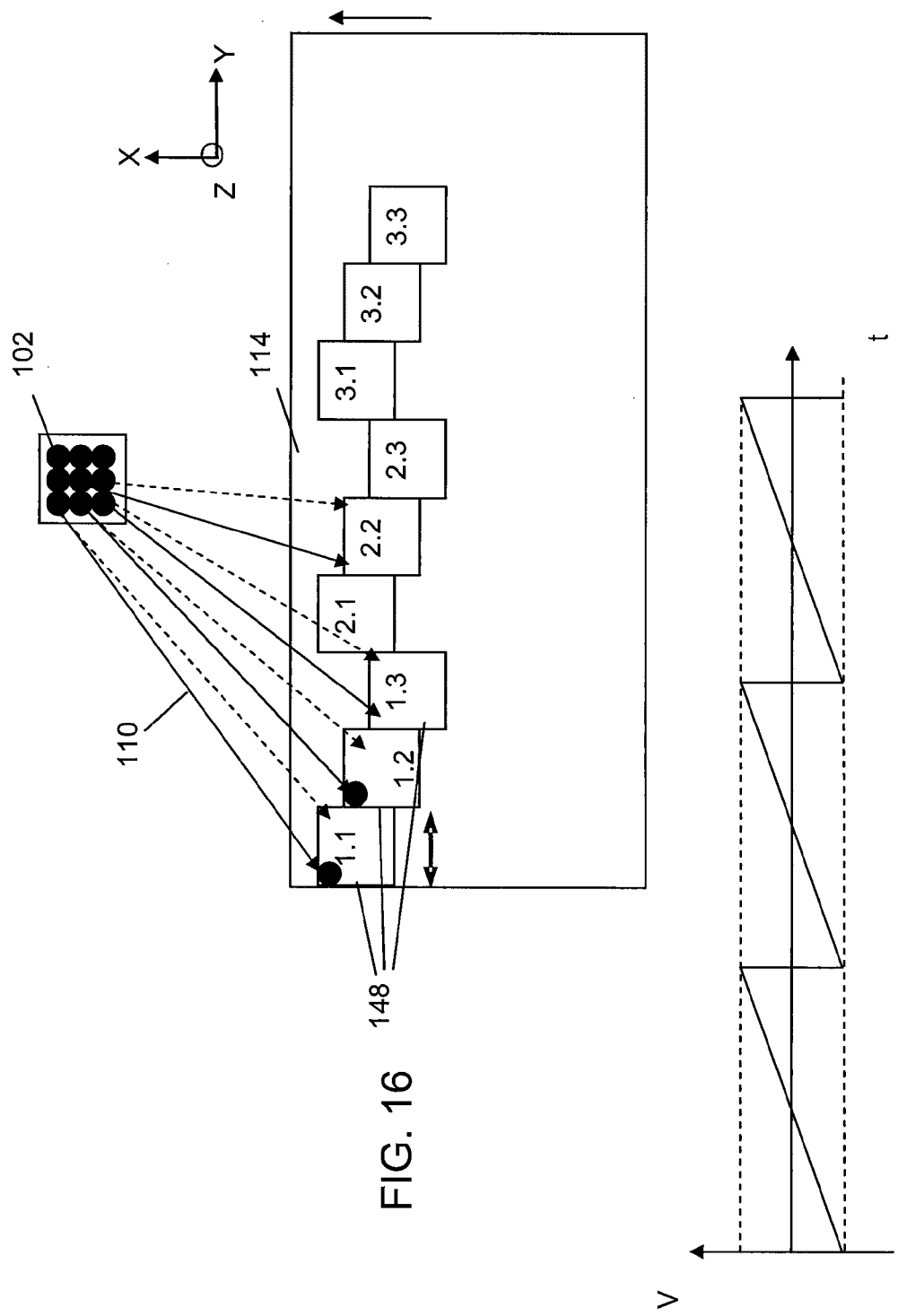
FIG. 16 depicts a schematic top view of an exposure strategy and an associated voltage-time profile of a deflector of a lithographic apparatus according to an embodiment of the present invention.

Referring to FIG. 16, an embodiment of an exposure strategy is illustrated in top view. In FIG. 16, for the sake of simplicity, a 3×3 array of individually addressable elements 102 is depicted; a much greater number of individually addressable elements 102 would be provided. In an embodiment, the array would comprise individually modulated diodes 102. In a first mode, full exposure mode, the individually addressable elements 102 are individually modulated, i.e. the radiation intensity is modulated such as turned "on" and "off". Then, the beamlets 110 from the individually modulated addressable elements 102 are deflected in the Y-direction in parallel by a respective deflector 112 of an array of deflectors 112 across the image field 148. An example profile of the modulation of the applied potential difference of the deflectors 112 is depicted in the voltage-time chart. Each beamlet 110 traverses the optical element 124 and is focused by lens 170 such that the beamlet 110 exposes its own stripe as the substrate 114 is scanned in the X-direction as shown by the arrow. The stripes are adjacent to each other and appropriately stitched. Every diode exposes an assigned area in rectangular area numbered 1.1-3.3.

In an embodiment, the exposure strategy varies from that described above in that the diodes 102 project a two-dimensional array of spots on the substrate 114. The exposure sequence would be, for example, that the first rectangular area 1.1 is fully exposed by the diodes 102, then rectangle 2.2, and then rectangle 3.3, and then to rectangle 1.2, rectangle 2.2 and so on. To improve the quality of the deflected beam 110, the deflector 112 is ramped up only between diode pulses. This type of exposure strategy can be called "stepper type".

Figure 17:
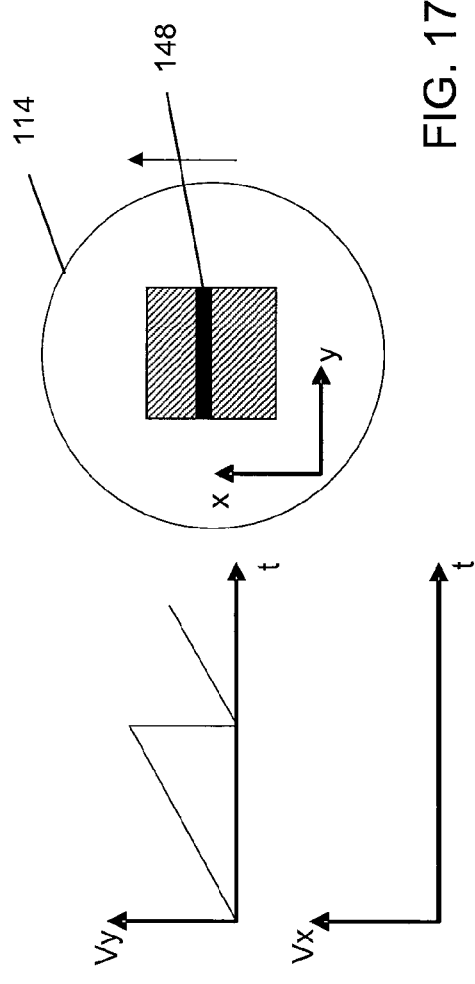
FIG. 17 depicts a schematic top view of an exposure strategy according to an embodiment of the present invention.

In an embodiment, a substrate of nominal 1×1 m size may be exposed in about 10 seconds using 1000 diodes 102 with a sweep time of about 10 µs, a diode pulse duration of about 10 ns, an exposure grid and spot size of 1 µm, a number of resolvable points of the deflector 112 of about 1000, and a substrate 114 scanning speed of 0.1 m/s. In an embodiment, an image field of 0.4 mm (shown by the double headed arrow in FIG. 17) is possible with a spot scanning speed of 38 m/s. In an embodiment, 300 laser diodes are provided to expose 120 mm on the substrate (wherein the number of beamlets is directly related to the image field of the lens 170). In an embodiment, the output power per laser diode is about 38 mW. In an embodiment, a pulse time of 21 ns (48 MHz) is provided. In an embodiment, contrast is created by adjusting the output power of the diodes 102.

Thus, in an embodiment, the full exposure mode involves modulation by the individually addressable elements 102. In other words, the individually addressable elements 102 are only a limited time "on". The deflector 112 quickly deflects the beamlets 110 to cause exposure of the pattern as the intensity of the beamlets 110 is modulated and the substrate 114 is moved in the X-direction. In an embodiment, the deflector 112 causes deflection in the Y-direction but no deflection in the X-direction. Thus, referring to FIG. 17 which depicts one of the rectangular areas 1.1-3.3 shown in FIG. 16, the substrate 114 is moved in the X-direction as shown by the arrow as the beamlets 110 scan in the Y-direction across the image field 148. Thus, the deflector 112 is provided a potential difference modulation to cause deflection in the Y-direction as shown by the voltage in Y (Vy) over time graph in FIG. 17. The potential difference modulation may be fairly regular given the modulation provided by the individually addressable elements 102. However, the deflector 112 is not provided a potential difference modulation to cause deflection in the X-direction as shown by the blank voltage in X (Vx) over time graph in FIG. 17.

However, some devices and structures have only limited pattern density and so less than, for example, 15% of the area has to be exposed during fabrication. For example, pattern density may be 4% of a surface (e.g., an active matrix flat panel display may have 3 micron lines for 80 micron sub-pixel width). Thus, with a pattern density of 4%, up to 96% of the radiation may not be used in an arrangement where each pixel on a substrate is addressed by a maskless system (e.g., all pixels on the substrate are addressed and for each pixel the radiation intensity is adjusted to create the pattern). In other words, there is an overcapacity of radiation.

Accordingly, in a second mode, efficient exposure mode, only pixels on a substrate are addressed that have to be exposed thus reducing the amount of radiation that may be wasted. Thus, there may be reduced radiation power and reduced cost. Further, such an exposure mode may reduce the complexity of the datapath and reduce thermal load in the system.

To address only pixels on a substrate that need to be exposed, a contrast device may be provided that directs the beam or beamlet to the desired position. In an embodiment, the beam or beamlets is directed by a deflector 112 to only the spots on the substrate that need to be exposed. In an embodiment, the deflector 112 is configured to deflect a beamlet in both X- and Y-directions to position the spot only on a pixel on the substrate that needs to be exposed. When a beamlet is not needed, it can be deflected towards a beam dump. For example, the beam dump may be located at the field lens 124 and may be the aperture stop 126. In the efficient exposure mode, an individual radiation source (such as a laser diode) may be provided for each beamlet or a single radiation source may be used to form multiple beamlets.

Figure 18:
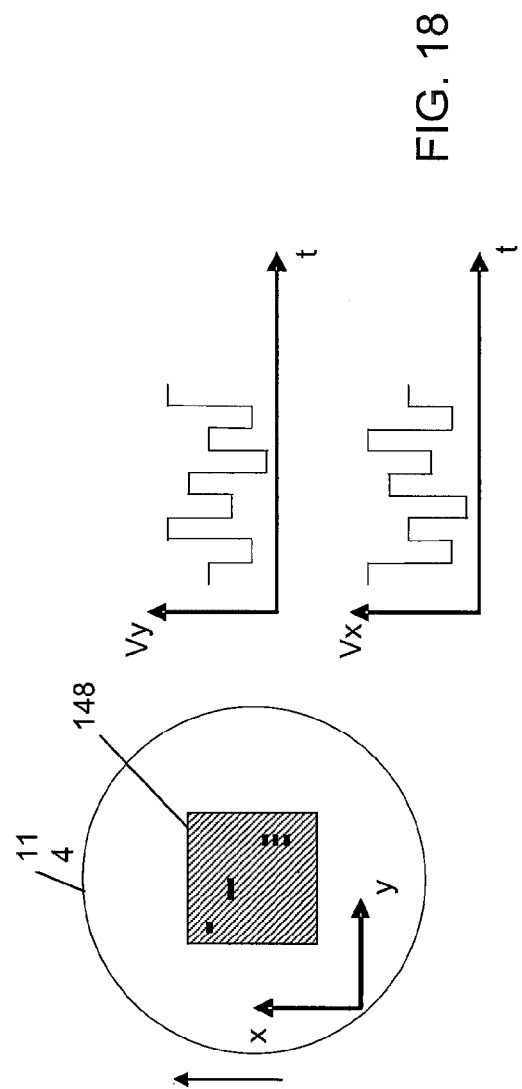
FIG. 18 depicts a schematic top view of an exposure strategy according to an embodiment of the present invention.

Thus, in an embodiment, the efficient exposure mode does not necessarily involve modulation by the individually addressable elements 102. In other words, the individually addressable elements 102 may be "always on", i.e., individually addressable elements may not have their intensity decreased during exposure. The deflector 112 quickly deflects the beamlets 110 to cause exposure of the pattern (and thus modulation) and the substrate 114 is moved in the X-direction. In an embodiment, the deflector 112 causes deflection in the X- and Y-directions (while the substrate still moves in the X-direction). Thus, referring to FIG. 18 which depicts one of the rectangular areas 1.1-3.3 shown in FIG. 16, the substrate 114 is moved in the X-direction as shown by the arrow as the beamlets 110 are deflected in the X- and/or Y-directions as appropriate in the image field 148. Thus, the deflector 112 is provided a potential difference modulation to cause deflection in the X-direction as shown by the voltage in X (Vx) over time graph in FIG. 18 and a potential difference modulation to cause deflection in the Y-direction as shown by the voltage in Y (Vy) over time graph in FIG. 18. The potential difference modulation in the X- and Y-directions may be fairly irregular depending on the nature of the pattern and depending on whether there is modulation provided by the individually addressable elements 102.

Figure 19:
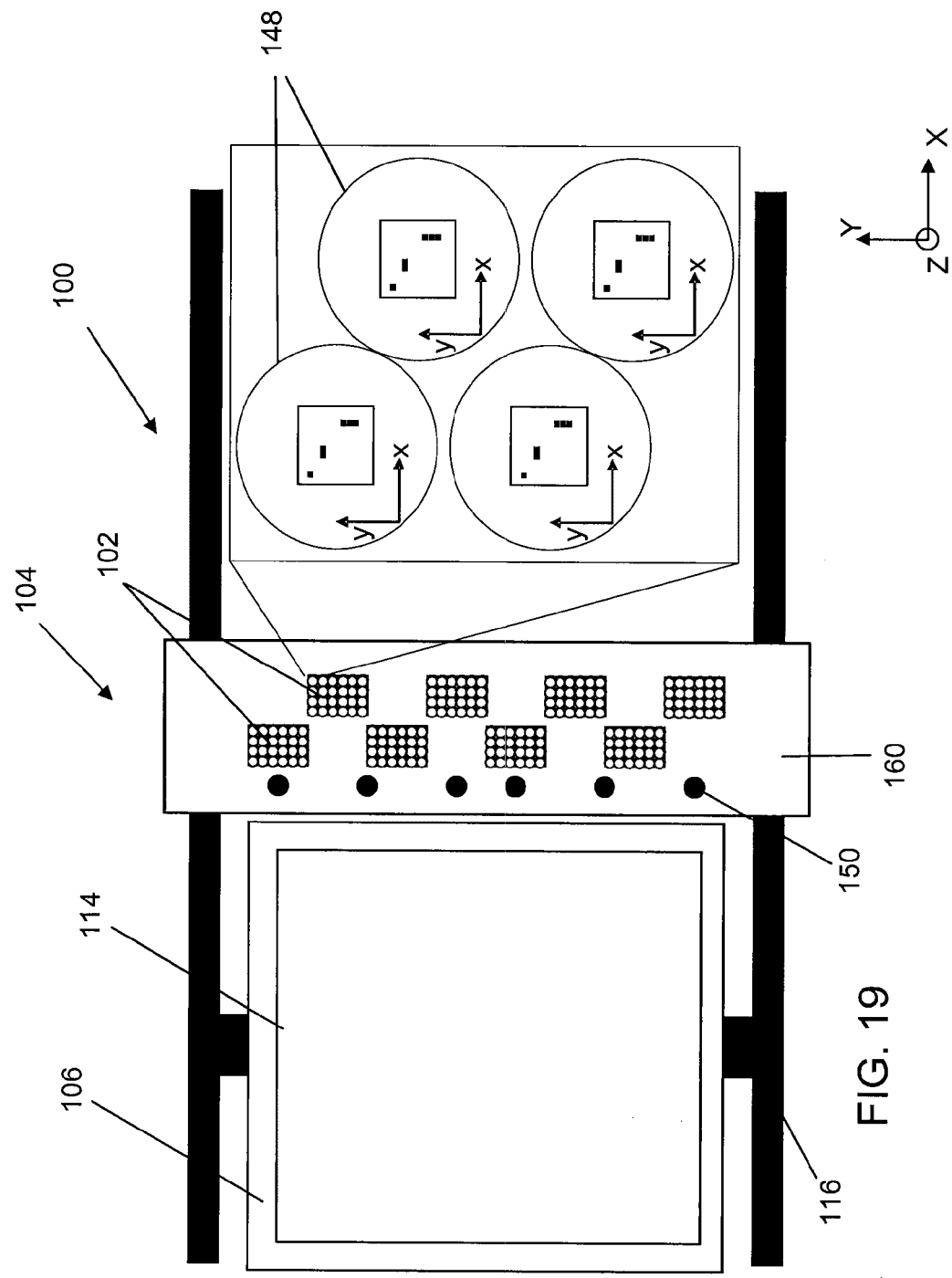
FIG. 19 depicts a schematic top view of a lithographic apparatus according to an embodiment of the present invention implementing the exposure strategy of FIG. 18.

Referring to FIG. 19, an embodiment of the efficient exposure mode is shown implemented in, for example, the apparatus as depicted in FIG. 3. Thus, an array of individually addressable elements 102 may provide deflection of beams in respective image fields 148 to pattern the substrate 114. A plurality of arrays of individually addressable elements 102 may be provided to provide full width-wise coverage of the substrate 114.

In an embodiment, an efficient exposure mode apparatus may comprise multiple radiation sources. For example, there may be a plurality of laser diodes having a 2.3 mW output power per laser diode for a 6% pattern density. In an embodiment, an efficient exposure mode apparatus may comprise a single radiation source. For example, there may be a single radiation source of 690 mW to produce 300 spots across a 120 mm exposure width.

Further, while the description herein has primarily focused on exposing a radiation-sensitive surface of a substrate, the apparatus, systems and methods described herein may additionally or alternatively be applied to deposit a material on a substrate, or to remove material of (e.g., on or making up) a substrate, or both material deposition and removal. For example, the beam described herein may be used to cause metal deposition on a substrate and/or ablation of a substrate. In an embodiment, an apparatus may provide a combination of lithography using a radiation-sensitive surface (herein referred to as photolithography) and material deposition using the beam described herein. In an embodiment, an apparatus may provide a combination of material deposition and removal using the beam described herein. In an embodiment, an apparatus may provide photolithography, material deposition and material removal using the beam described herein.

Advantageously, the apparatus, methods and systems described herein may provide a single tool to provide much, if not all, processing of a device or other structure. Production may become more flexible with such a tool. Capital expense may be reduced by reduced usage of separate tools to provide particular processing (e.g., metal deposition and ablation may be combined into a single tool, rather than having specialized tools for each process).

Further, in appropriate circumstances, new processes may be adopted to eliminate one or more production steps or substitute one or more production steps with one or more other production steps to lead to a production process that is quicker and/or more efficient, etc. As an example, the production of a flat panel display traditionally involves production of a number of layers using photolithography, deposition and etching. In a more specific example, production of a backplane for a flat panel display may involve the creation of 5 layers, each involving photolithography, deposition and etching. Such production may involve 5 process steps and often 5 tools to define a metal pattern. The steps include metal sheet deposition, photo resist coating, photolithography and developing of the resist, etching of the metal using the developed resist, and stripping of the resist after etching. Thus, not only is there a significant amount of capital (e.g., in the form of tools), there is also a significant amount of inefficient material usage. For example in defining an active matrix flat panel display, photoresist may be used to cover a 3 m×3 m glass plate, which photoresist is later completely washed away. Similarly, copper and/or other metals are deposited on the full glass plate and later up to 95% of which is washed away. Further, chemicals are used to etch or strip the above materials.

Thus, technical disruption of such production could be achieved by consolidating one or more reductive steps into an additive step. Thus, rather than a combination of photolithography, deposition and etching steps, a material deposition step may be used to additively create a structure that would typically be created by eliminating material. Direct material deposition could eliminate several reductive process steps typically used in flat panel display manufacture. Additionally and alternatively, ablation may be used to eliminate material without, for example, the need for resist coating and developing. Consequently, such laser induced processing—material deposition and/or removal—is a natural extension of photolithography, since beam energy is used to affect a material.

In an embodiment, for example, a single apparatus may be used for most, if not all, layers of flat panel display production. For example, the apparatus may perform maskless photolithography (if needed), laser beam induced deposition (e.g., of a metal pattern of a liquid crystal (e.g., active matrix) display), and laser beam ablation (e.g., of an indium tin oxide (ITO) conductive layer) to produce a display panel.

First, then, a description of material deposition is provided and then a description of material removal. In an embodiment, the material deposition involves a laser induced forward transfer (LIFT) of material (e.g., metal) onto a substrate, which is a method to deposit material directly on the substrate without photolithography. In an embodiment, the material may be aluminum, chromium, molybdenum, copper, or any combination thereof.

The apparatus, process and system for such deposition may be very similar to a lithography tool or process with the main difference from a photolithography tool or process being the application of the beam onto a material donor plate rather than directly onto the substrate.

Referring to FIGS. 20 and 21, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 114. By pointing the beam 200 on the appropriate position on the donor plate 208, a donor material pattern can be deposited on the substrate 114. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum and referring to FIG. 22 showing the phase change for aluminum from melting to vaporization at the location of the discontinuity, a temperature of about 900 to 1000 degrees Celsius is desirable.

In an embodiment, through the use of a laser pulse, an amount of material (e.g., metal) is transferred from the donor structure 208 to the substrate 114 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 23:
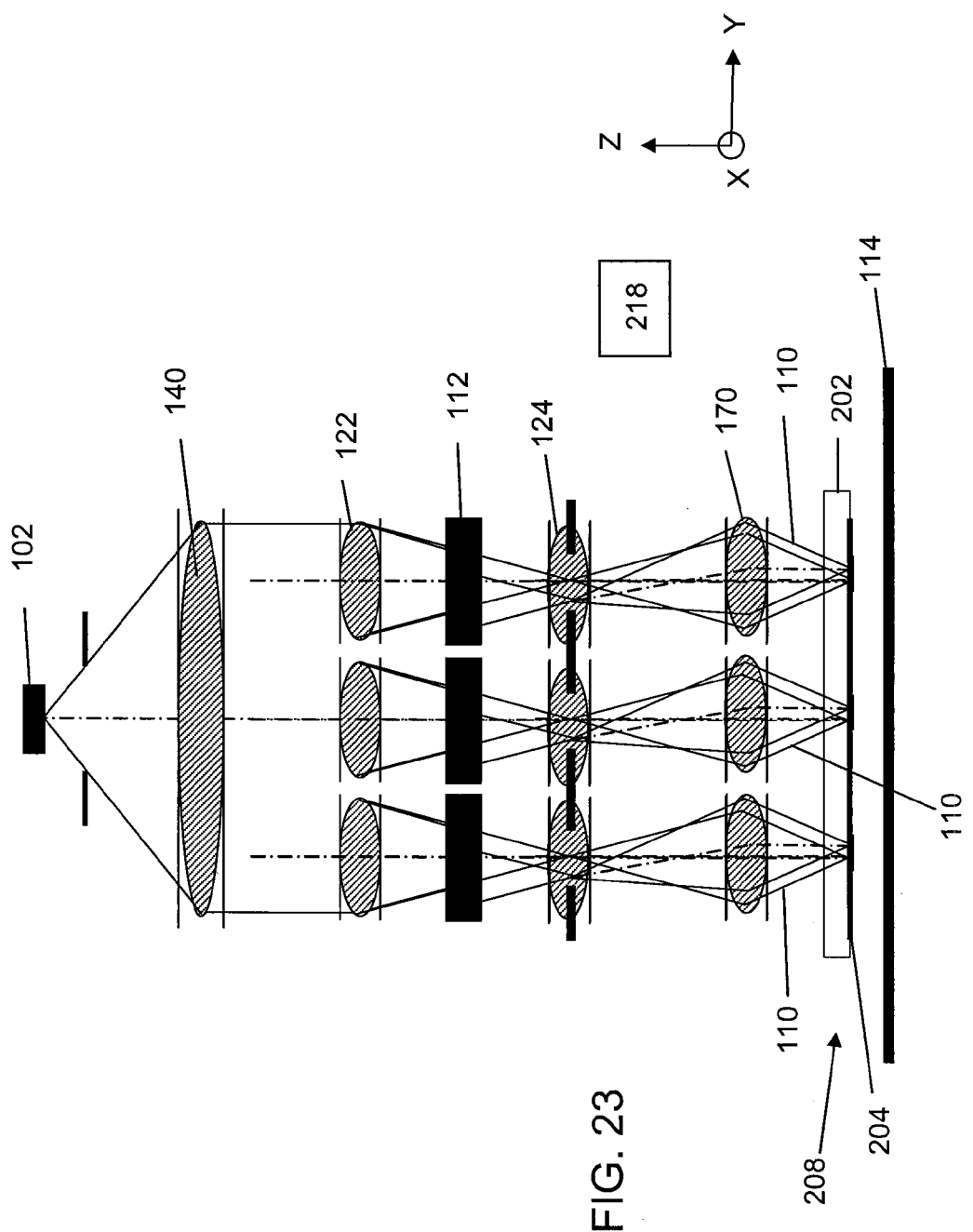
FIG. 23 is a schematic side view of a lithographic apparatus according to an embodiment of the present invention.

An embodiment of an apparatus to provide material deposition is depicted in FIG. 23. The apparatus of FIG. 23 is similar in most respects as that depicted in and described with respect to FIG. 8, i.e., a beam is split into multiple beamlets 110; in an embodiment, the apparatus of FIG. 7 or any other apparatus described herein may be used instead. The most significant difference is the presence of donor structure 208 having, in this embodiment, a substantially transparent material 202 and a donor material layer 204 thereon. Referring to FIG. 23, a plurality of beamlets 110 are projected at the same time. The plurality of beamlets 110 may be used to improve throughput, wherein each beamlet 110 can create an independent pattern of donor material 206 on the substrate 114. The beamlets 110 may be deflected to an appropriate position on the donor structure 208 with a deflector 112, e.g., an electro-optical deflector that deflects in two-dimensions. Accordingly, through the deflection of the beamlets 110, the donor material droplets 206 may be spatially arranged on the substrate 114. An exposure strategy may be used including, for example, the full exposure mode and/or the efficient exposure mode described herein. In an embodiment, the distance between the donor structure 208 and the substrate 114 is between 1-9 micrometers. In an embodiment, 100 nm of aluminum droplets may be deposited in a pattern having a 6% pattern density using an efficient exposure mode as described herein in about 60 seconds. Such an embodiment may use a single radiation source 102 to provide a 120 mm exposure width of the substrate moving at 75 mm/s during exposure using 300 beamlets having an image field of 0.4 mm each. The radiation source may be a coherent 8W Talisker laser with a 15 ps pulse duration.

As described above, the apparatus may be configured to provide a combination of photolithography, material deposition and/or material removal. A controller 218 may control the switch between the mode of photolithography and material deposition, between material deposition and material removal, etc. For example, to switch between photolithography and material deposition, the controller 218 may control the apparatus to change the appropriate optical and beam settings between photolithography and material deposition (for example, increase power and/or shorten pulse length for material deposition) and, in certain circumstances, cause the donor structure 208 to be inserted into and/or removed the beam path. For example, to switch between material removal and material deposition, the controller 218 may control the apparatus to change the appropriate optical and beam settings between material removal and material deposition (for example, increase beam power) and, in certain circumstances, cause the donor structure 208 to be inserted into and/or removed the beam path.

Figure 24:
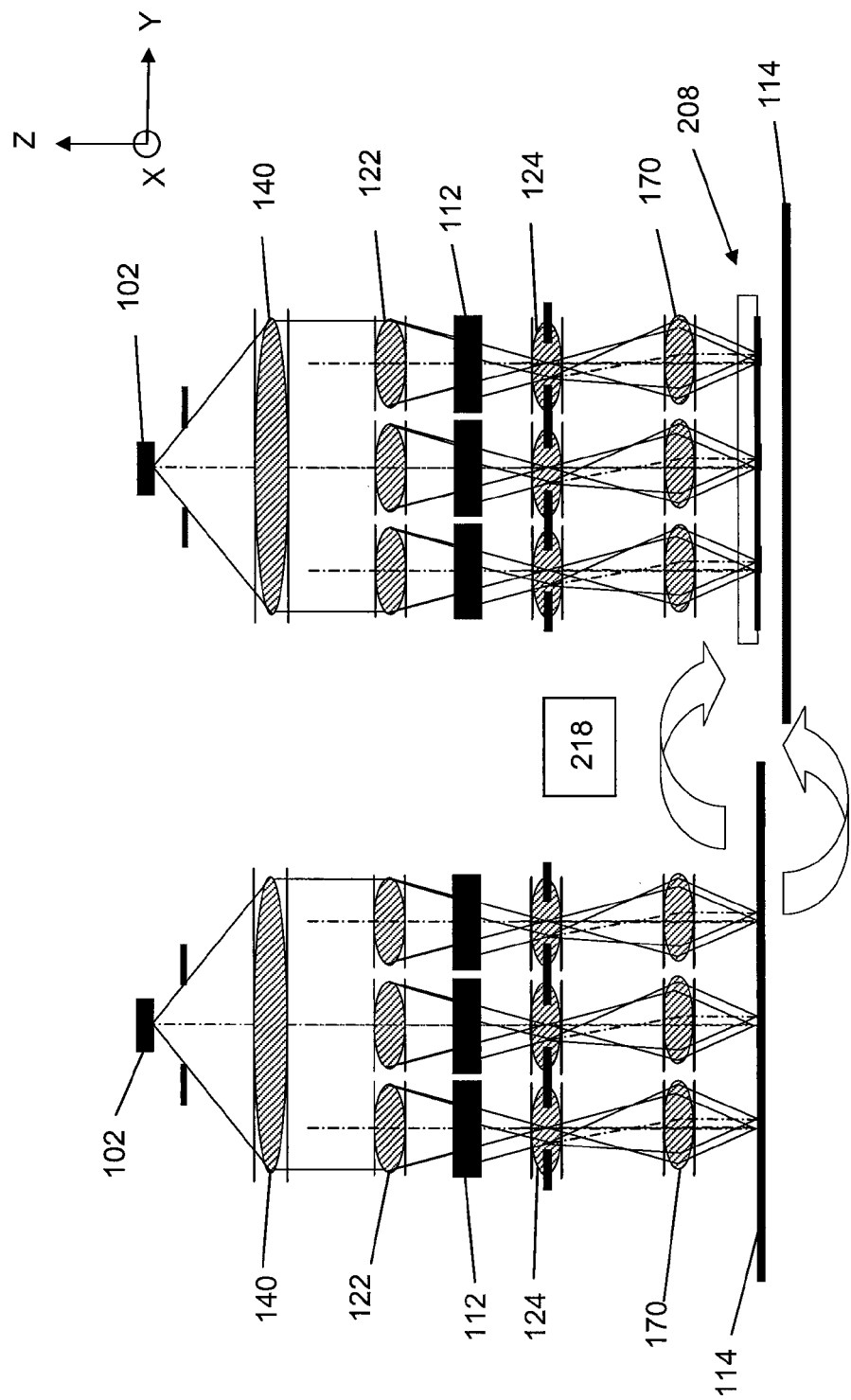
FIG. 24 is a schematic side view of a lithographic apparatus according to an embodiment of the present invention.

Referring to FIG. 24, an embodiment of an apparatus to provide material deposition in combination with photolithography and/or laser ablation is depicted. In a first configuration of the apparatus shown on the left hand side of FIG. 24, the apparatus is configured to perform photolithography as described herein and, additionally or alternatively, laser ablation using the beam. In a second configuration of the same apparatus shown on the right hand side of FIG. 24, the apparatus is configured to perform material deposition as described herein. To perform the material deposition, the donor structure 208 is introduced to between the imaging lens 170 and the substrate 114. To accomplish this, the substrate 114 is lowered by several millimeters a donor structure 208 is introduced. Alternatively or additionally, the imaging lens 170 or any appropriate combination of elements above the substrate 114 may be raised to facilitate the introduction of the donor structure 208. In an embodiment, there may be no movement if there is sufficient space for the introduction of the donor structure 208. Controller 218 may control the various configuration changes to switch between material deposition and material removal, between photolithography and material deposition, etc.

In an embodiment, the donor structure 208 has a same size (e.g., diameter, width, length, width and length, etc.) and optionally the same shape as the substrate 114 and thus may be introduced using a substrate handler (e.g., a robot). The donor structure 208 may be stored, for example, in its own storage unit or the storage unit of the substrate 114 when it is not being used, e.g., when the apparatus is used in photolithography and/or ablation mode. In an embodiment, the donor structure 208 has width of 3 meters.

In an embodiment, the donor structure 208 may be supported on the substrate 114, substrate table 106, positioning device 116, or its own positioning device (e.g., an actuator). For example, referring to FIG. 26, the substrate table 106 may be provided with one or more donor structure supports 226. The donor structure 208 may be movable in up to 6 degrees of freedom due to movement of the substrate and/or substrate table and/or due to actuation by a positioning device (e.g., in or part of support 226). In an embodiment, the donor structure 208 is movable at least in the X-direction. In an embodiment, the donor structure 208 moves in conjunction with the substrate 114 during exposure.

Figure 25:
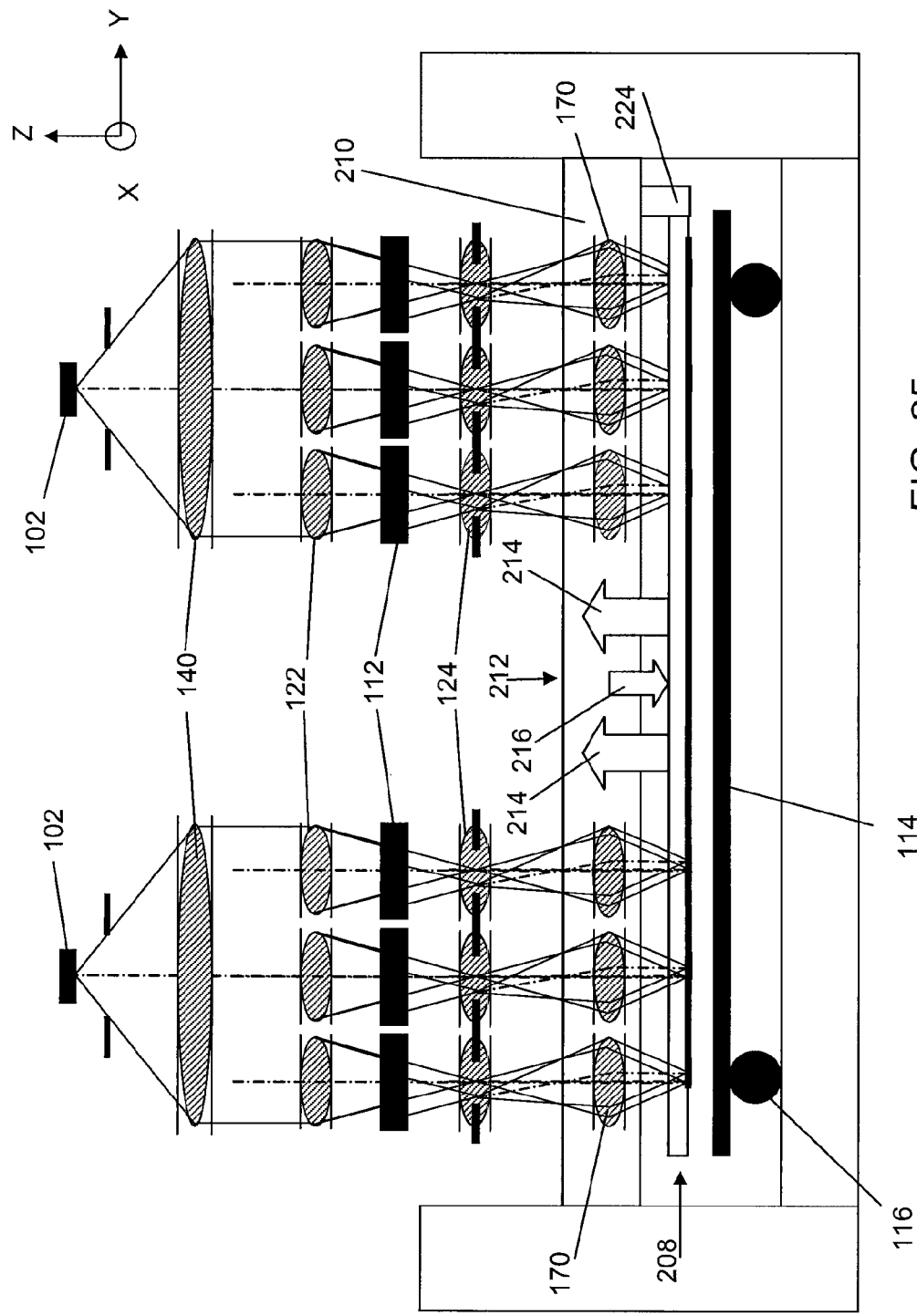
FIG. 25 is a schematic side view of a lithographic apparatus according to an embodiment of the present invention.

In an embodiment, referring to FIG. 25, the donor structure 208 may be additionally or alternatively supported in part or entirely on a frame 210 (which, in an embodiment, may be the same frame as frame 160 or connected to frame 160). In an embodiment, the frame 210 may comprise a positioning device (e.g., an actuator) 224 to move the donor structure 208 in up to 6 degrees of freedom. In an embodiment, the donor structure 208 is movable at least in the X-direction. In an embodiment, the donor structure 208 moves in conjunction with the substrate 114. Where the donor structure 208 is in part supported by the frame, the donor structure 208 may be in other part supported by, or connected to, the substrate 114, substrate table 106, positioning device 116, or its own positioning device (e.g., an actuator). In such a case, the donor structure 208 may be movable in up to 6 degrees of freedom due to movement of the substrate and/or substrate table and/or due to actuation by a positioning device.

Figure 26:
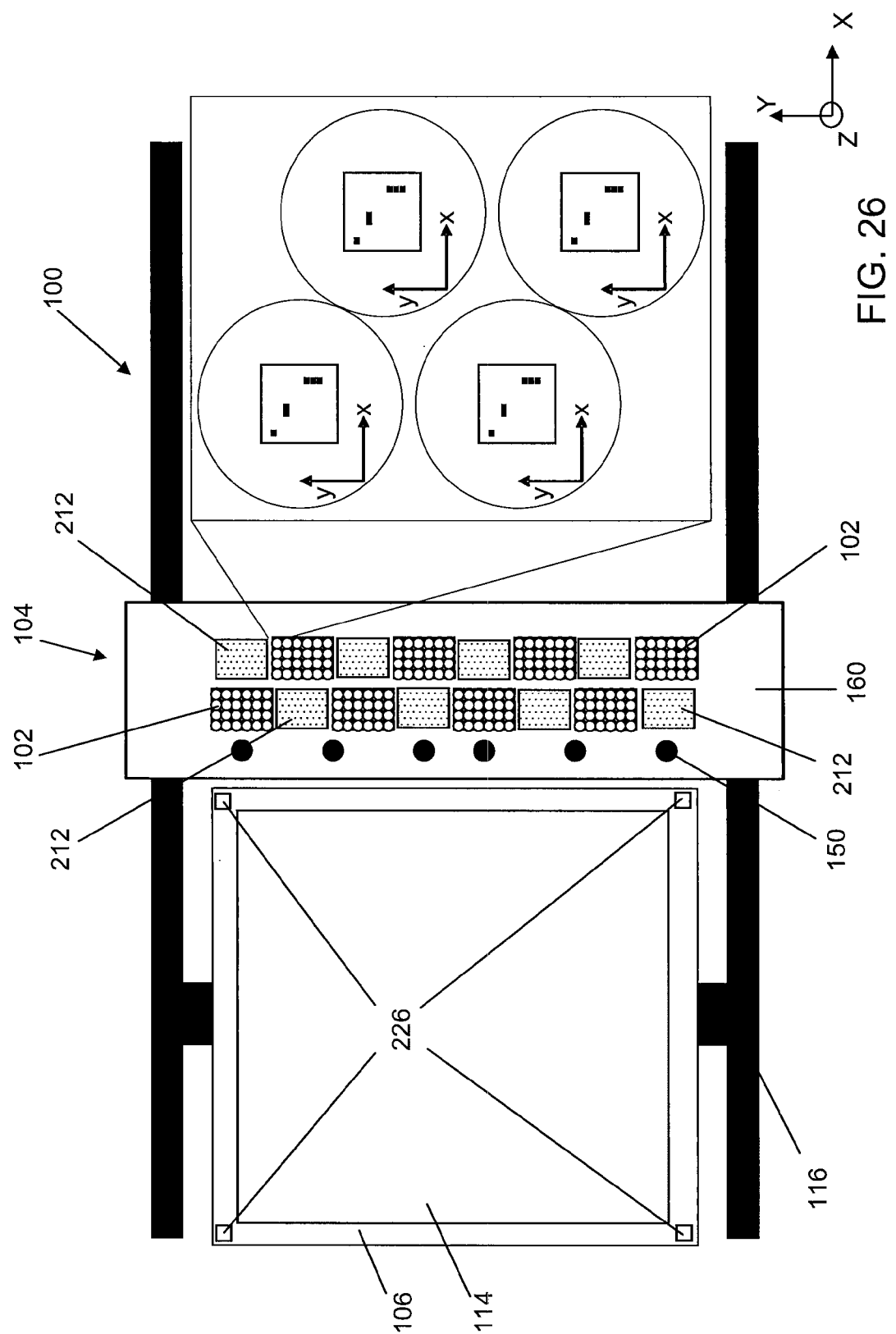
FIG. 26 is a schematic top view of a lithographic apparatus according to an embodiment of the present invention.

In an embodiment, the donor structure 208 is supported from above at least in part by the frame 210. To facilitate movement of the donor structure 208, the donor structure 208 is supported, in an embodiment, by a pre-stressed gas (e.g., air) bearing 212 of the frame 210. In this bearing 212, a combination of underpressure 214 (e.g., vacuum suction) and overpressure 216 (e.g., pressurized gas) is applied. In an embodiment, the underpressure 214 and overpressure 216 are arranged in a checkerboard pattern of respective inlets and outlets. The underpressure 214 can be used to compensate gravity and hold the donor structure 208 in position; the overpressure 216 is used to help prevent the donor structure 208 from adhering to the frame 210 and thus permit donor structure 208 to move. Referring to FIG. 26, an arrangement of gas bearings 212 are depicted arranged on frame 160 to at least in part support donor structure 208 (not shown for clarity) from above. Through appropriate control of the pressures of underpressure 214 and/or overpressure 216 in value and spatial location, the donor structure 208 may be leveled or otherwise moved in the Z-direction, around the X-direction and/or around the Y-direction. In this fashion, unwanted contact with the substrate may be avoided. Further, bending or other warping of the donor structure 208 may be similarly compensated. While the embodiment of FIG. 26 depicts donor structure support 226 on the substrate table 106, such support 226 need not be provided in an embodiment.

In an embodiment, the donor structure 208 is refreshed to enable continued material deposition. In an embodiment, after production of a substrate with a certain pattern, the donor structure 208 is refreshed. This is because the donor structure 208 is the negative of the pattern deposited on the substrate 114 since the donor material is transferred from the donor structure 208 to the substrate 114. Thus, transfer of the same pattern again from the donor structure 208 may not feasible without refreshment. In an embodiment, the apparatus may comprise a controller configured to increase or maximize use of the donor structure 208 by, for example, causing relative displacement between the donor structure 208 and the substrate 114 to enable projection of the beamlets on unused areas of the donor structure 208. Similarly, the controller may enable the beamlets to be projected in different patterns to make further use of the donor structure 208 without refreshment.

In an embodiment, the donor structure 208 refreshment comprises substituting a new donor structure 208 for a donor structure 208 used during exposure. In an embodiment, the donor structure 208 refreshment comprises regenerating the donor material on the donor structure 208 (since only a few % of the donor material layer 204 is transferred to the substrate). Regeneration of the donor material layer 204 on the donor structure 208 may save cost.

In an embodiment, refreshment of the donor structure 208 may be accomplished in several example ways. In an embodiment, the donor structure 208 may be replaced by a "fresh" one and a new layer of donor material is applied to the used donor structure 208 off-line. For example, the donor structure 208 may be changed with the load-unload of a new substrate 114. The donor structure 208 may have a similar size, and optionally shape, as the substrate so it may be handled with the same handler used to load-unload the substrate.

In an embodiment, the donor structure 208 may be in the form of a flexible membrane that can be, for example, rolled. Thus, the donor structure 208 may be a flexible tape similar in concept to an inktape in an old typewriter. Every time a "new" donor structure 208 is needed to pattern the substrate a "fresh" part of the membrane from, for example, the roll is used. So, in an embodiment, the apparatus may have two rolls—one with "fresh" donor structure 208 and one with "used" donor structure 208. The "used" donor structure 208 may be reconditioned to apply donor material thereon so it can be reused. For example, the membrane may be regenerated in-situ as the membrane is loaded onto the "used"

donor structure roll. A regeneration module may be located at a particular position to regenerate the membrane just before the "used" membrane is rolled on the "used" donor structure roll.

In an embodiment, the donor structure 208 may be regenerated in-situ. For example, a module may be provided on the substrate table 106 that is active during movement of the substrate table 106 back to a substrate handler, i.e., after patterning of the substrate 114, the substrate table 106 goes back to an load-unload position for removal of the substrate 114. During such or other movement of the substrate table 106, the donor structure 208 may remain stationary as the substrate table 106 scans underneath the donor structure 208 providing the capability of regeneration using the module moving with the substrate table 106. Thus, in-situ repair of holes in the donor material of the donor structure 208 may be made. The module may have a sensor to detect such holes and/or the substrate table 106 positioning may be controlled during movement in accordance with information regarding how the donor material was removed during exposure. The module need not be located on the substrate table 106. For example, it may be separately provided and movable. In an embodiment, the module may be stationary and the donor structure 208 is moved with respect to the module.

In an embodiment, regeneration of the donor material of the donor structure 208 may be accomplished in several example ways. For example, in an embodiment, regeneration of the donor material of the donor structure 208 may be accomplished by smoothing a paste or liquid on the donor structure 208. The paste or liquid may be mechanically spread over the donor structure 208. The paste or liquid fills the holes that are generated during the laser induced transfer.

In an embodiment, regeneration of the donor material of the donor structure 208 may be accomplished by passing the donor structure 208 into or through a bath and depositing a layer of donor material on the donor structure 208. In an embodiment, a bath of melted material is brought in contact with the "used" donor structure 208. Due to surface tension a finite, self limiting layer of donor material should be deposited on the donor structure 208.

In an embodiment, regeneration of the donor material of the donor structure 208 may be accomplished by thermal reflow of the donor material layer 204 to fill holes and optionally deposition of extra material to compensate for material transferred from the donor material layer 204 during exposure. The donor structure 208 and/or the donor material layer 204 may be heated resulting in smoothing of the layer: the holes are filled. Further donor material may be deposited to generate the desired thickness of the donor material layer 204 should the donor material layer 204 not be thick enough after reflow.

In an embodiment, regeneration of the donor material of the donor structure 208 may be accomplished by selective growth of a part of the donor structure 208 followed by reflow of the donor material layer 204 and optionally deposition of extra donor material. This method may be used in a situation where, for example, the donor material layer 204 overlies a release or other layer (e.g., transparent material 202). Thus, the release or other layer may be regenerated follow by regeneration of the donor material layer 204. For example, the release or other layer may have deposited thereon a chemically specific deposition material that results in repair of the release or other layer. The donor material layer 204 may be reflowed as discussed above and optionally extra material deposited thereon. In an embodiment, the donor material layer 204 may be regenerated using any of the other methods disclosed herein or elsewhere.

Additionally or alternatively, as discussed above, the beam can be used to ablate a material of the substrate. In particular, the beam can be used to introduce a phase transfer. Controller 218 may be configured to configure the radiation source to provide a beam of increased power compared to that used for material deposition and/or photolithography.

It has been discovered that, for example, deflection of a beamlet of over 400 microns at 3 microns resolution may not be feasible, such as for a two-dimensional deflector to deflect the beam over a 400×400 micron field with a resolution of 3 microns. Thus, to obtain coverage of a substrate at a desired resolution, the number of beamlets may be increased by introducing more electro-optical deflectors and perhaps more radiation sources (e.g., diodes). It may not be practically feasible to implement all this extra hardware in a tool due to, e.g., space limitations, heating side effects, cost, etc.

In an embodiment, an electro-optical deflector is combined with a movable lens to extend the deflection distance across a target (e.g., the donor structure 208). In an embodiment, the deflection range of a beam (or beamlet) can become larger than the deflection of the electro-optical deflector by imaging the beam on to the target with a rotating optical element; this rotating optical element can help to move the beam spots over the target. In an embodiment, an one-dimensional electro-optical deflector may deflect the beam in a first direction and a motion of the rotating optical element may cause the beam to deflect in a second direction substantially perpendicular to the first direction. In an embodiment, the motion of the rotating optical element and the deflection of the beam by the electro-optical deflector are substantially perpendicular at the point where the beam is incident on the rotating optical element. Accordingly, each position on a target of a donor structure, substrate, etc. may be reached through combination of movement of the target, deflection by the deflector and deflection by the rotating optical element.

Figure 27:
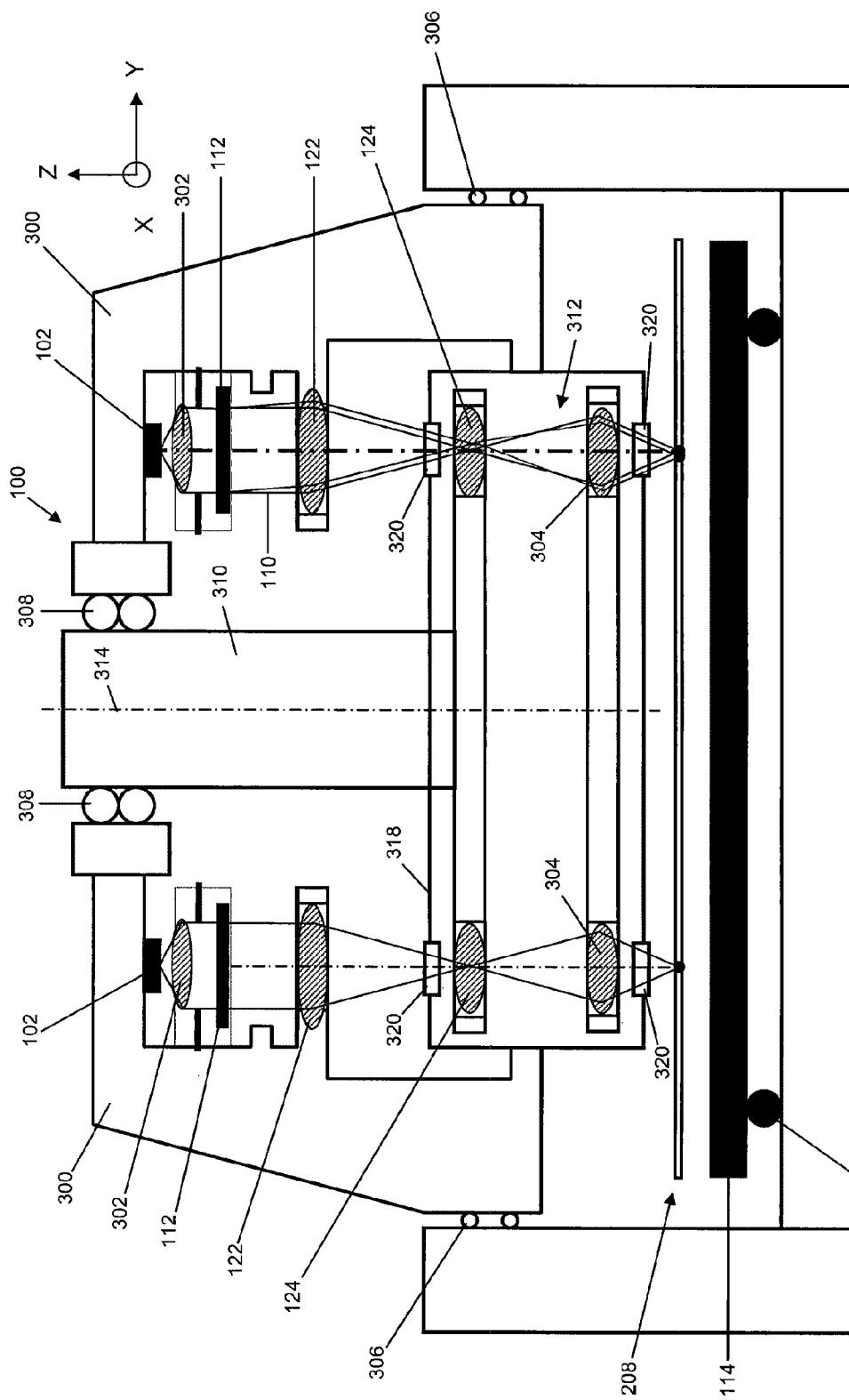
FIG. 27 is a schematic side view of a lithographic apparatus according to an embodiment of the present invention.

FIG. 27 schematically depicts a schematic cross-sectional side view of a part of a lithographic or exposure apparatus. In this embodiment, the apparatus has one or more individually controllable elements substantially stationary in the X-Y plane as discussed herein although it need not be the case. The apparatus 100 comprises a positioning device 116 to move a substrate 114 in up to 6 degrees of freedom. The apparatus may optionally include a substrate table 106. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 100 further comprises one or more individually controllable elements 102 configured to provide a plurality of beams 110. In an embodiment, one or more of the individually controllable elements 102 is a radiation emitting diode, such as a light emitting diode (LED), an organic LED (OLED), a polymer LED (PLED), or a laser diode (e.g., a solid state laser diode). In an embodiment, each of a plurality of individually controllable elements 102 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die)

is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr). In an embodiment, the individually controllable element 102 can be a laser, e.g., Nd-YAG laser, to generate a beam that can be split into the plurality of beams 110 by, e.g, a micro lens arrray.

The individually controllable element 102 is arranged on a frame 300 and may extend along the Y-direction and/or the X direction. While one frame 300 is shown, the apparatus may have a plurality of frames 300. Further arranged on the frame 300 is a deflector 112. The frame 300 may comprise a lens 302, which can collimate the radiation from the individually controllable element 102 and output the radiation toward the deflector 112. The frame may comprise a lens 122, which can re-direct the radiation from the deflector 112 toward lens 124. Frame 300 and thus individually controllable element 102 and lenses 302 and 122 are substantially stationary in the X-Y plane. Frame 300, individually controllable element 102, and lenses 302/122 may be moved in the Z-direction by actuator 306. Alternatively or additionally, lens 302 and/or 122 may be moved in the Z-direction by an actuator related to the particular lens(es). Optionally, each lens 302 and/or 122 may be provided with an actuator.

The individually controllable element 102 may be configured to emit a beam and the projection system 122, 124, and 304 may be configured to project the beam onto a target of the donor structure 208 and/or substrate 114. The individually controllable element 102 and the projection system form an optical column. The apparatus 100 may comprise an actuator (e.g. motor) 308 to move the optical column or a part thereof with respect to the target. Frame 310 with arranged thereon field lens 124 and imaging lens 304 may be rotatable with the actuator. A combination of field lens 124 and imaging lens 304 forms movable optics 312. In use, the frame 310 rotates about its own axis 314. The frame 310 is rotated about the axis 314 using an actuator (e.g. motor) 308. Further, the frame 310 may be moved in a Z direction by motor 306 and/or 308 so that the movable optics 312 may be displaced relative to the target.

An aperture structure 316 having an aperture therein may be located above deflector 112 between the deflector 112 and the individually controllable element 102 and/or the lens 302. The aperture structure 316 can limit diffraction effects of the lens 302, the individually controllable element 102, and/or of an adjacent lens 302/individually controllable element 102.

The depicted apparatus may be used by rotating the frame 310 and simultaneously moving the donor structure 208 and/or substrate 114 underneath the optical column. A beam from the individually controllable element 102 traverses the lenses 122, 124, and 304 when the lenses are substantially aligned with each other. By moving the lenses 124 and 304, the image of the beam is scanned over a target on the donor structure 208 and/or substrate 114. By simultaneously moving the target (and optionally a structure, such as the substrate 114, which may not have the target) underneath the optical column, the portion of the target is subjected to an image of the individually controllable element 102 that is also moving. Using a controller, by appropriate controlling the rotation of the optical column or part thereof, controlling the speed of the target, controlling the deflection of the beam by deflector 112 and optionally switching the individually controllable element(s) 102 "on" and "off" (e.g., having no output or output below a threshold when it is "off" and having an output above a threshold when it is "on") and/or controlling the intensity of the individually controllable element 102, a desired pattern can be imaged on the target (and the substrate if the target is not on the substrate).

Further, in an embodiment, the apparatus 100 may comprise a housing 318 in which a part of the frame 310 rotates. The part of the frame 310 may comprise the lenses 124 and 304. The housing 318 may comprise one or more windows 320 to allow the radiation to enter into the housing 318 toward lenses 124/304 and/or to allow the radiation to exit the housing 318 toward substrate 114. In an embodiment, the housing 318 may be part of or attached to frame 300. The housing 318 may be sealed so that its interior is substantially isolated from an ambient environment outside the housing 318 (and thus sealing the part from the ambient environment).

In an embodiment, a system may be provided to control the focus of an image projected onto a target. The arrangement may be provided to adjust the focus of the image projected by part or all of an optical column in an arrangement as discussed herein.

Referring to FIG. 27, the right side deflector 112 is shown as deflecting the beam(s) 110 in the Y-direction (although typically in the embodiment shown in FIG. 27 the deflection by the deflector 112 would be in the X-direction but such deflection would not be apparent in the side view of FIG. 27). Such deflection is projected through the lenses 122, 124 and 304 to the target on the donor structure 208 and/or substrate 114 as shown in FIG. 27. At the same time, the rotatable frame 310 causes the lenses 124/304 to move, which in turn causes the beam(s) to deflect in the X-direction (although typically in the embodiment shown in FIG. 27 the deflection by the lenses 124/304 would be in the Y-direction with deflection by the deflector 112 in the X-direction) which is not apparent in FIG. 27. Thus, through this combination of motion (described further below), the beam(s) can be scanned in two-dimensions.

FIG. 28 depicts a highly schematic side view of the lens 124 and lens 304 and how it can deflect a beam 110. As shown in FIG. 28, a beam 110 is directed to the lens 124, which is at a first position shown by the clear lens 124. The lens 124 redirects the radiation toward lens 304, which is located at a first position shown by the clear lens 304. The beam is redirected by lens 304 toward the target on the donor structure 208 and/or substrate 114. When the lens 124 and lens 304 are at their respective first positions the beam is incident on the left side of the target. Then, when lens 124 and lens 304 are rotated to their respective second positions shown as the dashed lenses 124/304 respectively, the movement of the lenses 124/304 causes the beam 110 to be incident on the right side of the target. The deflector 112 may further cause the beam 110 to be deflected in a direction substantially orthogonal to the deflection by the rotation of the lenses 124/304. In that manner, the beam 110 may scan a two-dimensional target area through the combination of deflection by the lenses 124/304 in a first direction and deflection by the deflector 112 in a second substantially perpendicular direction. In an embodiment, the deflector 112 may consist of a one-dimension deflector. Additionally or alternatively, the deflector 112 may deflect the beam in the first direction and thus may effectively speed up the scanning of the beam in the first direction through the combination of deflection by deflector 112 and movement of the lenses 124/304. In an embodiment where deflector 112 deflects in the first and second directions, the deflector 112 may be a two-dimensional deflector or may comprise two one-dimensional deflectors in series, one that deflects in the first direction and another that deflects in the second direction. Additionally or alternatively, the movement of lenses 124/304 (or of a further set of optical elements) may cause, or speed up, deflection of the beam in the second direction, the direction substantially perpendicular to the first direction.

While FIG. 27 shows a single beam 110 for convenience, there may be more than one beam 110 incident on a single lens 124/304, i.e., a single lens 124/304 having multiple beams incident thereon and deflecting each of the beams. In an embodiment, there may be 10 beams, 5 beams or 4 beams incident on a single lens 124/304. FIG. 29 depicts a highly schematic, perspective view of the rotating frame 310 provided with lenses 124, 304 at its periphery in combination with a plurality of individually controllable elements 102. A plurality of beams, in this example 4 beams (although a different number may be used), are incident onto one of the plurality of lenses 124, 304 of frame 310 and projected onto a target of the donor structure 208 and/or substrate 114. In an embodiment, the plurality of beams are arranged in a straight line. The rotatable frame is rotatable about axis 314 by means of an actuator (not shown). As a result of the rotation of the rotatable frame 310, the beams will be incident on successive lenses 124, 304 and will, incident on each successive lens, be deflected thereby so as to travel along a part of the surface of the target of the donor structure 208 and/or substrate 114, as will be explained in more detail with reference to FIG. 30. In an embodiment, each beam is generated by a respective individually controllable element 102, e.g., a self-emissive contrast device, e.g. a laser diode. In an embodiment, a plurality of beams may be split from a single beam from a single individually controllable element 102. In the arrangement depicted in FIG. 29, the beams are deflected by a deflector 112 and brought together by a segmented mirror 322 (or other beam redirecting device, e.g., a waveguide or optical fibers) in order to reduce a distance (pitch) between the beams, to thereby enable a larger number of beams to be projected through the same lens and to achieve resolution requirements discussed herein. In an embodiment, each beam (or beamlet) has its own electro-optical deflector to deflect the beam in a certain direction. As mentioned herein, that direction may be substantially parallel to and/or perpendicular to a direction of motion of the lens 124/304 at the point the beam is incident thereon. As discussed herein, the deflector 112 may be a single-dimension deflector, a two-dimensional deflector, or a combination of single-dimension deflectors arranged to deflect in different directions.

Figure 30:
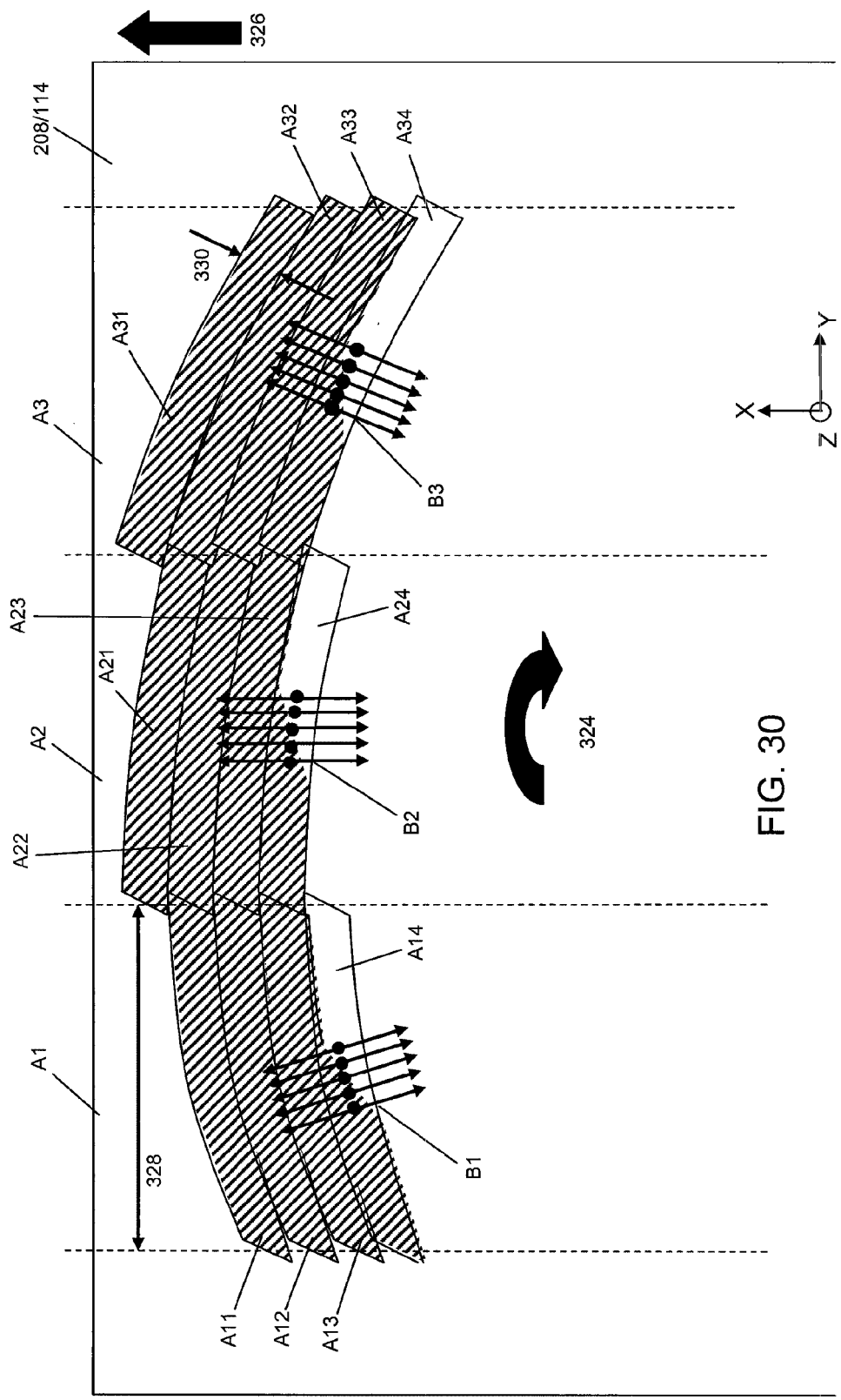
FIG. 30 is a schematic top view of projection of a plurality of beams according to an embodiment of the present invention.

As the rotatable frame rotates, the beams are incident on successive lenses and, each time a lens is irradiated by the beams, the places where the beam is incident on a surface of the lens, moves. Since the beams are projected on the target differently (with e.g. a different deflection) depending on the place of incidence of the beams on the lens, the beams (when reaching the target) will make a scanning movement with each passage of a following lens. This principle is further explained with reference to FIG. 30. FIG. 30 depicts a highly schematic top view of the projection of the beam(s) 110 from the rotatable frame 310 toward the target of donor structure 208 and/or substrate 114. A first set of beams is denoted by B1, a second set of beams is denoted by B2 and a third set of beams is denoted by B3. Each set of beams is projected through a respective lens set 124, 304 of the rotatable frame 310. As the rotatable frame 310 rotates in direction 324, the beams B1 are projected onto the donor structure 208 and/or substrate 114 in a scanning movement, thereby scanning area A14. Similarly, beams B2 scan area A24 and beams B3 scan area A34. At the same time of the rotation of the rotatable frame 310 by a corresponding actuator, the deflector 112 deflects the beams in a direction substantially perpendicular to the scanning movement generally shown by the arrows associated with beams B1, B2, and B3. Thus, the areas A14, A24 and A34 may be scanned in two-dimensions through the combined deflection by the lens set 124, 304 and the deflector 112. Further, at the same time of the rotation of the rotatable frame 310, the donor structure 208 and/or substrate 114 is moved in the direction 326, which may be along the X axis as depicted in FIG. 30, thereby being substantially perpendicular to the scanning direction of the beams in the areas A14, A24, A34. As a result of the movement in direction 326 by a second actuator (e.g. a movement of the donor structure 208 and/or movement of the substrate 114 by positioning device 116), successive scans of the beams when being projected by successive lenses of the rotatable frame 310, are projected so as to substantially abut each other, resulting in substantially abutting areas A11, A12, A13, A14 (areas A11, A12, A13 being previously scanned as shown by the shading and A14 being currently scanned as shown in FIG. 30) for each successive scan of beams B1, areas A21, A22, A23 and A24 (areas A21, A22, A23 being previously scanned as shown by the shading and A24 being currently scanned as shown in FIG. 30) for beams B2 and areas A31, A32, A33 and A34 (areas A31, A32, A33 being previously scanned as shown by the shading and A34 being currently scanned as shown in FIG. 30) for beams B3. Thereby, the areas A1, A2 and A3 of the substrate surface may be covered with a movement of the donor structure 208 and/or substrate 114 in the direction 326 while rotating the rotatable frame 310. The projecting of multiple beams through a same lens allows processing in a shorter timeframe (at a same rotating speed of the rotatable frame 310), since for each passing of a lens, a plurality of beams scan the target with each lens, thereby allowing increased displacement in the direction 326 for successive scans. Viewed differently, for a given processing time, the rotating speed of the rotatable frame may be reduced when multiple beams are projected onto the target via a same lens, thereby possibly reducing effects such as deformation of the rotatable frame, wear, vibrations, turbulence, etc. due to high rotating speed. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the target at a time via the same one of the lenses have a mutual spacing, and the apparatus may be arranged to operate to move the donor structure 208 and/or substrate 114 with respect to the optical column to have a following projection of the beam to be projected in the spacing.

In order to reduce a distance between successive beams in a group in the direction 326 (thereby e.g. achieving a higher resolution in the direction 326), the beams may be arranged diagonally in respect of each other, in respect of the direction 326. The spacing may be further reduced by providing a segmented mirror 322 (or other beam redirecting device, e.g., a waveguide or optical fibers as discussed hereafter) in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers. Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

In an embodiment, the deflection may allow a spot of 12 millimeters length (see 328 in FIG. 30) to be projected by a single lens set 124, 304. In an embodiment, the deflection may allow a spot of about 6 to 7 microns width, e.g., 6.4 microns (see 330 in FIG. 30) to be projected by a single lens set 124, 304. In an embodiment, referring to FIG. 30, the deflection by the deflector 112 may allow the beam spot to be placed over a range of about 26 microns anywhere along the arrows associated with beams B1, B2 and B3. In an embodiment, $2.5 \times 10^9$ spots per second may be delivered. Such spot rate may be provided for a substrate of $3 \times 3$ m$^2$ exposed with 2700 beamlets, with a resolution of 3 microns, a processing time of the substrate of 60 seconds (including 40 seconds exposure time), a pattern coverage of about 10%, and about 1 MHz update frequency of the deflector.

Further, in an embodiment, the combination of the various movements of the beam by the deflector and movable lens set 124/204 and of the target by, e.g., positioning device 116, allows for redundancy of projection of a spot on the target. For example, in an embodiment, each pixel on the target may be printed by up to 40 beamlets. Therefore, if a beamlet fails (e.g., is of insufficient intensity, is not projected at all, deviates from an expected direction, etc.), another beamlet may be used to expose an area that would have otherwise been exposed by the failed beamlet.

Figure 31:
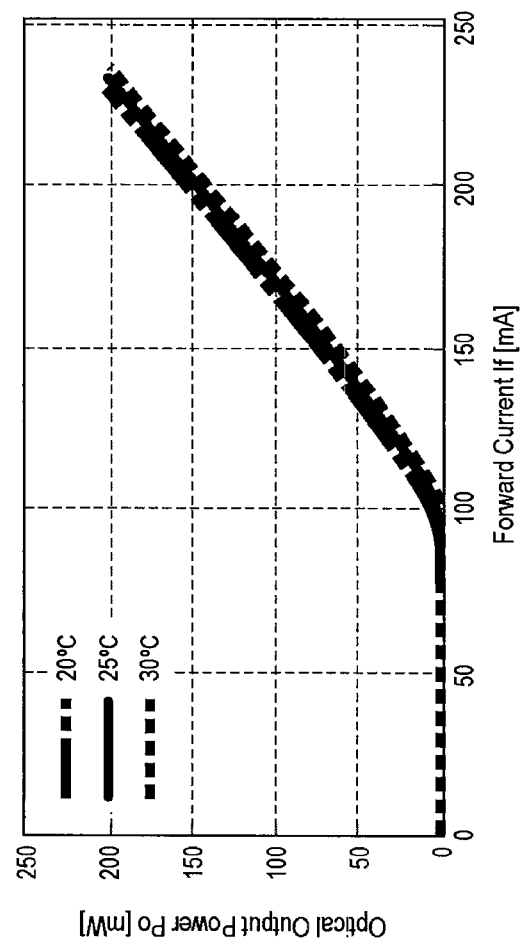
FIG. 31 depicts a power/forward current graph of an individually addressable element according to an embodiment of the present invention.

In an embodiment, 400 individually addressable elements 102 may be provided. In an embodiment, 600-1200 working individually addressable elements 102 may be provided with, optionally, additional individually addressable elements 102 as, for example, a reserve and/or for correction exposures (as, for example, discussed above). The number of working individually addressable elements 102 may depend, for example, on the resist, which requires a certain dosage of radiation for patterning.

Where the individually addressable elements are the diodes, they may be operated in the steep part of the optical output power vs. forward current curve (240 mA v. 35 mA) as shown, e.g., in FIG. 31, yielding high output power per diode (250 mW v. 0.33 mW) but low electrical power for the plurality of individually addressable elements (133 W v. 15 kW). Thus, the diodes may be used more efficiently and lead to less power consumption and/or heat. Thus, in an embodiment, diodes are operated in the steep part of the power/forward current curve. Operating in the non-steep part of the power/forward current curve may lead to incoherence of the radiation. In an embodiment, the diode is operated with an optical power of greater than 5 mW but less than or equal to 20 mW, or less than or equal to 30 mW, or less than or equal to 40 mW. In an embodiment, the diode is not operated at optical power of greater than 300 mW. In an embodiment, the diode is operated in a single mode, rather than multi-mode.

The number of individually addressable elements 102 may depend, inter alia (and as to an extent also noted above), on the length of the exposure region that the individually addressable elements 102 are intended to cover, the speed with which the individually addressable elements 102 is moved, if any, during exposure, the speed and amount of deflection by a deflector, the spot size (i.e., cross-sectional dimension, e.g., width/diameter, of the spot projected on the substrate from an individually addressable element 102), the desired intensity each of the individually addressable elements should provide (e.g. whether it is desired to spread the intended dose for a spot on the substrate over more than one individually addressable element to avoid damage to the substrate or resist on the substrate), the desired scan speed of the substrate, cost considerations, the frequency with which the individually addressable elements can be turned "on" or "off", and the desire for redundant individually addressable elements 102 (as discussed earlier; e.g. for correction exposures or as a reserve, for instance if one or more individually addressable elements break down). In an embodiment, there are for an optical column at least 100 individually addressable elements 102, for instance at least 200 individually addressable elements, at least 400 individually addressable elements, at least 600 individually addressable elements, at least 1000 individually addressable elements, at least 1500 individually addressable elements, at least 2500 individually addressable elements, or at least 5000 individually addressable elements. In an embodiment, there are for an optical column less than 50000 individually addressable elements 102, for instance less than 25000 individually addressable elements, less than 15000 individually addressable elements, less than 10000 individually addressable elements, less than 7500 individually addressable elements, less than 5000 individually addressable elements, less than 2500 individually addressable elements, less than 1200 individually addressable elements, less than 600 individually addressable elements, or less than 300 individually addressable elements.

In an embodiment, an optical column comprises for each 10 cm of length of exposure region (i.e., normalizing the number of individually addressable elements in the optical column to 10 cm of length of exposure region) at least 100 individually addressable elements 102, for instance at least 200 individually addressable elements, at least 400 individually addressable elements, at least 600 individually addressable elements, at least 1000 individually addressable elements, at least 1500 individually addressable elements, at least 2500 individually addressable elements, or at least 5000 individually addressable elements. In an embodiment, an optical column comprises for each 10 cm of length of exposure region (i.e., normalizing the number of individually addressable elements in the optical column to 10 cm of length of exposure region) less than 50000 individually addressable elements 102, for instance less than 25000 individually addressable elements, less than 15000 individually addressable elements, less than 10000 individually addressable elements, less than 7500 individually addressable elements, less than 5000 individually addressable elements, less than 2500 individually addressable elements, less than 1200 individually addressable elements, less than 600 individually addressable elements, or less than 300 individually addressable elements.

In an embodiment, an optical column comprises less than 75% redundant individually addressable elements 102, e.g. 67% or less, 50% or less, about 33% or less, 25% or less, 20% or less, 10% or less, or 5% or less. In an embodiment an optical column comprises at least 5% redundant individually addressable elements 102, e.g. at least 10%, at least 25%, at least 33%, at least 50%, or at least 65%. In an embodiment, the optical column comprises about 67% redundant individually addressable elements.

In an embodiment, spot size of an individual addressable element on the substrate is 10 microns or less, 5 microns or less, e.g. 3 microns or less, 2 microns or less, 1 micron or less, 0.5 micron or less, 0.3 micron or less, or about 0.1 micron. In an embodiment, spot size of an individual addressable element on the substrate is 0.1 micron or more, 0.2 micron or more, 0.3 micron or more, 0.5 micron or more, 0.7 micron or more, 1 micron or more, 1.5 microns or more, 2 microns or more, or 5 microns or more. In an embodiment, spot size is about 0.1 micron. In an embodiment, spot size is about 0.5 micron. In an embodiment, spot size is about 1 micron.

Figure 32:
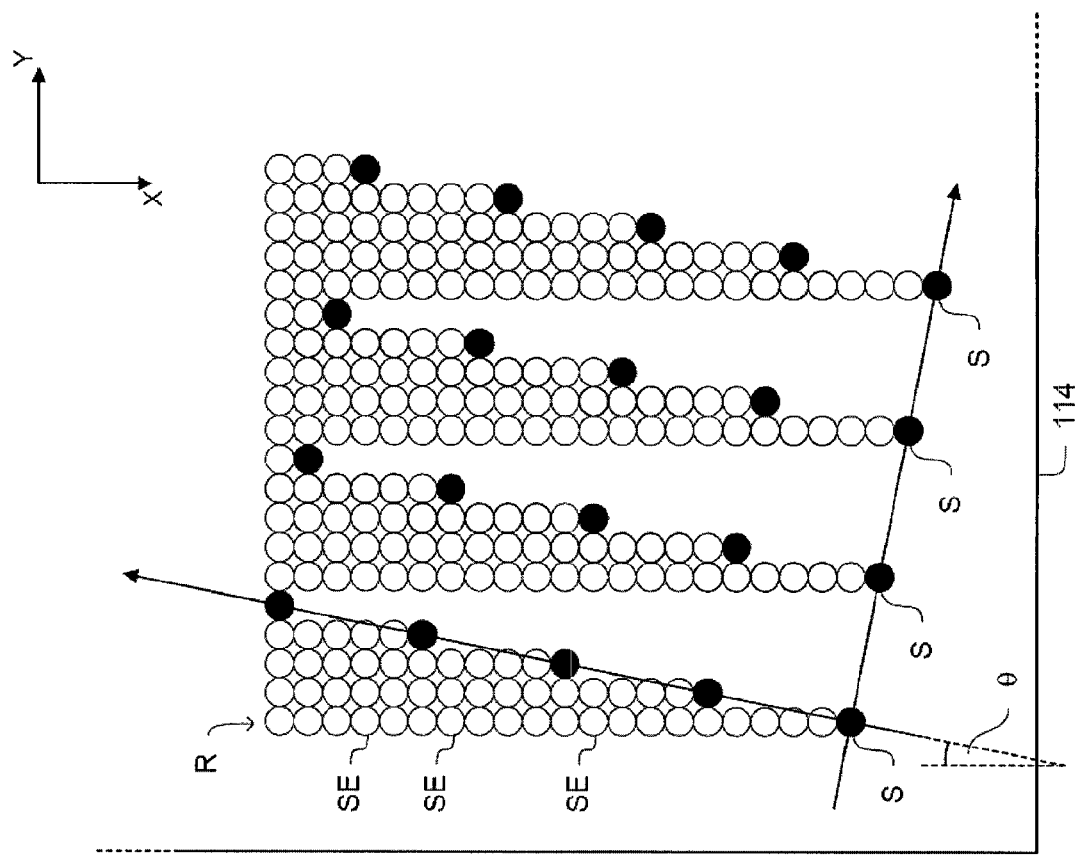
FIG. 32 depicts a mode of transferring a pattern to a substrate using an embodiment of the invention.

FIG. 32 illustrates schematically how the pattern on the substrate 114 may be generated. The filled in circles represent the array of spots S projected onto the substrate 114 by the array of lenses 170 in the projection system 108. The substrate 114 is moved relative to the projection system 108 in the X-direction as a series of exposures are exposed on the substrate. The open circles represent spot exposures SE that have previously been exposed on the substrate. As shown, each spot projected onto the substrate 114 by the array of lenses 170 within the projection system 108 exposes a row R of spot exposures on the substrate 114. The complete pattern for the substrate 114 is generated by the sum of all the rows R of spot exposures SE exposed by each of the spots S. Such an arrangement is commonly referred to as "pixel grid imaging." It will be appreciated that FIG. 32 is a schematic drawing and that spots S may overlap in practice.

It can be seen that the array of radiation spots S is arranged at an angle α relative to the substrate scanning direction (the edges of the substrate 114 lie parallel to the X- and Y-directions). This is done so that, when the substrate 114 is moved in the scanning direction (the X-direction), each radiation spot will pass over a different area of the substrate, thereby allowing the entire substrate to be covered by the array of radiation spots S. In an embodiment, the angle α is at most 20°, 10°, for instance at most 5°, at most 3°, at most 1°, at most 0.5°, at most 0.25°, at most 0.10°, at most 0.05°, or at most 0.01°. In an embodiment, the angle α is at least 0.0001°, e.g. at least 0.001°. The angle of inclination a and the width of the array in the scanning direction are determined in accordance with the image spot size and array spacing in the direction perpendicular to the scanning direction to ensure the whole surface area of the substrate 114 is addressed.

Figure 33:
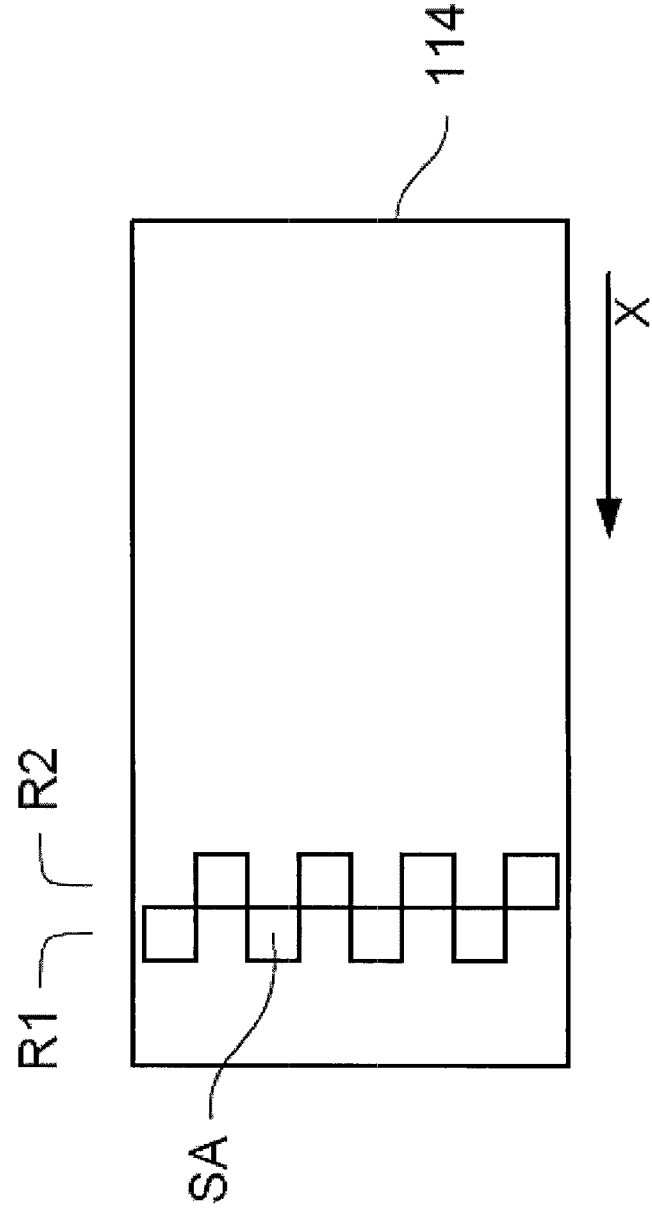
FIG. 33 depicts a schematic arrangement of optical engines.

FIG. 33 shows schematically how an entire substrate 114 may be exposed in a single scan, by using a plurality of optical engines, each optical engine comprising one or more individually addressable elements 102. Eight arrays SA of radiation spots S (not shown) are produced by eight optical engines, arranged in two rows R1, R2 in a 'chess board' or staggered configuration such that the edge of one array of radiation spots S slightly overlaps with the edge of the adjacent array of radiation spots S. In an embodiment, the optical engines are arranged in at least 3 rows, for instance 4 rows or 5 rows. In this way, a band of radiation extends across the width of the substrate W, allowing exposure of the entire substrate to be performed in a single scan. Such "full width" single pass exposure helps to avoid possible stitching issues of connecting two or more passes and may also reduce machine footprint as the substrate may not need to be moved in a direction transverse to the substrate pass direction. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g. less than 30 or less than 20. Each optical engine may comprise a separate patterning device 104 and optionally a separate projection system 108 and/or radiation system as described above. It is to be appreciated, however, that two or more optical engines may share at least a part of one or more of the radiation system, patterning device 104, and/or projection system 108.

In the embodiments described herein, a controller is provided to control the individually addressable element(s) 102 and/or patterning device 104. For example, in an example where the individually addressable elements are radiation emitting devices, the controller may control when the individually addressable elements are turned ON or OFF and enable high frequency modulation of the individually addressable elements. The controller may control the power of the radiation emitted by one or more of the individually addressable elements. The controller may modulate the intensity of radiation emitted by one or more of the individually addressable elements. The controller may control/adjust intensity uniformity across all or part of an array of individually addressable elements. The controller may adjust the radiation output of the individually addressable elements to correct for imaging errors, e.g., etendue and optical aberrations (e.g., coma, astigmatism, etc.). Similar control may be provided by a deflector 112 of the patterning device 104.

In photolithography, a desired feature may be created on a substrate by selectively exposing a layer of resist on a substrate to radiation, e.g. by exposing the layer of resist to patterned radiation. Areas of the resist receiving a certain minimum radiation dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps, for instance selective etching of the substrate, selective metal deposition, etc. thereby creating the desired feature. Patterning the radiation may be effected by controlling the patterning device 104 such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by providing a zero or significantly lower radiation intensity.

In practice, the radiation dose at the edges of the desired feature may not abruptly change from a given maximum dose to zero dose even if set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by providing radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate can only be set to two values (namely just a maximum value and a minimum value). In an embodiment, at least three different radiation intensity values can be projected, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the patterning device is a radiation source itself (e.g. an array of light emitting diodes or laser diodes), grayscaling may be effected, e.g., by controlling the intensity levels of the radiation being transmitted. If the patterning device include a deflector 112, grayscaling may be effected, e.g., by controlling the tilting angles of the deflector 112. Also, grayscaling may be effected by grouping a plurality of programmable elements and/or deflectors and controlling the number of elements and/or deflectors within the group that are switched on or off at a given time.

In one example, the patterning device may have a series of states including: (a) a black state in which radiation provided is a minimum, or even a zero contribution to the intensity distribution of its corresponding pixel; (b) a whitest state in which the radiation provided makes a maximum contribution; and (c) a plurality of states in between in which the radiation provided makes intermediate contributions. The states are divided into a normal set, used for normal beam patterning/printing, and a compensation set, used for compensating for the effects of defective elements. The normal set comprises the black state and a first group of the intermediate states. This first group will be described as gray states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states is described as white states, it will be appreciated that this is simply to facilitate the distinction between the normal and compensatory exposure steps. The entire plurality of states could alternatively be described as a sequence of gray states, between black and white, selectable to enable grayscale printing.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point, as described above. For example, the radiation dose received by each point may alternatively or additionally be controlled by controlling the duration of the exposure of said point. As a further example, each point may potentially receive radiation in a plurality of successive exposures. The radiation dose received by each point may, therefore, be alternatively or additionally controlled by exposing said point using a selected subset of said plurality of successive exposures.

Further, while the discussion above regarding gray scaling focused on photolithography, similar concepts may be applied to the material removal and material deposition discussed herein. For example, ablation may be controlled with different dose levels to provide gray scaling. Similarly, dose levels may be controlled to provide gray scaling associated with the material deposition.

In order to form the pattern on the substrate, it is necessary to set the patterning device to the requisite state at each stage during the exposure process. Therefore control signals, representing the requisite states, must be transmitted to the patterning device. Desirably, the lithographic apparatus includes a controller that generates the control signals. The pattern to be formed on the substrate may be provided to the lithographic apparatus in a vector-defined format e.g., GDSII. In order to convert the design information into the control signals, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

In an embodiment, the control signals may be supplied to the individually controllable elements 102 and/or one or more other devices (e.g., a deflector and/or sensor) by wired or wireless communication. Further, signals from the individually controllable elements 102 and/or from one or more other devices (e.g., a deflector and/or sensor) may be communicated to the controller. In a similar manner to the control signals, power may be supplied to the individually controllable elements 102 or one or more other devices (e.g., a deflector and/or sensor) by wired or wireless means. For example, in a wired embodiment, power may be supplied by one or more lines, whether the same as the ones that carry the signals or different. A sliding contact arrangement may be provided to transmit power. In a wireless embodiment, power may be delivered by RF coupling.

While the previous discussion focused on the control signals supplied to the individually controllable elements 102 and/or one or more other devices (e.g., a deflector and/or a sensor), they should be understood to encompass in addition or alternatively, through appropriate configuration, transmission of signals from the individually controllable elements 102 and/or from one or more other devices (e.g., a deflector and/or sensor) to the controller. So, communication may be one-way (e.g., only to or from the individually controllable elements 102 and/or one or more other devices (e.g., a deflector and/or sensor)) or two-way (i.e., from and to the individually controllable elements 102 and/or one or more other devices (e.g., a deflector and/or sensor)).

In an embodiment, the control signals to provide the pattern may be altered to account for factors that may influence the proper supply and/or realization of the pattern on the substrate. For example, a correction may be applied to the control signals to account for the heating of one or more of the individually controllable elements 102, lenses, etc. Such heating may cause changed pointing direction of the individually controllable elements 102, lenses, etc., change in uniformity of the radiation, etc. In an embodiment, a measured temperature and/or expansion/contraction associated with an individually controllable elements 102 and/or other element from, e.g., a sensor may used to alter the control signals that would have been otherwise provided to form the pattern. So, for example, during exposure, the temperature of the individually controllable elements 102 may vary, the variance causing a change of the projected pattern that would be provided at a single constant temperature. Accordingly, the control signals may be altered to account for such variance. Similarly, in an embodiment, results from the alignment sensor and/or the level sensor 150 may be used to alter the pattern provided by the individually controllable elements 102. The pattern may be altered to correct, for example, distortion, which may arise from, e.g., optics (if any) between the individually controllable elements 102 and the substrate 114, irregularities in the positioning of the substrate 114, unevenness of the substrate 114, etc.

In an embodiment, the change in the control signals may be determined based on theory of the physical/optical results on the desired pattern arising from the measured parameter (e.g., measured temperature, measured distance by a level sensor, etc.). In an embodiment, the change in the control signals may be determined based on an experimental or empirical model of the physical/optical results on the desired pattern arising from the measured parameter. In an embodiment, the change of the control signals may be applied in a feedforward and/or feedback manner.

In an embodiment, the lithographic apparatus may comprise a sensor 118 to measure a characteristic of the radiation that is or to be transmitted toward the substrate by one or more individually controllable elements 102. Such a sensor may be a spot sensor or a transmission image sensor. The sensor may be used to, for example, determine the intensity of radiation from an individually controllable element 102, uniformity of radiation from an individually controllable element 102, a cross-sectional size or area of the spot of radiation from an individually controllable element 102, and/or the location (in the X-Y plane) of the spot of radiation from an individually controllable element 102.

FIG. 2 depicts a schematic top view of a lithographic apparatus according to an embodiment of the invention showing some example locations of the sensor 118. In an embodiment, one or more sensors 118 are provided in or on the substrate table 106 to hold substrate 114. For example, a sensor 118 may be provided at the leading edge of the substrate table 106 and/or the trailing edge of the substrate table 106. In this example, three sensors 118 are shown, one for each array of individually controllable elements 102. Desirably, they are located at position that would not be covered by the substrate 116. In an alternative or additional example, a sensor may be provided at a side edge of the substrate table 106, desirably at a location that would not be covered by the substrate 116. The sensor 118 at the leading edge of the substrate table 106 can be used for pre-exposure detection of an individually controllable element 102. The sensor 118 at the trailing edge of the substrate table 106 can be used for post-exposure detection of an individually controllable element 102. The sensor 118 at the side edge of the substrate table 106 can be used for detection during exposure ("on-the-fly" detection) of an individually controllable element 102.

In an embodiment, the sensor 118 may be provided on the frame 160 and receives radiation from an individually controllable element 102 via a beam redirecting structure (e.g., a reflective mirror arrangement) in the beam path of an individually controllable element 102. For example, the individually controllable element(s) 102 move in the X-Y plane and so the individually controllable element(s) 102 can be located to provide radiation to the beam redirecting structure. In an embodiment, the sensor 118 may be provided on the frame 160 and receives radiation from an individually controllable element 102 from the back side of the individually controllable element 102, i.e., the side opposite from which the exposure radiation is provided. Similarly, the individually controllable element(s) 102 move in the X-Y plane and so the individually controllable element(s) 102 can be located to provide radiation to the sensor 118. In an embodiment, the sensor 118 on the frame 160 is in a fixed position or else may be movable by virtue of, e.g., an associated actuator. The sensor 118 on the frame 160 may be used to provide "on-the-fly" sensing in addition to or alternatively to pre- and/or post-exposure sensing. In an embodiment, a sensor 118 is movable by an actuator and may be located under the path of where the substrate table would move (as shown in FIG. 3), located at the side of the path or located above the substrate table 106. In an embodiment, the sensor 118 may be moved by the actuator to the position where the sensor 118 of substrate table 106 is shown in FIG. 3 if the substrate table 106 were not there, such movement may be in the X-, Y- and/or Z-directions. Sensor 118 may be attached to frame 160 and displaceable with respect to frame 160 using the actuator.

In operation to measure a characteristic of the radiation that is or to be transmitted toward the substrate by one or more individually controllable elements 102, the sensor 118 is located in a path of radiation from an individually controllable element 102, by moving the sensor 118 and/or moving the radiation beam of the individually controllable element 102. So, as an example, the substrate table 106 may be moved to position sensor 118 in a path of radiation from an individually controllable element 102. In this case, the sensor 118 is positioned into a path of an individually controllable element 102 at the exposure region 234. In an embodiment, the sensor 118 may be positioned into a path of an individually controllable element 102 outside of the exposure region 234. Once located in the path of radiation, the sensor 118 can detect the radiation and measure a characteristic of the radiation. To facilitate sensing, the sensor 118 may move with respect to the individually controllable element 102 and/or the individually controllable element 102 (and/or the beam) may be moved with respect to the sensor 118.

As a further example, an individually controllable element 102 may be moved to a position so that radiation from the individually controllable element 102 impinges on a beam redirecting structure. The beam redirecting structure directs the beam to a sensor 118 on the frame 160. To facilitate sensing, the sensor 118 may move with respect to the individually controllable element 102 and/or the individually controllable element 102 (and/or beam) may be moved with respect to the sensor 118.

In an embodiment, the sensor 118 may be fixed or moving. If fixed, an individually controllable element 102 and/or beam is desirably movable with respect to the fixed sensor 118 to facilitate sensing. For example, an individually controllable element 102 may be moved (e.g., rotated or translated) with respect to the sensor 118 (e.g., a sensor 118 on the frame 160) to facilitate sensing by the sensor 118. If the sensor 118 is movable (e.g., the sensor 118 on the substrate table 106), an individually controllable element 102 and/or the beam may be kept still for the sensing, or else moved to, for example, speed up sensing.

The sensor 118 may be used to calibrate the patterning device 104, such as the deflector 112 and/or one or more of the individually controllable elements 102. For example, the location of the spot from the patterning device can be detected by the sensor 118 prior to exposure and the system accordingly calibrated. The exposure can then be regulated based on this expected location of the spot (e.g., the position of the substrate 114 is controlled, the position of the individually controllable element 102 and/or beam is controlled, the turning OFF or ON of an individually controllable element 102 is controlled, etc.). Further, calibrations may take place subsequently. For example, a calibration may take place immediately after exposure before a further exposure using, for example, a sensor 118 on the trailing edge of the substrate table 106. Calibration may take place before each exposure, after a certain number of exposures, etc. Further, the location of a spot may be detected "on-the-fly" using a sensor 118 and the exposure is accordingly regulated. The patterning device 104, such as the deflector 112 and/or the individually controllable element 102, may perhaps be recalibrated based on the "on-the-fly" sensing.

In an embodiment, a position sensor may be provided to determine the position of one or more of the individually controllable elements 102, the deflector 112, a lens, etc. in up to 6 degrees of freedom. In an embodiment, the sensor may comprise an interferometer. In an embodiment, the sensor may comprise an encoder which may be used to detect one or more single dimension encoder gratings and/or one or more two dimensional encoder gratings.

In an embodiment, a sensor may be provided to determine a characteristic of the radiation that has been transmitted to the substrate. In this embodiment, a sensor captures radiation redirected by the substrate. In an example use, the redirected radiation captured by sensor may be used to facilitate determining the location of the spot of radiation from an individually controllable element 102 (e.g., misalignment of the spot of radiation from an individually controllable element 102). In particular, the sensor may capture radiation redirected from a just exposed portion of the substrate, i.e., a latent image. A measurement of the intensity of this tail redirected radiation may give an indication of whether the spot was properly aligned. For example, the repeated measurement of this tail may give a repetitive signal, a deviation from which would indicate a misalignment of the spot (e.g., an out of phase signal can indicate misalignment). For example, three detection regions may be provided whose results may be compared and/or combined to facilitate recognition of the misalignment. Only one detection region need be used.

In an embodiment, one or more of the individually addressable elements 102 are movable. For example, the one or more of the individually addressable elements 102 may be movable in X-, Y-, and/or Z-directions. In addition or alternatively, the one or more of the individually addressable elements 102 may be rotatable about the X-, Y- and/or Z-directions (i.e., $R_x$, $R_y$ and/or $R_z$ motion).

In an embodiment, the one or more of the individually addressable elements 102 may be movable between an exposure region wherein the one or more individually addressable elements are used to project all or part of the beam 110, and a location outside of the exposure region wherein the one or more individually addressable elements do not project any of the beam 110. In an embodiment, the one or more individually addressable elements 102 are radiation emitting devices that are turned ON or at least partly ON, i.e., they emit radiation, in the exposure region 234 (the shaded region in FIGS. 30(A)-(C)) and are turned OFF, i.e., they do not emit radiation, when located outside of the exposure region 234.

In an embodiment, the one or more individually addressable elements 102 are radiation emitting devices that may be turned ON in the exposure region 234 and outside of the exposure region 234. In such a circumstance, one or more individually addressable elements 102 may be turned on outside of the exposure region 234 to provide a compensating exposure if, for example, the radiation was not properly projected in the exposure region 234 by one or more individually addressable elements 102.

In an embodiment, the exposure region 234 is an elongate line. In an embodiment, the exposure region 234 is a single dimensional array of one or more individually addressable elements 102. In an embodiment, the exposure region 234 is a two dimensional array of one or more individually addressable elements 102. In an embodiment, the exposure region 234 is elongate.

In an embodiment, each of the movable individually addressable elements 102 may be movable separately and not necessarily together as a unit.

In an embodiment, the one or more individually addressable elements 102 are movable, and in use move, in a direction transverse to a direction of propagation of the beam 110 at least during projection of the beam 110. For example, in an embodiment, the one or more individually addressable elements 102 are radiation emitting devices that move in a direction substantially perpendicular to a direction of propagation of the beam 110 during projection of the beam 110.

Figure 34:
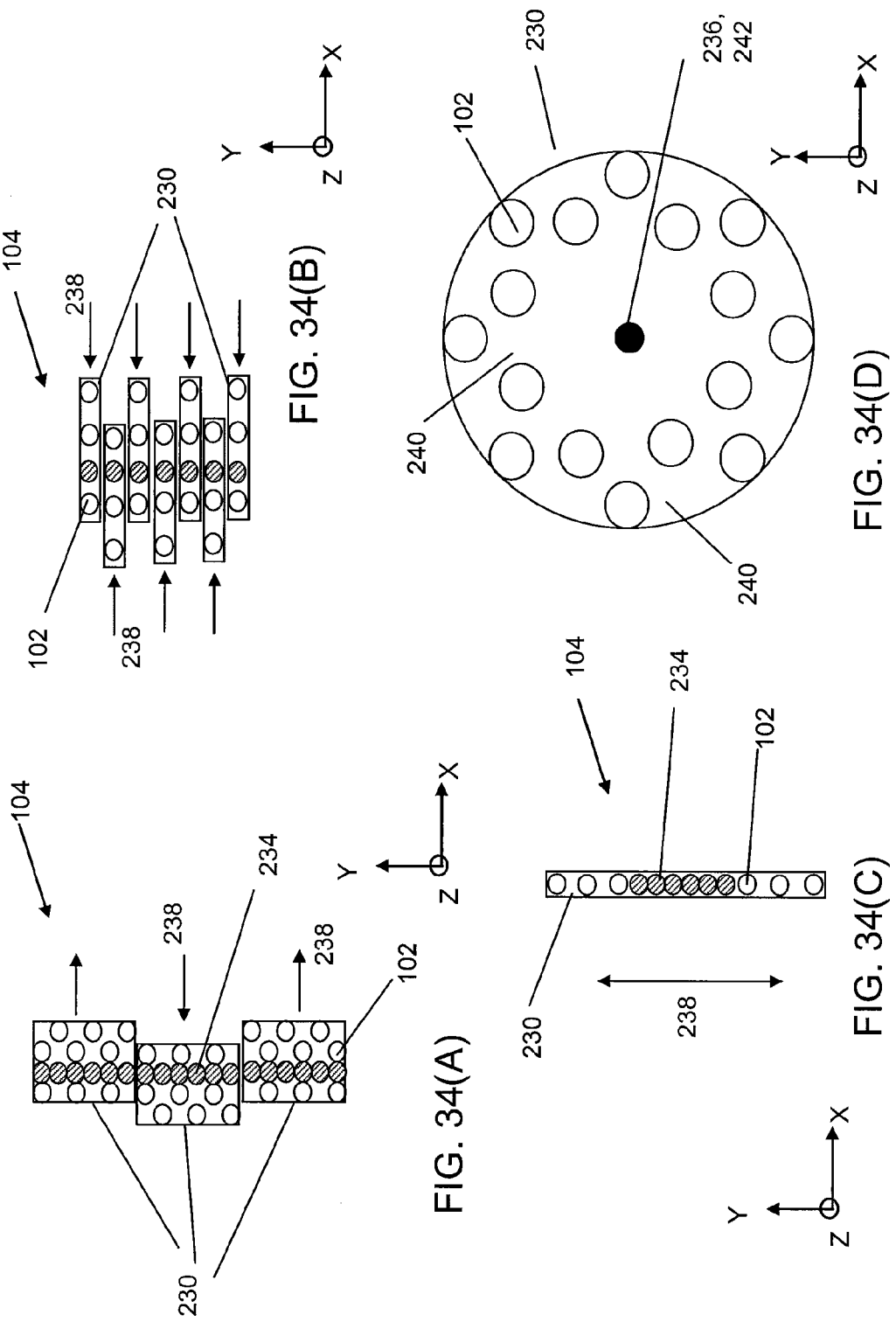
FIGS. 34(A)-(D) depict schematic top views and a side view of a part of a lithographic apparatus according to an embodiment of the present invention.

In an embodiment, one or more arrays 230 of individually addressable elements 102 are laterally displaceable and/or rotatable plate(s) having a plurality of spatially separated individually addressable elements 102 arranged along the plate(s) as shown in FIG. 34. For example, in use, each plate translates along direction 238. In use, the motion of the individually addressable elements 102 are appropriately timed to be located in the exposure region 234 (shown as the shaded region in FIGS. 30(A)-(C)) so as to project all or part of the beam 110. For example, in an embodiment, the one or more individually addressable elements 102 are radiation emitting devices and the turning ON or OFF of the individually addressable elements 102 is timed so that one or more individually addressable elements 102 are turned ON when they are in exposure region 234. For example, in FIG. 34(A), a plurality of two-dimensional arrays of radiation emitting diodes 230 are translated in direction 238—two arrays in positive direction 238 and an intermediate one between the two arrays in negative direction 238. The turning ON or OFF of the radiation emitting diodes 102 is timed so that certain radiation emitting diodes 102 of each array 230 are turned ON when they are in exposure region 234. Of course, the arrays 230 can travel in the opposite direction, i.e., the two arrays in negative direction 238 and the intermediate one between the two arrays in positive direction 238, when, for example, the arrays 230 reach the end of their travel. In a further example, in FIG. 34(B), a plurality of interleaved single dimensional arrays of radiation emitting diodes 230 are translated in direction 238—alternating in positive direction 238 and negative direction 238. The turning ON or OFF of the radiation emitting diodes 102 is timed so that certain radiation emitting diodes 102 of each array 230 are turned ON when they are in exposure region 234. Of course, the arrays 230 can travel in the opposite direction. In a further example, in FIG. 34(C), a single array of radiation emitting diodes 230 (shown as one-dimensional but it doesn't need to be) is translated in direction 238. The turning ON or OFF of the radiation emitting diodes 102 is timed so that certain radiation emitting diodes 102 of each array 230 are turned ON when they are in exposure region 234.

In an embodiment, each of the arrays 230 is a rotatable plate having a plurality of spatially separated individually addressable elements 102 arranged around the plate. In use, each plate rotates about its own axis 236. The array 230 may alternately rotate in clockwise and anti-clockwise directions. Alternatively, each of the arrays 230 may rotate in a clockwise direction or rotate in an anti-clockwise direction. In an embodiment, the array 230 rotates completely around. In an embodiment, the array 230 rotates an arc less than completely around. In an embodiment, the array 230 may rotate about an axis extending in the X- or Y-direction if, for example, the substrate scans in the Z-direction.

In an embodiment, the rotatable plate may have configuration as shown in FIG. 34(D). For example, in FIG. 34(D), a schematic top view of a rotatable plate is shown. The rotatable plate may have an array 230 having one or more subarrays 240 of individually addressable elements 102 arranged around the plate (in FIG. 34(D), multiple subarrays 240 are shown but may have just a single array 230, 240). In FIG. 34(D), the subarrays 240 are shown as staggered with respect to each other such that an individually addressable element 102 of one subarray 240 is between two individually addressable elements 102 of an other subarray 240. However, the individually addressable elements 102 of the subarrays 240 may be aligned with each other. The individually addressable elements 102 may be rotated, individually or together, by a motor 242 about an axis 236, in this example, running in the Z-direction in FIG. 34(D) through motor 242. The motor 242 may be attached to the rotatable plate and connected to a frame, e.g. frame 160, or attached to a frame, e.g., frame 160, and connected to the rotatable plate. In an embodiment, motor 242 (or, for example, some motor located elsewhere) may cause other movement of the individually addressable elements 102, whether individually or together. For example, motor 242 may cause translation of one or more of the individually addressable elements 102 in the X-, Y-, and/or Z-directions. In addition or alternatively, the motor 242 may cause rotation of one or more of the individually addressable elements 102 about the X- and/or Y-directions (i.e., $R_x$ and/or $R_y$ motion).

In use, the motion of the individually addressable elements 102 are appropriately timed to be located in the exposure region 234 so as to project all or part of the beam 110. For example, in an embodiment, the one or more individually addressable elements 102 are radiation emitting devices and the turning ON or OFF of the individually addressable elements 102 is timed so that one or more individually addressable elements 102 are turned ON when they are in exposure region 234 and turned OFF when they are outside of region 234. So, in an embodiment, the radiating emitting devices 102 could be all kept on during motion and then certain ones of the radiation emitting devices 102 are modulated off in the exposure region 234. An appropriate shield between the radiation emitting devices 102 and the substrate and outside of the exposure region 234 may be required to shield the exposure region 234 from turned on radiation emitting devices 102 outside of the exposure region 234. Having the radiation emitting devices 102 consistently on can facilitate having the radiation emitting devices 102 at a substantially uniform temperature during use. In an embodiment, the radiation emitting devices 102 could kept off most of the time and one or more of the radiation emitting devices 102 turned on when in the exposure region 234.

In an embodiment, more movable individually addressable elements than theoretically needed (e.g. on a rotatable plate) may be provided. A possible advantage of this arrangement is that if one or more movable individually addressable elements break or fail to operate, one or more other of the movable individually addressable elements can be used instead. In addition or alternatively, extra movable individually addressable elements may have an advantage for controlling thermal load on the individually addressable elements as the more movable individually addressable elements there are, the more opportunity there is for movable individually addressable elements outside of the exposure region 234 to cool off.

In an embodiment, one or more individually addressable elements may comprise a temperature control arrangement. For example, an array 230 may have a fluid (e.g., liquid) conducting channel to transport cooling fluid on, near or through array 230 to cool the array. The channel may be connected to an appropriate heat exchanger and pump to circulate fluid through the channel. A sensor may be provided in, on or near the array, to measure a parameter of the array 230, which measurement may be used to control, e.g., the temperature of the fluid flow provided by the heat exchanger and pump. In an embodiment, sensor may measure the expansion and/or contraction of the array 230 body, which measurement may be used to control the temperature of the fluid flow provided by the heat exchanger and pump. Such expansion and/or contraction may be a proxy for temperature. In an embodiment, the sensor may be integrated with the array 230 and/or may be separate from the array 230. The sensor separate from the array 230 may be an optical sensor.

In an embodiment, an array 230 may have one or more fins to increase the surface area for heat dissipation. The fin(s) may be, for example, on a top surface of the array 230 and/or on a side surface of the array 230. Optionally, one or more further fins may be provided to cooperate with the fin(s) on the array 230 to facilitate heat dissipation. For example, the further fin(s) is able to absorb heat from the fin(s) on the array 230 and may comprise a fluid (e.g., liquid) conducting channel and an associated heat exchanger/pump.

In an embodiment, an array 230 may be located at or near a fluid confinement structure configured to maintain a fluid in contact with the array 230 body to facilitate heat dissipation via the fluid. In an embodiment, the fluid 238 may be a liquid, e.g., water. In an embodiment, the fluid confinement structure provides a seal between it and the array 230 body. In an embodiment, the seal may be a contactless seal provided through, for example, a flow of gas or capillary force. In an embodiment, the fluid is circulated, akin to as discussed with respect to the fluid conducting channel, to promote heat dissipation. The fluid may be supplied by a fluid supply device. In an embodiment, an array 230 may be located at or near a fluid supply device configured to project a fluid toward the array 230 body to facilitate heat dissipation via the fluid. In an embodiment, the fluid is a gas, e.g., clean dry air, $N_2$, an inert gas, etc.

In an embodiment, the array 230 body is a substantially solid structure with, for example, a cavity for the fluid conducting channel. In an embodiment, the array 230 body is a substantially frame like structure that is mostly open and to which are attached the various components, e.g., the individually addressable elements 102, the fluid conducting channel, etc. This open like structure facilitates gas flow and/or increases the surface area. In an embodiment, the array 230 body is a substantially solid structure with a plurality of cavities into or through the body to facilitate gas flow and/or increase the surface area.

While embodiments have been described above to provide cooling, the embodiments alternatively or in addition may provide heating.

In an embodiment, the array 230 is desirably kept at a substantially constant steady state temperature during exposure use. So, for example, all or many of the individually addressable elements 102 of array 230 may be powered on, before exposure, to reach at or near a desired steady state temperature and during exposure, any one or more temperature control arrangements may be used to cool and/or heat the array 230 to maintain the steady state temperature. In an embodiment, any one or more temperature control arrangements may be used to heat the array 230 prior to exposure to reach at or near a desired steady state temperature. Then, during exposure, any one or more temperature control arrangements may be used to cool and/or heat the array 230 to maintain the steady state temperature. A measurement from the sensor described above can be used in a feedforward and/or feedback manner to maintain the steady state temperature. In an embodiment, each of a plurality of arrays 230 may have the same steady state temperature or one or more arrays 230 of a plurality of arrays 230 may have a different steady state temperature than one or more other arrays 230 of a plurality of arrays 230. In an embodiment, the array 230 is heated to a temperature higher than the desired steady state temperature and then falls during exposure because of cooling applied by any one or more temperature control arrangements and/or because the usage of the individually addressable elements 102 isn't sufficient to maintain the temperature higher than the desired steady state temperature.

In an embodiment, the foregoing description of movement, temperature control, etc. of one or more individually addressable elements 102 may be applied to other elements such one or more selected from: lens(es) 122, deflector(s) 112, lens(es) 124, lens(es) 140 and/or lens(es) 170. Further, one or more of the various elements may be movable with respect to one or more of the other elements and/or movable with respect one or more of the same element. For example, the lens(es) 140 and/or lens(es) 170 may be movable with respect to the one or more individually addressable elements 102 and, for example, one or more of lenses 140 and/or lenses 170 may be movable with respect to the one or more of other lenses 140 and/or lenses 170.

In an embodiment, a lens array as described herein is associated or integrated with the individually addressable element(s). For example, an array of lenses 122 may be attached to each of the arrays 230 and thus may be movable (e.g., rotatable) with the individually addressable elements 102. The lens array may be displaceable with respect to the individually addressable elements 102 (e.g., in the Z-direction). In an embodiment, a plurality of lens arrays may be provided for an array 230, each lens array plate being associated with different subset of the plurality of individually addressable elements 102.

In an embodiment, a single separate lens 122 may be attached in front of each individually addressable element 102 and be movable with the individually addressable element 102 (e.g., rotatable). Further, the lens 122 may be displaceable with respect to the individually addressable element 102 (e.g., in the Z-direction) through the use of an actuator. In an embodiment, the individually addressable element 102 and the lens 122 may be displaced together relative to a body of the array 230 by an actuator. In an embodiment, the actuator is configured to only displace lens 122 (i.e., with respect to individually addressable element 102 or together with individually addressable element 102) in the Z-direction. In an embodiment, the actuator is configured to displace lens 122 in up to 3 degrees of freedom (the Z-direction, rotation about the X-direction, and/or rotation about the Y-direction). In an embodiment, the actuator is configured to displace lens 122 in up to 6 degrees of freedom. Where the lens 122 is movable with respect to its individually addressable element 102, the lens 122 may be moved by the actuator to change the position of the focus of the lens 122 with respect to the substrate. Where the lens 122 is movable with its individually addressable element 102, the focus position of the lens 122 is substantially constant but displaced with respect to the substrate. In an embodiment, the movement of lens 122 is individually controlled for each lens 122 associated with each individually addressable element 102 of the array 230. In an embodiment, a subset of a plurality of lenses 122 are movable together with respect to, or together with, their associated subset of the plurality of individually addressable elements 102. In this latter situation, fineness of focus control may be expensed for lower data overhead and/or faster response. In an embodiment, the size of the spot of radiation provided by an individually addressable element 102 may be adjusted by defocus, i.e., the more defocused, the larger the spot size.

In an embodiment, the individually addressable element 102 may be a radiation emitting device e.g., a laser diode. Such radiation emitting device may have high spatial coherence and accordingly may present a speckle problem. To avoid such a speckle problem, the radiation emitted by the radiation emitting device should be scrambled by shifting the phase of a beam portion with respect to another beam portion. In an embodiment, a plate may be located on, for example, frame 160 and there may be relative movement between the individually addressable elements 102 and the plate 250. The plate causes disruption of the spatial coherence of the radiation emitted by the individually addressable elements 102 toward the substrate. In an embodiment, the plate is located between a lens 122 and its associated individually addressable element 102. In an embodiment, the plate may be located between the lens 122 and the substrate.

In an embodiment, a spatial coherence disrupting device may be located between the substrate and at least the individually addressable elements 102. In an embodiment, the spatial coherence disrupting device is located or locatable in a beam path between the individually addressable elements 102 and the substrate. In an embodiment, the spatial coherence disrupting device is a phase modulator, a vibrating plate, or a rotating plate. As an individually addressable element 102 projects radiation toward the substrate, the spatial coherence disrupting device causes disruption of the spatial coherence of the radiation emitted by the individually addressable element 102.

In an embodiment, the lens 122 array (whether together as unit or as individual lenses) is attached to an array 230, desirably via high thermal conductivity material, to facilitate conduction of heat from the lens array to the array 230, where cooling may be more advantageously provided.

In an embodiment, one or more focus or level sensors may be provided. For example, a sensor may be configured to measure focus for each individually addressable element 102 or for a plurality of individually addressable elements 102. Accordingly, if an out of focus condition is detected, the focus may be corrected for each individually addressable element 102 or for a plurality of individually addressable elements 102. Focus may be corrected by, for example, moving lens 122 in a Z-direction (and/or about the X-axis and/or about the Y-axis).

In an embodiment, the sensor is integral with an individually addressable element 102 (or may be integral with a plurality of individually addressable elements 102). For example, a focus detection beam may be redirected (e.g., reflected) off the substrate surface, pass through the lens 122 and is directed toward a detector by a half-silvered mirror between the lens 122 and the individually addressable element 102. In an embodiment, the focus detection beam may be radiation used for exposure that happens to be redirected from the substrate. In an embodiment, the focus detection beam may be a dedicated beam directed at the substrate and which, upon redirected by the substrate, becomes the beam. A knife edge (which may be an aperture) may be provided in the path of the beam before the beam impinges on the detector. In this example, the detector comprises at least two radiation-sensitive parts (e.g., areas or detectors). When the substrate is in focus, a sharp image is formed at the edge and so the radiation-sensitive parts of the detector receive equal amounts of radiation. When the substrate is out of focus, the beam shifts and the image would form in front of or behind the edge. Thus, the edge would intercept certain parts of the beam and one radiation-sensitive part of the detector would receive a smaller amount of radiation than an other radiation-sensitive part of the detector. A comparison of the output signals from the radiation-sensitive parts of the detector enables the amount by which, and the direction in which, the plane of the substrate from which the beam redirected differs from a desired position. The signals may be electronically processed to give a control signal by which, for example, lens 122 may be adjusted. The mirror, edge and detector may be mounted to the array 230. In an embodiment, the detector may be a quad cell.

In an embodiment, there are no optics between the patterning device 104 and the substrate 114 other than a lens array 170. Thus, the lithographic apparatus 100 comprises a patterning device 104 and a projection system 108. In this case, the projection system 108 only comprises an array of lenses 170 arranged to receive the modulated radiation beam 110. Different portions of the modulated radiation beam 110, corresponding to one or more of the individually controllable elements in the patterning device 104, pass through respective different lenses in the array of lenses 170. Each lens focuses the respective portion of the modulated radiation beam 110 to a point that lies on the substrate 114. In this way an array of radiation spots S (see FIG. 32) is exposed onto the substrate 114. A free working distance is provided between the substrate 114 and the lens array 170. This distance allows the substrate 114 and/or the lens array 170 to be moved to allow, for example, focus correction. In an embodiment, the lens array 170 can provide a NA of 0.15.

Figure 35:
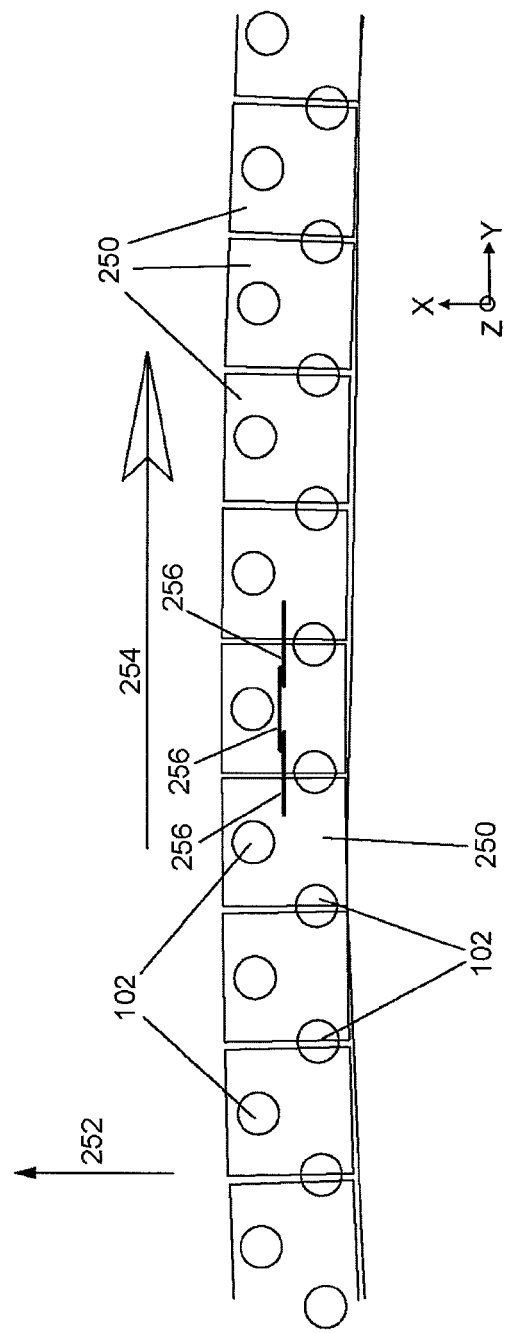
FIG. 35 depicts a schematic top view layout of a portion of a lithographic apparatus having individually controllable elements substantially stationary in the X-Y plane and an optical element movable with respect thereto according to an embodiment of the invention.

FIG. 35 depicts a schematic top view layout of portion of a lithographic apparatus having a plurality of individually controllable elements 102 (e.g., laser diodes) that are substantially stationary in the X-Y plane and an optical element 250 (e.g., lens 124 and/or lens 170) movable with respect thereto according to an embodiment of the invention. In this embodiment, the plurality of individually controllable elements 102 are attached to a frame and are substantially stationary in the X-Y plane, a plurality of optical elements 250 move substantially in the X-Y plane (as shown in FIG. 35 by the indication of the arrow 254, e.g., rotation direction 254) with respect to those individually controllable elements 102, and the substrate moves in the direction 252. In an embodiment, the optical elements 250 move with respect to the individually controllable elements 102 by rotating about an axis. In an embodiment, the optical elements 250 are mounted on a structure that rotates about the axis (e.g., in the direction shown in FIG. 35) and arranged in a circular manner (e.g., as partially shown in FIG. 35).

Each of the individually controllable elements 102 provides a beam to a moving optical element 250 via, for example, deflector 112. In an embodiment, the individually controllable elements 102 are associated with one or more collimating lenses to provide a collimated beam to the optical element 250. In an embodiment, the collimating lens(es) is substantially stationary in the X-Y plane and attached to the frame to which the individually controllable elements 102 are attached.

In this embodiment, the cross-sectional width of the collimated beams are smaller than the cross-sectional width of the optical elements 250. So, for example, as soon as a collimated beam would fall completely within the optically transmissive portion of an optical element 250, the individually controllable element 102 (e.g., the diode laser) can be switched on. The individually controllable element 102 (e.g., the diode laser) may be switched off when the beam falls outside of the optically transmissive portion of the optical element 250. In an embodiment, the beam from an individually controllable element 102 passes through a single optical element 250 at any one time. The resulting traversal of the optical element 250 with respect to the beam from an individually controllable element 102 yields an associated imaged line 256 on the substrate from each individually controllable element 102 that is turned on. In FIG. 35, three imaged lines 256 are shown relative to each of three example individually controllable elements 102 in FIG. 35, although as will be apparent the other individually controllable elements 102 in FIG. 35 can produce an associated imaged line 256 on the substrate.

In the FIG. 35 layout, the optical element 250 pitch may be 1.5 mm and the cross-sectional width (e.g., diameter) of the beam from each of the individually controllable elements 102 is a little smaller than 0.5 mm. With this configuration, it is possible to write, with each individually controllable element 102, a line of about 1 mm in length. So, in this arrangement of beam diameter of 0.5 mm and an optical element 250 diameter of 1.5 mm, the duty cycle can be as high as 67%. With an appropriate positioning of individually controllable elements 102 with respect to the optical element 250, a full coverage across the width of the substrate is possible. So, for example, if only standard 5.6 mm diameter laser diodes are used, several rows, as shown in FIG. 35, of laser diodes can be used to get a full coverage across the width of the substrate. So, in this embodiment, it may be possible to use fewer individually controllable elements 102 (e.g., laser diodes) than with using merely a fixed array of individually controllable elements 102 or perhaps with the moving individually controllable elements 102 described herein.

In an embodiment, each of the optical elements 250 should be identical because each individually controllable element 102 may be imaged by all the moving optical elements 250. In this embodiment, all the optical elements 250 are without the need to image a field although a higher NA lens is needed, for example, greater than 0.3, greater than 0.18, or greater than 0.15. With this single element optics, diffraction limited imaging is possible.

Figure 36:
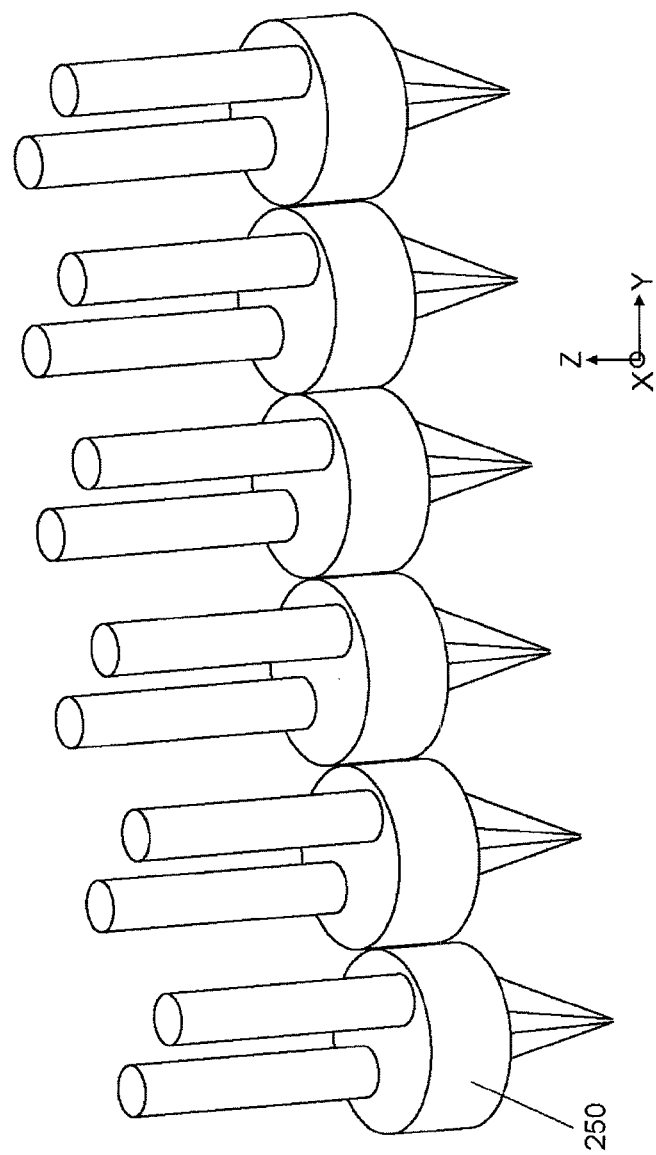
FIG. 36 depicts a schematic three-dimensional drawing of a portion of the lithographic apparatus of FIG. 35.

The focal point of the beam on the substrate is fixed to the optical axis of the optical element 250 independent of where the beam enters the optical element (see, e.g., FIG. 36 which depicts a schematic three-dimensional drawing of a portion of the lithographic apparatus of FIG. 35). A disadvantage of this arrangement is that the beam from the optical element 250 towards the substrate is not telecentric and as a consequence, a focus error could occur possibly leading overlay error.

In this embodiment, adjusting the focus by using an element that is not moving in the X-Y plane (e.g., at the individually controllable element 102) will likely cause vignetting. Accordingly, desired adjustment of focus should occur in the moving optical element 250. This accordingly may require an actuator of higher frequency than the moving optical element 250.

Figure 37:
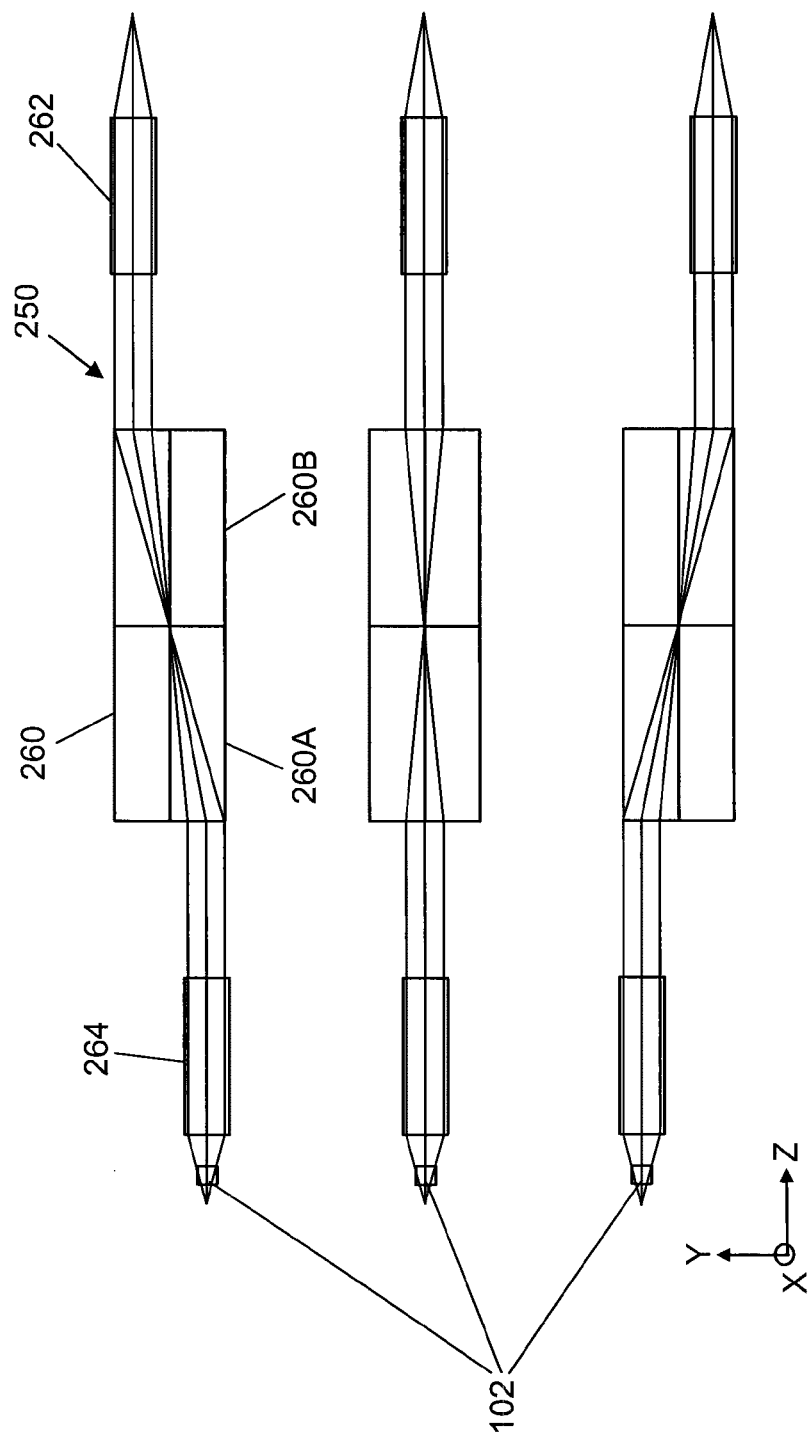
FIG. 37 depicts a schematic side view layout of a portion of a lithographic apparatus having individually controllable elements substantially stationary in the X-Y plane and an optical element movable with respect thereto according to an embodiment of the invention and showing three different rotation positions of an optical element 250 set with respect to an individually controllable element.

FIG. 37 depicts a schematic side view layout of a portion of a lithographic apparatus having individually controllable elements substantially stationary in the X-Y plane and an optical element movable with respect thereto according to an embodiment of the invention and showing three different rotation positions of an optical element 250 set with respect to an individually controllable element. In this embodiment, the lithographic apparatus of FIGS. 31 and 32 is extended by having the optical element 250 comprise two lenses 260, 262 to receive the collimated beam from an individually controllable element 102. Like in FIG. 35, the optical element 250 moves relative to an individually controllable element 102 in the X-Y plane (e.g., rotates about an axis where the optical elements 250 are arranged at least partially in a circular manner). In this embodiment, the beam from an individually controllable element 102 is collimated by lens 264 before reaching optical element 250, although in an embodiment such a lens need not be provided. The lens 264 is substantially stationary in the X-Y plane. The substrate moves in the X-direction.

The two lenses 260, 262 are arranged in the optical path of the collimated beam from an individually controllable element 102 to the substrate, to make the beam towards the substrate telecentric. The lens 260, between the individually controllable element 102 and the lens 262, comprises two lenses 260A, 260B with substantially equal focal length. The collimated beam from the individually controllable element 102 is focused between the two lenses 260A, 260B such that lens 260B will collimate the beam towards the imaging lens 262. The imaging lens 262 images the beam onto the substrate.

In this embodiment, the lens 260 moves at a certain speed in the X-Y plane (e.g., certain revolutions per minute (RPM)) with respect to an individually controllable element 102. Thus, in this embodiment, the outgoing collimated beam from the lens 260 would have twice the speed in the X-Y plane as the moving imaging lens 262 if it were moving at the same speed as the lens 260. So, in this embodiment, the imaging lens 264 moves at a speed, different than that of lens 260, with respect to an individually controllable element 102. In particular, the imaging lens 262 is moved in the X-Y plane at twice the speed as the lens 260 (e.g., twice the RPM of the lens 260) so that the beams will be focused telecentrically on the substrate. This aligning of the outgoing collimated beam from the lens 260 to the imaging lens 262 is schematically shown in three example positions in FIG. 37. Further, since the actual projection on the substrate will be done at twice the speed compared to the example of FIG. 35, the power of the individually controllable elements 102 should be doubled.

In this embodiment, adjusting the focus by using an element that is not moving in the X-Y plane (e.g., at the individually controllable element 102) will likely lead to loss of telecentricity and cause vignetting. Accordingly, desired adjustment of focus should occur in the moving optical element 250.

Further, in this embodiment, all the optical elements 250 are without the need to image a field. With this single element optics, diffraction limited imaging is possible. A duty cycle of about 65% is possible. In an embodiment, the lenses 264, 260A, 260B and 262 may comprise 2 aspherical and 2 spherical lenses.

Figure 38:
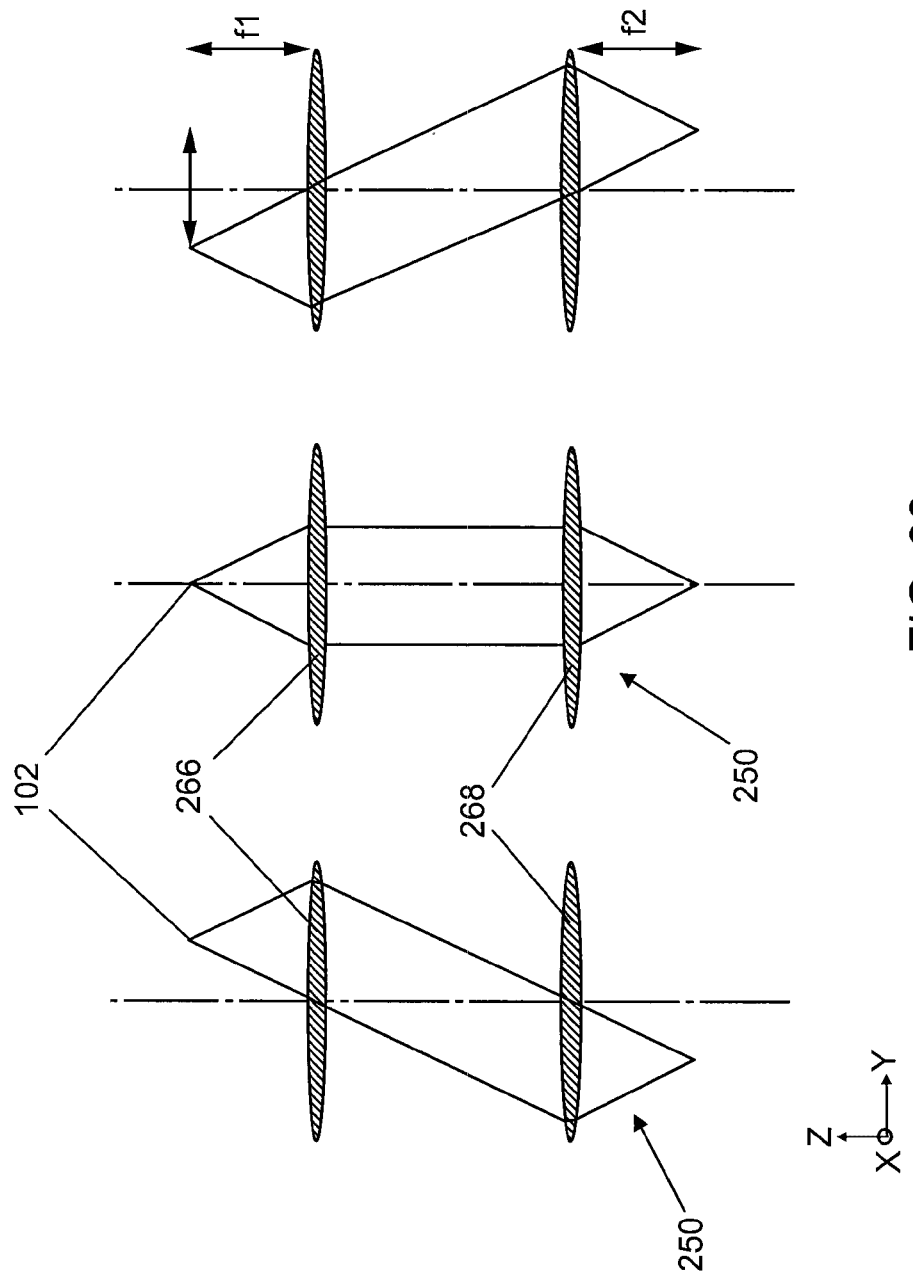
FIG. 38 depicts a schematic side view layout of a portion of a lithographic apparatus having individually controllable elements substantially stationary in the X-Y plane and an optical element movable with respect thereto according to an embodiment of the invention and showing three different rotation positions of an optical element 250 set with respect to an individually controllable element.

FIG. 38 depicts a schematic side view layout of a portion of a lithographic apparatus having individually controllable elements substantially stationary in the X-Y plane and an optical element movable with respect thereto according to an embodiment of the invention and showing three different rotation positions of an optical element 250 set with respect to an individually controllable element. In this embodiment, to avoid moving lenses at different speeds as described with respect to FIG. 37, a so called 4f telecentric in/telecentric out imaging system for moving optical element 250 could be used as shown in FIG. 38. The moving optical element 250 comprises two imaging lenses 266, 268 that are moved at substantially the same speed in the X-Y plane (e.g., rotated about an axis where the optical elements 250 are arranged at least partially in a circular manner) and receives a telecentric beam as an input and outputs to the substrate a telecentric imaging beam. In this arrangement with a magnification of 1, the image on the substrate moves twice as fast as the moving optical element 250. The substrate moves in the X-direction. In this arrangement, the optics would likely need to image a field with a relatively large NA, for example, greater than 0.3, greater than 0.18, or greater than 0.15. This arrangement may not be possible with two single element optics. Six or more elements with very accurate alignment tolerances may be needed to get a diffraction limited image. A duty cycle of about 65% is possible. In this embodiment, it is also relatively easy to focus locally with an element that does not move along or in conjunction with movable optical elements 250.

Figure 39:
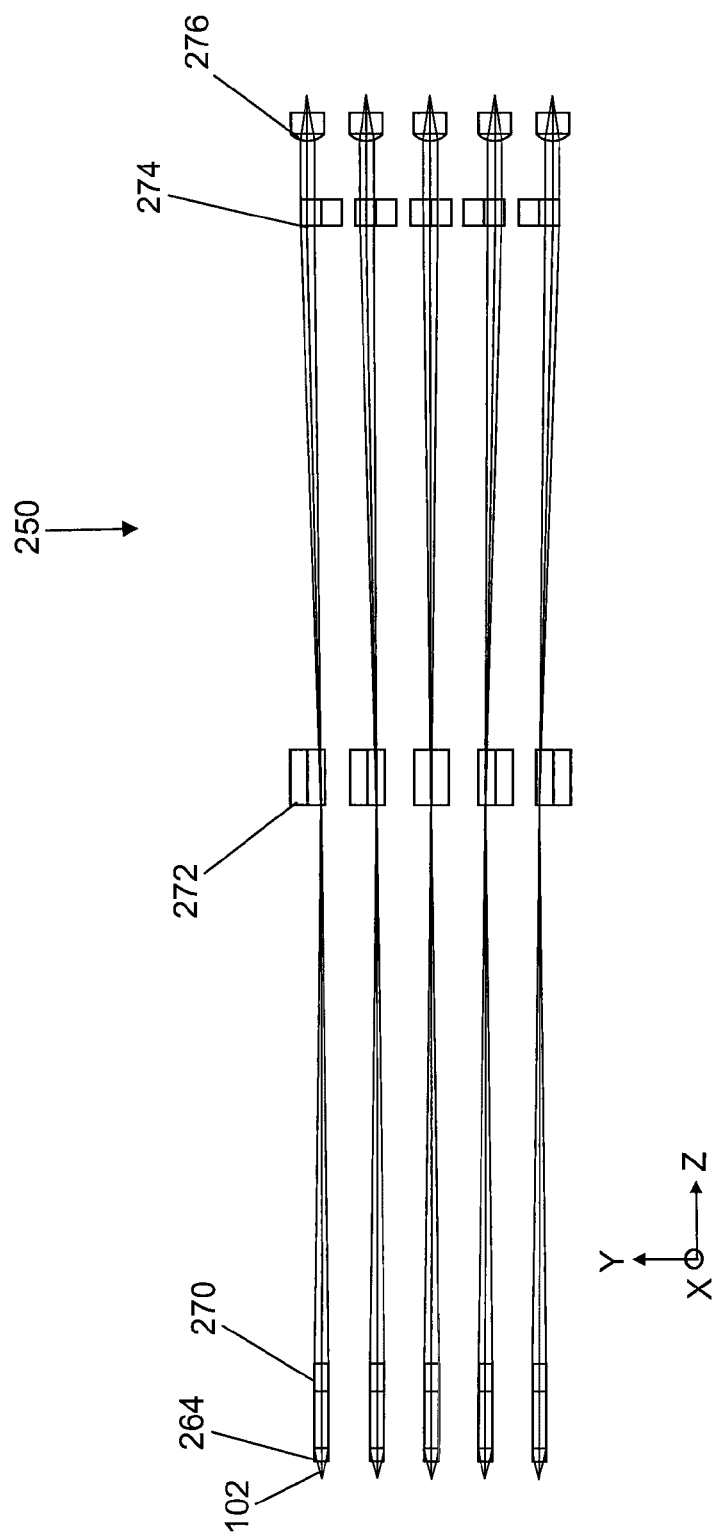
FIG. 39 depicts a schematic side view layout of a portion of a lithographic apparatus having individually controllable elements substantially stationary in the X-Y plane and an optical element movable with respect thereto according to an embodiment of the invention and showing five different rotation positions of an optical element 250 set with respect to an individually controllable element.

FIG. 39 depicts a schematic side view layout of a portion of a lithographic apparatus having individually controllable elements substantially stationary in the X-Y plane and an optical element movable with respect thereto according to an embodiment of the invention and showing five different rotation positions of an optical element 250 set with respect to an individually controllable element. In this embodiment, to avoid moving lenses at different speeds as described with respect to FIG. 37 and to have optics without imaging a field as noted with respect to FIG. 38, a combination of lenses that are substantially stationary in the X-Y plane are combined with the moving optical element 250. Referring to FIG. 39, an individually controllable element 102 is provided that is substantially stationary in the X-Y plane. An optional collimating lens 264 that is substantially stationary in the X-Y is provided to collimate the beam from the individually controllable element 102 and to provide the collimated beam (having, for example, a cross-sectional width (e.g., diameter) of 0.5 mm) to a lens 270.

Lens 270 is also substantially stationary in the X-Y plane and focuses the collimated beam to a field lens 272 (having, for example, a cross-sectional width (e.g., diameter) of 1.5 mm) of moving optical element 250. The lens 272 has a relatively large focal length (e.g., f=20 mm).

The field lens 272 of movable optical element 250 moves relative to the individually controllable elements 102 (e.g., rotates about an axis where the optical elements 250 are arranged at least partially in a circular manner). The field lens 272 directs the beam toward imaging lens 276 of the movable optical element 250. Like field lens 272, the imaging lens 276 moves relative to the individually controllable elements 102 (e.g., rotates about an axis where the optical elements 250 are arranged at least partially in a circular manner). In this embodiment, the field lens 272 moves at the substantially same speed as the imaging lens 276. A pair of field lens 272 and imaging lens 276 are aligned with respect to each other. The substrate moves in the X-direction.

Between field lens 272 and the imaging lens 276 is a lens 274. Lens 274 is substantially stationary in the X-Y plane and collimates the beam from field lens 272 to the imaging lens 276. The lens 274 has a relatively large focal length (e.g., f=20 mm).

In this embodiment, the optical axis of a field lens 272 should coincide with the optical axis of the corresponding imaging lens 274. The field lens 272 is designed such that the beam will be folded so that the chief ray of the beam that is collimated by the lens 274 coincides with the optical axis of the imaging lens 276. In this way the beam towards the substrate is telecentric.

Lenses 270 and 274 may be simple spherical lenses due to the large f-number. The field lens 272 should not affect the image quality and may also be a spherical element. In this embodiment, the collimating lens 806 and the imaging lens 276 are lenses without the need to image field. With this single element optics, diffraction limited imaging is possible. A duty cycle of about 65% is possible.

Figure 40:
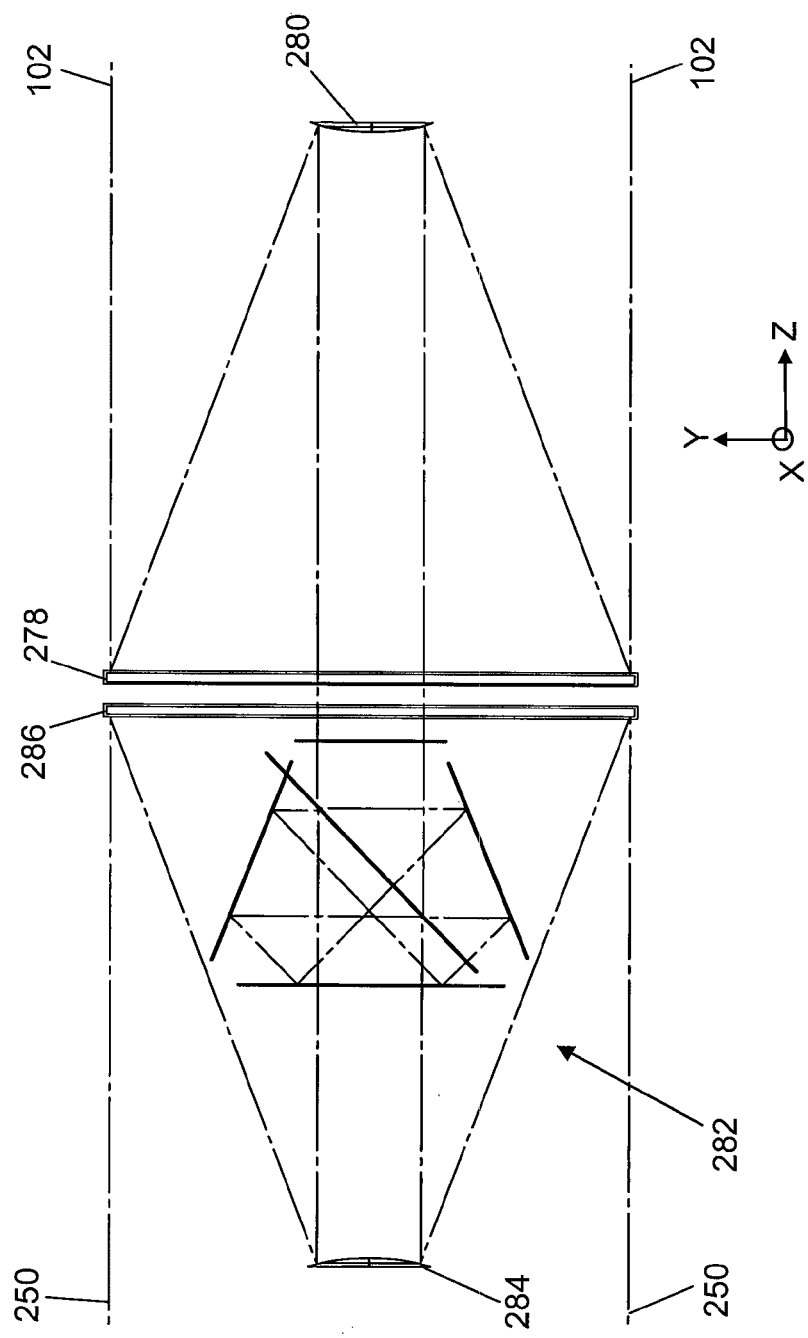
FIG. 40 depicts a schematic side view layout of a portion of a lithographic apparatus having individually controllable elements substantially stationary in the X-Y plane and an optical element movable with respect thereto according to an embodiment of the invention.

FIG. 40 depicts a schematic side view layout of a portion of a lithographic apparatus having individually controllable elements substantially stationary in the X-Y plane and an optical element movable with respect thereto according to an embodiment of the invention. In this embodiment, an optical derotator is used to couple the individually controllable elements 102 that are substantially stationary in the X-Y plane to moving optical elements 250.

In this embodiment, the individually controllable elements 102, along with optional collimating lenses, are arranged in a ring. Two parabola mirrors 278, 280 reduce the ring of collimated beams from the individually controllable elements 102 to an acceptable diameter for the derotator 282. In FIG. 40 a pechan prism is used as a derotator 282. If the derotator rotates at half the speed compared to the speed of the optical elements 250, each individually controllable element 102 appears substantially stationary with respect to its respective optical element 250. Two further parabola mirrors 284, 286 expand the ring of derotated beams from derotator 282 to an acceptable diameter for the moving optical elements 250. The substrate moves in the X-direction.

In this embodiment, each individually controllable element 102 is paired to an optical element 250. Therefore, it may not be possible to mount the individually controllable elements 102 on concentric rings and thus, full coverage across of the width of the substrate may not be obtained. A duty cycle of about 33% is possible. In this embodiment, the optical elements 250 are lenses without the need to image field.

Figure 41:
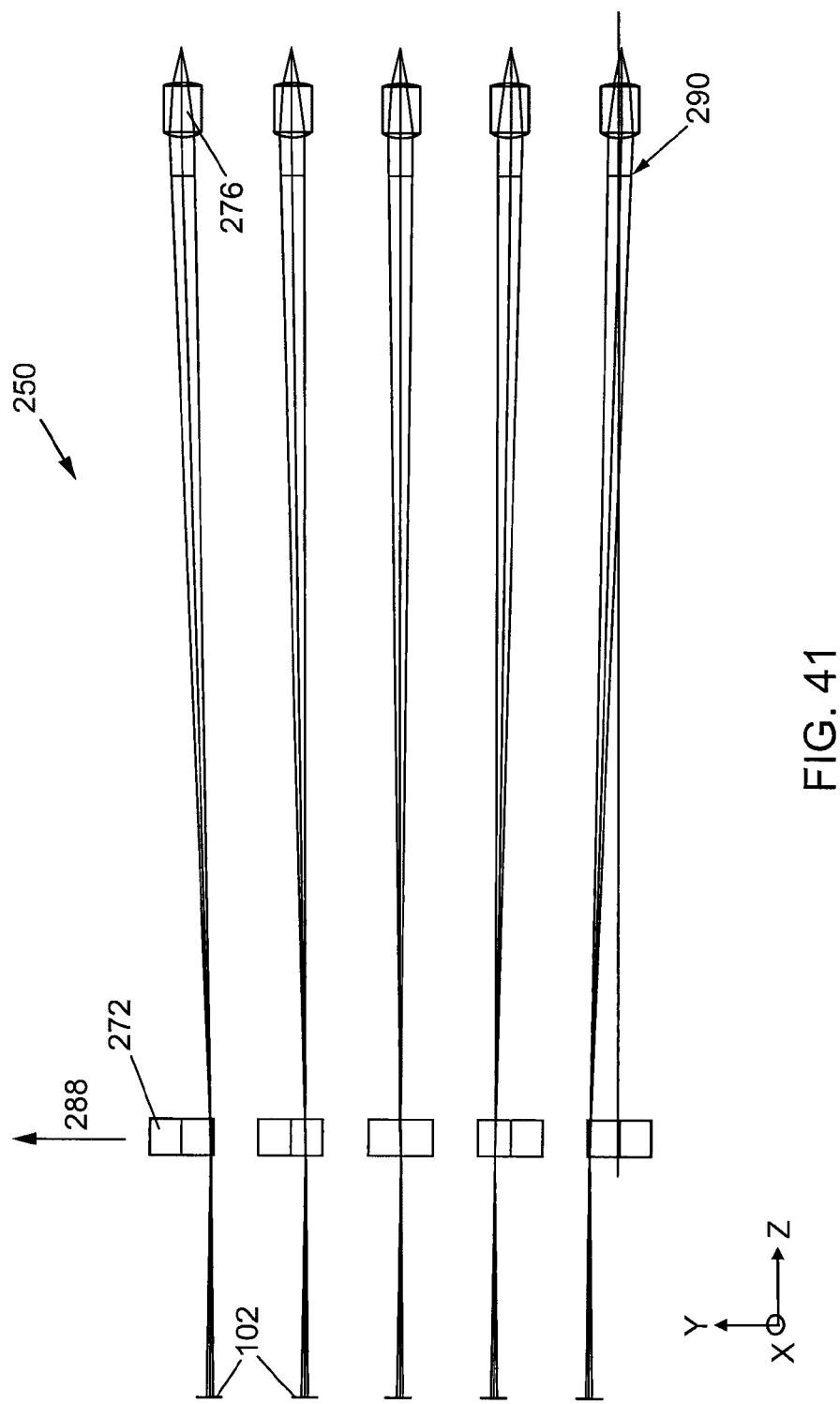
FIG. 41 depicts a schematic side view layout of a portion of a lithographic apparatus having individually controllable elements substantially stationary in the X-Y plane and an optical element movable with respect thereto according to an embodiment of the invention and showing five different rotation positions of an optical element 250 set with respect to an individually controllable element.

FIG. 41 depicts a schematic side view layout of a portion of a lithographic apparatus having individually controllable elements substantially stationary in the X-Y plane and an optical element movable with respect thereto according to an embodiment of the invention and showing five different rotation positions of an optical element 250 set with respect to an individually controllable element.

Referring to FIG. 41, an individually controllable element 102 is provided that is substantially stationary in the X-Y plane. The movable optical element 250 comprises a plurality of sets of lenses, each set of lenses comprising a field lens 272 and an imaging lens 276. The substrate moves in the X-direction.

The field lens 272 (e.g., a spherical lens) of movable optical element 250 moves relative to the individually controllable elements 102 in direction 288 (e.g., rotates about an axis where the optical elements 250 are arranged at least partially in a circular manner). The field lens 272 directs the beam toward imaging lens 276 (e.g., an aspherical lens such as a double aspherical surface lens) of the movable optical element 250. Like field lens 272, the imaging lens 276 moves relative to the individually controllable elements 102 (e.g., rotates about an axis where the optical elements 250 are arranged at least partially in a circular manner). In this embodiment, the field lens 272 moves at the substantially same speed as the imaging lens 276.

The focal plane of the field lens 272 coincides at location 290 with the back focal plane of the imaging lens 276 which gives a telecentric in/telecentric out system. Contrary to the arrangement of FIG. 39, the imaging lens 276 images a certain field. The focal length of the field lens 272 is such that the field size for the imaging lens 276 is smaller than 2 to 3 degrees half angle. In this case it is still possible to get diffraction limited imaging with one single element optics (e.g., a double aspherical surface single element). The field lenses 272 are arranged be mounted without spacing between the individual field lenses 272. In this case the duty cycle of the individually controllable elements 102 can be about 95%.

The focal length of the imaging lenses 276 is such that, with a NA of 0.2 at the substrate, these lenses will not become larger than the diameter of the field lenses 272. A focal length of the imaging lens 276 equal to the diameter of the field lens 272 will give a diameter of the imaging lens 276 that leaves enough space for mounting the imaging lens 276.

Due to the field angle, a slightly larger line than the pitch of the field lenses 272 can be written. This gives an overlap, also depending on the focal length of the imaging lens 276, between the imaged lines of neighboring individually controllable elements 102 on the substrate. Accordingly, the individually controllable elements 102 may be mounted on the same pitch as the optical elements 250 on, for example, one ring.

Figure 42:
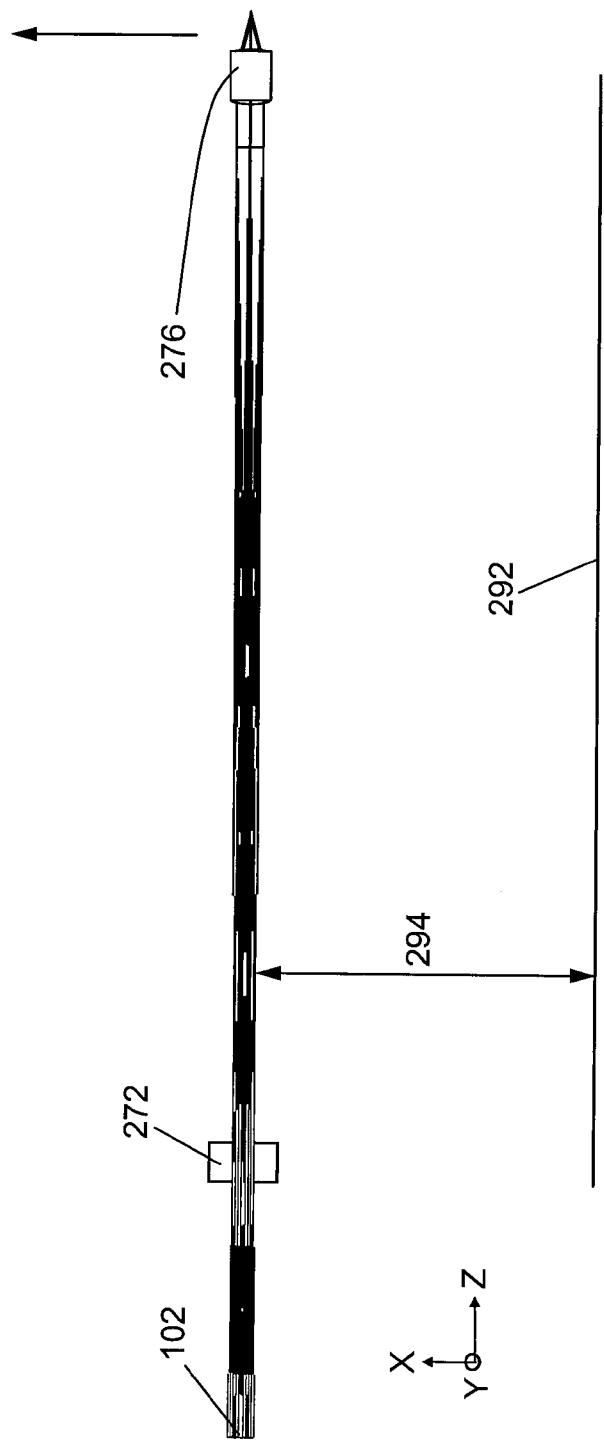
FIG. 42 depicts schematically an arrangement of 8 lines being written simultaneously by a single movable optical element 250 set of FIG. 41.

To avoid relatively small double aspherical imaging lenses 276, reduce the amount of optics of the moving optical elements 250 and to use standard laser diodes as individually controllable elements 102, there is a possibility in this embodiment to image multiple individually controllable elements 102 with a single lens set of the movable optical elements 250. As long as an individually controllable element 102 is telecentrically imaged on the field lens 272 of each movable optical element 250, the corresponding imaging lens 276 will re-image the beam from the individually controllable element 102 telecentrically on the substrate. If, for example 8 lines are written simultaneously, the field lens 272 diameter and the focal distance of the imaging lens 276 can be increased by a factor 8 with the same throughput while the amount of movable optical elements 250 can be decreased by a factor 8. Further, the optics that are substantially stationary in the X-Y plane could be reduced since a part of the optics needed for imaging the individually controllable elements 102 on the field lenses 272 could be common. Such an arrangement of 8 lines being written simultaneously by a single movable optical element 250 set is schematically depicted in FIG. 42 with, e.g., the rotation axis 292 of the optical element 250 set and the radius 294 of the optical element 250 set from the rotation axis 292. Going from a pitch of 1.5 mm to 12 mm (when 8 lines are written simultaneously by a single movable optical element 250 set) leaves enough space for mounting standard laser diodes as individually controllable elements 102. In an embodiment, 224 individually controllable elements 102 (e.g., standard laser diodes) may be used. In an embodiment, 120 optical element 250 sets may be used. In an embodiment, 28 substantially stationary optics sets may be used with the 224 individually controllable elements 102.

Figure 43:
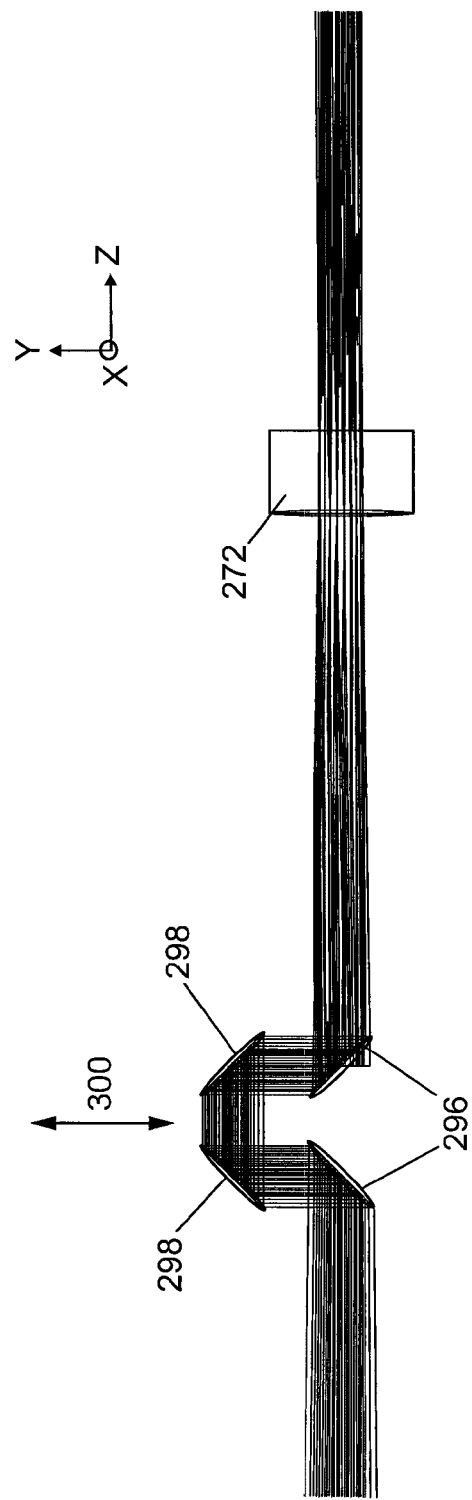
FIG. 43 depicts a schematic arrangement to control focus with a moving rooftop in the arrangement of FIG. 41.

In this embodiment, it is also relatively easy to focus locally with an element that does not move along or in conjunction with movable optical elements 250. As long as the telecentric images of the individually controllable elements 102 on the field lens 272 are moved along the optical axis and kept telecentric, the focus of the images on the substrate will only change and the images will remain telecentric. FIG. 43 depicts a schematic arrangement to control focus with a moving rooftop in the arrangement of FIG. 41. Two folding mirrors 296 with a rooftop (e.g., a prism or a mirror set) 298 are placed in the telecentric beams from the individually controllable elements 102 before the field lens 272. By moving the rooftop 298 away or towards the folding mirrors 296 in the direction 300, the image is shifted along the optical axis and therefore also with respect to the substrate. Because there is a large magnification along the optical axis since the axial focus change is equal to the quadratic ratio of the F/numbers, a 25 µm defocus at the substrate with a F/2.5 beam will give a focus shift at the field lens 272 with a f/37.5 beam of 5.625 mm $(37.5/2.5)^2$. This means that the rooftop 298 has to move half of that.

Embodiments are also provided below in numbered clauses:

1. A lithographic apparatus comprising:
    a substrate holder constructed to hold and move a substrate;
    a modulator configured to modulate a plurality of beams according to a desired pattern, the modulator comprising an array of electro-optical deflectors, the array extending substantially perpendicularly to an optical axis of the apparatus; and
    a projection system configured to receive and project the modulated beams toward the movable substrate.
2. The lithographic apparatus of clause 1, further comprising, in use, a donor structure located between the modulator and the substrate and onto which, in use, the modulated beams impinge, the donor structure having a donor material layer transferable from the donor structure onto the substrate.
3. The lithographic apparatus of clause 2, wherein the donor material is a metal.
4. The lithographic apparatus of any of clauses 1-3, wherein the modulated beams, in use, impinge the substrate and cause material of the substrate to be ablated.
5. The lithographic apparatus of any of clauses 1-4, wherein an electro-optical deflector of the plurality of electro-optical deflectors comprises a prism of electro-optic material, the prism situated non-perpendicularly with respect to an incident beam on the entrance face of the prism.
6. The lithographic apparatus of any of clauses 1-5, wherein the electro-optical deflectors comprise a first set of electro-optical deflectors to deflect the beams in only a first direction and second set of electro-optical deflectors to deflect the beam in only a second different direction.
7. The lithographic apparatus of any of clauses 1-6, wherein an electro-optical deflector of the plurality of electro-optical deflectors comprises a plurality of prisms arranged in sequence along the beam path, each alternating prism having an opposite domain.
8. The lithographic apparatus of any of clauses 1-7, wherein an electro-optical deflector of the plurality of electro-optical deflectors comprise at least one selected from the following: $LiNbO_3$, $LiTaO_3$, $KH_2PO_4$ (KDP), or $NH_4H_2PO_4$ (ADP).
9. The lithographic apparatus of any of clauses 1-8, wherein an electro-optical deflector of the plurality of electro-optical deflectors has a refractive index gradient material.
10. A lithographic apparatus, comprising:
    a substrate holder constructed to hold a substrate;
    a modulator configured to modulate a beam according to a desired pattern, the modulator comprising an electro-optical deflector having a refractive index gradient material; and
    a projection system configured to receive and project the modulated beam toward a substrate.

11. The lithographic apparatus of clause 9 or clause 10, wherein the refractive index gradient material comprises potassium tantalite niobate.

12. The lithographic apparatus of any of clauses 1-11, further comprising a prism of substantially the same refractive index as the electro-optical deflector located at the entrance surface, or the exit surface, or both the entrance and exit surfaces of the electro-optical deflector.

13. A lithographic apparatus comprising:
a substrate holder constructed to hold a substrate;
a modulator configured to modulate a beam of radiation according to a desired pattern;
a projection system configured to receive and project the modulated beam toward the substrate; and
a controller configured to convert operation of the apparatus to use the modulated beam to perform at least two of the following: photolithography, material deposition or material removal.

14. The lithographic apparatus of clause 13, wherein the controller is configured to convert the operation between material deposition and material removal.

15. The lithographic apparatus of clause 14, wherein the controller is configured to convert the operation among photolithography, material deposition and material removal.

16. The lithographic apparatus of any of clauses 13-15, wherein the controller is configured to convert the operation to material deposition and the lithographic apparatus comprises, in use, a donor structure located between the modulator and the substrate, the donor structure having a donor material layer transferable from the donor structure onto the substrate.

17. A lithographic apparatus comprising:
a substrate holder constructed to hold a substrate;
a modulator configured to modulate a beam of radiation according to a desired pattern;
a projection system configured to receive and project the modulated beam toward the substrate; and
a donor structure support to movably support a donor structure at a location between the modulator and the substrate, the donor structure having a donor material layer transferable from the donor structure onto the substrate and the modulated beam, in use, impinges on the donor structure.

18. The lithographic apparatus of clause 17, wherein the donor structure support is movable with respect to the projection system.

19. The lithographic apparatus of clause 18, wherein the donor structure support is located on the substrate holder.

20. The lithographic apparatus of any of clauses 17-19, wherein the substrate is movable and the donor structure support is configured to move the donor structure with the substrate.

21. The lithographic apparatus of any of clauses 17-20, wherein the donor structure support is located on a frame above the substrate holder.

22. The lithographic apparatus of clause 21, wherein the donor structure support comprises a gas bearing comprising an inlet to supply gas to between the support and the donor structure and an outlet to remove gas from between the support and the donor structure.

23. The lithographic apparatus of any of clauses 16-22, wherein the donor material is a metal.

24. The lithographic apparatus of any of clauses 13-23, wherein the modulator comprises an electro-optical deflector.

25. The lithographic apparatus of any of clauses 10-24, wherein the modulator is configured to modulate a plurality of beams according to the desired pattern, the modulator comprising an array of electro-optical deflectors, the array extending substantially perpendicularly to an optical axis of the apparatus and the projection system is configured to receive and project the modulated beams toward the substrate.

26. The lithographic apparatus of any of clauses 1-25, comprising a controller configured to move the beam according to an efficient exposure mode where the modulator causes deflection of the beams in the X- and Y-directions while the substrate is moving during exposure using the beams.

27. The lithographic apparatus of any of clauses 1-26, wherein the projection system comprises an array of lenses to receive the plurality of beams.

28. The lithographic apparatus of clause 27, wherein each lens comprises at least two lenses arranged along a beam path of at least one of the plurality of beams from the modulator toward the substrate.

29. The lithographic apparatus of clause 28, wherein a first lens of the at least two lenses comprises a field lens and a second lens of the at least two lenses comprises an imaging lens.

30. The lithographic apparatus of clause 29, wherein the focal plane of the field lens coincides with the back focal plane of the imaging lens.

31. The lithographic apparatus of clause 28 or clause 29, wherein a plurality of the beams are imaged with a single combination of the field lens and the imaging lens.

32. The lithographic apparatus of any of clauses 29-31, further comprising a lens to focus at least one of the plurality of beams toward the first lens.

33. The lithographic apparatus of any of clauses 1-32, wherein the array of lenses are movable with respect to the modulator.

34. The lithographic apparatus of any of clauses 1-33, wherein the modulator comprises a radiation source.

35. The lithographic apparatus of clause 34, wherein the modulator comprises a plurality of individually controllable radiation sources to emit electromagnetic radiation.

36. A lithographic apparatus comprising:
a substrate holder constructed to hold and move a substrate;
a modulator configured to modulate a plurality of beams according to a desired pattern, the modulator comprising an electro-optical deflector to deflect the beams in a first direction;
a movable optical element to receive the beams from the electro-optical deflector, to deflect the beams in a second direction, and to project the modulated beams toward the movable substrate.

37. The lithographic apparatus of clause 36, wherein the second direction is substantially perpendicular to the first direction.

38. The lithographic apparatus of clause 36 or clause 37, wherein the movable optical element is configured to project the modulated beams on a target and wherein the apparatus is configured to move the target.

39. The lithographic apparatus of any of clauses 36-38, configured to move the target in substantially the first direction.

40. The lithographic apparatus of clause 39, wherein the target is on the substrate or on a donor structure having a donor material layer transferable from the donor structure onto the substrate.

41. The lithographic apparatus of any of clauses 36-40, wherein the electro-optical deflector consists of a single-dimension deflector.
42. The lithographic apparatus of any of clauses 36-40, wherein the electro-optical deflector is configured to deflect the beams in the first direction and the second direction.
43. The lithographic apparatus of any of clauses 36-42, further comprising, in use, a donor structure located between the modulator and the substrate and onto which, in use, the modulated beams impinge, the donor structure having a donor material layer transferable from the donor structure onto the substrate.
44. The lithographic apparatus of clause 43, wherein the donor material is a metal.
45. The lithographic apparatus of any of clauses 36-42, wherein the modulated beams, in use, impinge the substrate and cause material of the substrate to be ablated.
46. A beam deflection system, comprising an electro-optical deflector having a refractive index gradient material and a prism of substantially the same refractive index as the deflector at the entrance surface, or the exit surface, or both the entrance and exit surfaces of the deflector.
47. The beam deflection system of clause 46, wherein the refractive index gradient material comprises potassium tantalite niobate.
48. The beam deflection system of clause 46 or clause 47, further comprising:
   a substrate holder constructed to hold a substrate;
   a modulator configured to modulate a beam according to a desired pattern, the modulator comprising the electro-optical deflector; and
   a projection system configured to receive and project the modulated beam toward a substrate.
49. A beam deflection system, comprising a plurality of independently controllable and separated electro-optical deflectors arranged in sequence along a beam path.
50. The beam deflection system of clause 49, wherein an electro-optical deflector of the plurality of electro-optical deflectors has a refractive index gradient material.
51. The beam deflection system of clause 49 or clause 50, wherein an electro-optical deflector of the plurality of electro-optical deflectors has a prism of substantially the same refractive index as the deflector at the entrance surface, or the exit surface, or both the entrance and exit surfaces of the deflector.
52. The beam deflection system of any of clauses 49-51, wherein an electro-optical deflector of the plurality of electro-optical deflectors comprises a plurality of prisms arranged in sequence along the beam path, each alternating prism having an opposite domain.
53. The beam deflection system of any of clauses 49-52, comprising a first electro-optical deflector of the plurality of the electro-optical deflectors to deflect the beam in only a first direction and a second electro-optical deflector of the plurality of the electro-optical deflectors to deflect the beam in only a second different direction.
54. A device manufacturing method comprising:
   providing a plurality of beams modulated according to a desired pattern using an array of electro-optical deflectors, the array extending across the beam path of the beams;
   projecting the plurality of beams toward a substrate; and
   moving the substrate while projecting the beams.
55. A device manufacturing method comprising:
   modulating a beam of radiation according to a desired pattern;
   projecting the beam toward a substrate; and
   converting use of the modulated beam to perform at least two of the following: photolithography, material deposition or material removal.
56. A device manufacturing method comprising:
   modulating a beam of radiation according to a desired pattern;
   projecting the beam toward a substrate; and
   movably supporting a donor structure onto which the beam impinges, the donor structure having a donor material layer transferable from the donor structure onto the substrate.
57. A device manufacturing method comprising:
   modulating a beam of radiation according to a desired pattern using an electro-optical deflector having a refractive index gradient material; and
   projecting the beam toward a substrate.
58. A device manufacturing method comprising:
   modulating a plurality of beams of radiation according to a desired pattern using an electro-optical deflector to deflect the beams in a first direction;
   deflecting the beams deflected by the electro-optical deflector in a second direction using a movable optical element; and
   projecting the modulated beams from the optical element toward a substrate.
59. Use of one or more of the embodiments of the invention in the manufacture of flat panel displays.
60. Use of one or more of the embodiments of the invention in integrated circuit packaging.
61. A flat panel display manufactured according to or using any of the embodiments of the invention.
62. An integrated circuit device manufactured according to or using any of the embodiments of the invention.

Although specific reference may be made in this text to the use of a lithographic apparatus in the manufacture of a specific device or structure (e.g. an integrated circuit or a flat panel display), it should be understood that the lithographic apparatus and lithographic method described herein may have other applications. Applications include, but are not limited to, the manufacture of integrated circuits, integrated optical systems, guidance and detection patterns for magnetic domain memories, flat panel displays, LCDs, OLED displays, thin film magnetic heads, micro-electromechanical devices (MEMS), micro-opto-electromechanical systems (MOEMS), DNA chips, packaging (e.g., flip chip, redistribution, etc.), flexible displays or electronics (which are displays or electronics that may be rollable, bendable like paper and remain free of deformities, conformable, rugged, thin, and/or lightweight, e.g., flexible plastic displays), etc. Also, for instance in a flat panel display, the present apparatus and method may be used to assist in the creation of a variety of layers, e.g. a thin film transistor layer and/or a color filter layer. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A flat panel display substrate may be rectangular in shape. A lithographic apparatus designed to expose a substrate of this type may provide an exposure region which covers a full width of the rectangular substrate, or which covers a portion of the width (for example half of the width). The substrate may be scanned underneath the exposure region, while the patterning device synchronously provides the patterned beam. In this way, all or part of the desired pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The term "patterning device", used herein should be broadly interpreted as referring to any device that can be used to modulate the cross-section of a radiation beam such as to create a pattern in (part of) the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant by the array of individually controllable elements. This may be the case in an arrangement in which the eventual pattern formed on each part of the substrate is built up over a given period of time or a given number of exposures during which the pattern provided by the array of individually controllable elements and/or the relative position of the substrate changes. Generally, the pattern created on the target portion of the substrate will correspond to a particular functional layer in a device being created in the target portion, e.g., an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of an electronic devices (e.g., a computer), e.g., patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. The programmable mirror array may comprise a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. As an alternative, the filter may filter out the diffracted radiation, leaving the undiffracted radiation to reach the substrate. An array of diffractive optical MEMS devices may also be used in a corresponding manner. A diffractive optical MEMS device may comprise a plurality of reflective ribbons that may be deformed relative to one another to form a grating that reflects incident radiation as diffracted radiation. A further embodiment of a programmable mirror array employs a matrix arrangement of tiny mirrors, each of which may be individually tilted about an axis by applying a suitable localized electric field, or by employing piezoelectric actuation means. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. Nos. 5,296,891 and 5,523,193, and PCT Patent Application Publication Nos. WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

Where pre-biasing of features, optical proximity correction features, phase variation techniques and/or multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

The projection system and/or illumination system may include various types of optical components, e.g., refractive, reflective, magnetic, electromagnetic, electrostatic or other types of optical components, or any combination thereof, to direct, shape, or control the beam of radiation.

The lithographic apparatus may be of a type having two (e.g., dual stage) or more substrate tables (and/or two or more patterning device tables). In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are used to increase the NA of projection system. The term "immersion" as used herein does not mean that a structure, e.g., a substrate, must be submerged in liquid, but rather only means that liquid is located between the projection system and the substrate during exposure.

Further, the apparatus may be provided with a fluid processing cell to allow interactions between a fluid and irradiated parts of the substrate (e.g., to selectively attach chemicals to the substrate or to selectively modify the surface structure of the substrate).

In an embodiment, the substrate has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

While, in an embodiment, the patterning device 104 is described and/or depicted as being above the substrate 114, it may instead or additionally be located under the substrate 114. Further, in an embodiment, the patterning device 104 and the substrate 114 may be side by side, e.g., the patterning device 104 and substrate 114 extend vertically and the pattern is projected horizontally. In an embodiment, a patterning device 104 is provided to expose at least two opposite sides of a substrate 114. For example, there may be at least two patterning devices 104, at least on each respective opposing side of the substrate 114, to expose those sides. In an embodiment, there may be a single patterning device 104 to project one side of the substrate 114 and appropriate optics (e.g., beam directing mirrors) to project a pattern from the single patterning device 104 onto another side of the substrate 114.

In the description herein, the term "lens" should be understood generally to encompass any refractive, reflective, and/or diffractive optical element that provides the same function as the referenced lens. For example, an imaging lens may be embodied in the form of a conventional refractive lens having optical power, in the form of a Schwarzschild reflective system having optical power, and/or in the form of a zone plate having optical power. Moreover, an imaging lens may comprise non-imaging optics if the resulting effect is to produce a converged beam.

Further embodiments according to the invention are provided in below numbered clauses:

1. A lithographic apparatus comprising:
   a substrate holder constructed to hold and move a substrate;
   a modulator configured to modulate a plurality of beams according to a desired pattern, the modulator comprising an array of electro-optical deflectors, the array extending substantially perpendicularly to an optical axis of the apparatus; and
   a projection system configured to receive and project the modulated beams toward the movable substrate.
2. The lithographic apparatus of clause 1, further comprising, in use, a donor structure located between the modulator and the substrate and onto which, in use, the modulated beams impinge, the donor structure having a donor material layer transferable from the donor structure onto the substrate.
3. The lithographic apparatus of clause 2, wherein the donor material is a metal.
4. The lithographic apparatus of any of clauses 1-3, wherein the modulated beams, in use, impinge the substrate and cause material of the substrate to be ablated.
5. The lithographic apparatus of any of clauses 1-4, wherein an electro-optical deflector of the plurality of electro-optical deflectors comprises a prism of electro-optic material, the prism situated non-perpendicularly with respect to an incident beam on the entrance face of the prism.
6. The lithographic apparatus of any of clauses 1-5, wherein the electro-optical deflectors comprise a first set of electro-optical deflectors to deflect the beams in only a first direction and second set of electro-optical deflectors to deflect the beam in only a second different direction.

7. The lithographic apparatus of any of clauses 1-6, wherein an electro-optical deflector of the plurality of electro-optical deflectors comprises a plurality of prisms arranged in sequence along the beam path, each alternating prism having an opposite domain.
8. The lithographic apparatus of any of clauses 1-7, wherein an electro-optical deflector of the plurality of electro-optical deflectors comprise at least one selected from the following: $LiNbO_3$, $LiTaO_3$, $KH_2PO_4$ (KDP), or $NH_4H_2PO_4$ (ADP).
9. The lithographic apparatus of any of clauses 1-8, wherein an electro-optical deflector of the plurality of electro-optical deflectors has a refractive index gradient material.
10. A lithographic apparatus, comprising:
    a substrate holder constructed to hold a substrate;
    a modulator configured to modulate a beam according to a desired pattern, the modulator comprising an electro-optical deflector having a refractive index gradient material; and
    a projection system configured to receive and project the modulated beam toward a substrate.
11. The lithographic apparatus of clause 9 or clause 10, wherein the refractive index gradient material comprises potassium tantalite niobate.
12. The lithographic apparatus of any of clauses 1-11, further comprising a prism of substantially the same refractive index as the electro-optical deflector located at the entrance surface, or the exit surface, or both the entrance and exit surfaces of the electro-optical deflector.
13. A lithographic apparatus comprising:
    a substrate holder constructed to hold a substrate;
    a modulator configured to modulate a beam of radiation according to a desired pattern;
    a projection system configured to receive and project the modulated beam toward the substrate; and
    a controller configured to convert operation of the apparatus to use the modulated beam to perform at least two of the following: photolithography, material deposition or material removal.
14. The lithographic apparatus of clause 13, wherein the controller is configured to convert the operation between material deposition and material removal.
15. The lithographic apparatus of clause 14, wherein the controller is configured to convert the operation among photolithography, material deposition and material removal.
16. The lithographic apparatus of any of clauses 13-15, wherein the controller is configured to convert the operation to material deposition and the lithographic apparatus comprises, in use, a donor structure located between the modulator and the substrate, the donor structure having a donor material layer transferable from the donor structure onto the substrate.
17. A lithographic apparatus comprising:
    a substrate holder constructed to hold a substrate;
    a modulator configured to modulate a beam of radiation according to a desired pattern;
    a projection system configured to receive and project the modulated beam toward the substrate; and
    a donor structure support to movably support a donor structure at a location between the modulator and the substrate, the donor structure having a donor material layer transferable from the donor structure onto the substrate and the modulated beam, in use, impinges on the donor structure.
18. The lithographic apparatus of clause 17, wherein the donor structure support is movable with respect to the projection system.
19. The lithographic apparatus of clause 18, wherein the donor structure support is located on the substrate holder.
20. The lithographic apparatus of any of clauses 17-19, wherein the substrate is movable and the donor structure support is configured to move the donor structure with the substrate.
21. The lithographic apparatus of any of clauses 17-20, wherein the donor structure support is located on a frame above the substrate holder.
22. The lithographic apparatus of clause 21, wherein the donor structure support comprises a gas bearing comprising an inlet to supply gas to between the support and the donor structure and an outlet to remove gas from between the support and the donor structure.
23. The lithographic apparatus of any of clauses 16-22, wherein the donor material is a metal.
24. The lithographic apparatus of any of clauses 13-23, wherein the modulator comprises an electro-optical deflector.
25. The lithographic apparatus of any of clauses 10-24, wherein the modulator is configured to modulate a plurality of beams according to the desired pattern, the modulator comprising an array of electro-optical deflectors, the array extending substantially perpendicularly to an optical axis of the apparatus and the projection system is configured to receive and project the modulated beams toward the substrate.
26. The lithographic apparatus of any of clauses 1-25, comprising a controller configured to move the beam according to an efficient exposure mode where the modulator causes deflection of the beams in the X- and Y-directions while the substrate is moving during exposure using the beams.
27. The lithographic apparatus of any of clauses 1-26, wherein the projection system comprises an array of lenses to receive the plurality of beams.
28. The lithographic apparatus of clause 27, wherein each lens comprises at least two lenses arranged along a beam path of at least one of the plurality of beams from the modulator toward the substrate.
29. The lithographic apparatus of clause 28, wherein a first lens of the at least two lenses comprises a field lens and a second lens of the at least two lenses comprises an imaging lens.
30. The lithographic apparatus of clause 29, wherein the focal plane of the field lens coincides with the back focal plane of the imaging lens.
31. The lithographic apparatus of clause 28 or clause 29, wherein a plurality of the beams are imaged with a single combination of the field lens and the imaging lens.
32. The lithographic apparatus of any of clauses 29-31, further comprising a lens to focus at least one of the plurality of beams toward the first lens.
33. The lithographic apparatus of any of clauses 1-32, wherein the array of lenses are movable with respect to the modulator.
34. The lithographic apparatus of any of clauses 1-33, wherein the modulator comprises a radiation source.
35. The lithographic apparatus of clause 34, wherein the modulator comprises a plurality of individually controllable radiation sources to emit electromagnetic radiation.
36. A lithographic apparatus comprising:
    a substrate holder constructed to hold and move a substrate;

a modulator configured to modulate a plurality of beams according to a desired pattern, the modulator comprising an electro-optical deflector to deflect the beams in a first direction;

a movable optical element to receive the beams from the electro-optical deflector, to deflect the beams in a second direction, and to project the modulated beams toward the movable substrate.

37. The lithographic apparatus of clause 36, wherein the second direction is substantially perpendicular to the first direction.

38. The lithographic apparatus of clause 36 or clause 37, wherein the movable optical element is configured to project the modulated beams on a target and wherein the apparatus is configured to move the target.

39. The lithographic apparatus of any of clauses 36-38, configured to move the target in substantially the first direction.

40. The lithographic apparatus of clause 39, wherein the target is on the substrate or on a donor structure having a donor material layer transferable from the donor structure onto the substrate.

41. The lithographic apparatus of any of clauses 36-40, wherein the electro-optical deflector consists of a single-dimension deflector.

42. The lithographic apparatus of any of clauses 36-40, wherein the electro-optical deflector is configured to deflect the beams in the first direction and the second direction.

43. The lithographic apparatus of any of clauses 36-42, further comprising, in use, a donor structure located between the modulator and the substrate and onto which, in use, the modulated beams impinge, the donor structure having a donor material layer transferable from the donor structure onto the substrate.

44. The lithographic apparatus of clause 43, wherein the donor material is a metal.

45. The lithographic apparatus of any of clauses 36-42, wherein the modulated beams, in use, impinge the substrate and cause material of the substrate to be ablated.

46. A beam deflection system, comprising an electro-optical deflector having a refractive index gradient material and a prism of substantially the same refractive index as the deflector at the entrance surface, or the exit surface, or both the entrance and exit surfaces of the deflector.

47. The beam deflection system of clause 46, wherein the refractive index gradient material comprises potassium tantalite niobate.

48. The beam deflection system of clause 46 or clause 47, further comprising:
a substrate holder constructed to hold a substrate;
a modulator configured to modulate a beam according to a desired pattern, the modulator comprising the electro-optical deflector; and
a projection system configured to receive and project the modulated beam toward a substrate.

49. A beam deflection system, comprising a plurality of independently controllable and separated electro-optical deflectors arranged in sequence along a beam path.

50. The beam deflection system of clause 49, wherein an electro-optical deflector of the plurality of electro-optical deflectors has a refractive index gradient material.

51. The beam deflection system of clause 49 or clause 50, wherein an electro-optical deflector of the plurality of electro-optical deflectors has a prism of substantially the same refractive index as the deflector at the entrance surface, or the exit surface, or both the entrance and exit surfaces of the deflector.

52. The beam deflection system of any of clauses 49-51, wherein an electro-optical deflector of the plurality of electro-optical deflectors comprises a plurality of prisms arranged in sequence along the beam path, each alternating prism having an opposite domain.

53. The beam deflection system of any of clauses 49-52, comprising a first electro-optical deflector of the plurality of the electro-optical deflectors to deflect the beam in only a first direction and a second electro-optical deflector of the plurality of the electro-optical deflectors to deflect the beam in only a second different direction.

54. A device manufacturing method comprising:
providing a plurality of beams modulated according to a desired pattern using an array of electro-optical deflectors, the array extending across the beam path of the beams;
projecting the plurality of beams toward a substrate; and
moving the substrate while projecting the beams.

55. A device manufacturing method comprising:
modulating a beam of radiation according to a desired pattern;
projecting the beam toward a substrate; and
converting use of the modulated beam to perform at least two of the following: photolithography, material deposition or material removal.

56. A device manufacturing method comprising:
modulating a beam of radiation according to a desired pattern;
projecting the beam toward a substrate; and
movably supporting a donor structure onto which the beam impinges, the donor structure having a donor material layer transferable from the donor structure onto the substrate.

57. A device manufacturing method comprising:
modulating a beam of radiation according to a desired pattern using an electro-optical deflector having a refractive index gradient material; and
projecting the beam toward a substrate.

58. A device manufacturing method comprising:
modulating a plurality of beams of radiation according to a desired pattern using an electro-optical deflector to deflect the beams in a first direction;
deflecting the beams deflected by the electro-optical deflector in a second direction using a movable optical element; and
projecting the modulated beams from the optical element toward a substrate.

59. Use of one or more of the inventions in the above clauses in the manufacture of flat panel displays.

60. Use of one or more of the inventions in the above clauses in integrated circuit packaging.

61. A flat panel display manufactured according to or using any of the inventions in the above clauses.

62. An integrated circuit device manufactured according to or using any of the inventions in the above clauses.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. For example, in an embodiment, the movable individually controllable elements may be combined with a non-movable array of individually controllable elements, for example, to provide or have a back-up system. In an embodiment, one or more features or aspects disclosed in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties, may be combined with or substituted for one or more features or aspects disclosed herein. An embodiment of the present invention may be used with any form of programmable patterning device including, for example, those discussed above.

Thus, while various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus comprising:
a substrate holder constructed to hold and move a substrate;
a modulator configured to modulate a plurality of electromagnetic radiation beams according to a desired pattern;
an array of electro-optical deflectors configured to receive the modulated plurality of beams and deflect the modulated beams, the array extending substantially perpendicularly to an optical axis of the apparatus; and
a projection system configured to receive and project the modulated beams toward the movable substrate.

2. The lithographic apparatus of claim 1, further comprising, in use, a donor structure located between the modulator and the substrate and onto which, in use, the modulated beams impinge, the donor structure having a donor material layer transferable from the donor structure onto the substrate.

3. The lithographic apparatus of claim 2, wherein the donor material is a metal.

4. The lithographic apparatus of claim 1, wherein the modulated beams, in use, impinge the substrate and cause material of the substrate to be ablated.

5. The lithographic apparatus of claim 1, wherein an electro-optical deflector of the plurality of electro-optical deflectors comprises a prism of electro-optic material, the prism situated non-perpendicularly with respect to an incident beam on the entrance face of the prism.

6. The lithographic apparatus of claim 1, wherein the electro-optical deflectors comprise a first set of electro-optical deflectors to deflect the beams in only a first direction and a second set of electro-optical deflectors to deflect the beam in only a second different direction.

7. The lithographic apparatus of claim 1, wherein an electro-optical deflector of the plurality of electro-optical deflectors comprises a plurality of prisms arranged in sequence along the beam path, each alternating prism having an opposite domain.

8. The lithographic apparatus of claim 1, wherein an electro-optical deflector of the plurality of electro-optical deflectors comprises at least one selected from the following: $LiNbO_3$, $LiTaO_3$, $KH_2PO_4$ (KDP), or $NH_4H_2PO_4$ (ADP).

9. The lithographic apparatus of claim 1, wherein an electro-optical deflector of the plurality of electro-optical deflectors has a refractive index gradient material.

10. A lithographic apparatus, comprising:
a substrate holder constructed to hold a substrate;
a modulator configured to modulate a beam according to a desired pattern, the modulator comprising an electro-optical deflector having a refractive index gradient material configured to provide a plurality of refractive index changes along the optical path of the beam across the material upon application of a potential difference; and
a projection system configured to receive and project the modulated beam toward a substrate.

11. A lithographic apparatus comprising:
a substrate holder constructed to hold a substrate;
a modulator configured to modulate a beam of radiation according to a desired pattern;
a projection system configured to receive and project the modulated beam toward the substrate; and
a controller configured to convert operation of the apparatus to use the modulated beam to perform photolithography, material deposition directly caused by the modulated beam and material removal directly caused by the modulated beam.

12. A lithographic apparatus comprising:
a substrate holder constructed to hold a substrate;
a modulator configured to modulate a plurality of beams of radiation according to a desired pattern the modulator comprising a plurality of radiation sources;
a projection system configured to receive and project the modulated beams toward the substrate; and
a donor structure support to movably support a donor structure at a location between the modulator and the substrate and to allow relative movement between the donor structure and the substrate, the donor structure having a donor material layer transferable from the donor structure onto the substrate and the modulated beams, in use, impinge together on the donor structure.

13. The lithographic apparatus of claim 12, further comprising an array of deflectors configured to receive the modulated plurality of beams and deflect the modulated beams, the array extending substantially perpendicularly to an optical axis of the apparatus.

14. A lithographic apparatus comprising:
a substrate holder constructed to hold and move a substrate;

a modulator configured to modulate a plurality of beams according to a desired pattern, the modulator comprising an electro-optical deflector to deflect a beam spot of each of the beams located in a plane perpendicular to a path of the beams, in a first direction parallel to the plane; and a movable refractive optical element to receive the beams from the electro-optical deflector, to deflect a beam spot of each of the beams located in a plane perpendicular to a path of the beams, in a second direction parallel to the plane and transverse to the first direction, and to project the modulated beams toward the movable substrate.

15. The lithographic apparatus of claim 14, wherein the second direction is substantially perpendicular to the first direction.

16. The lithographic apparatus of claim 14, wherein the movable optical element is configured to project the modulated beams on a target and wherein the apparatus is configured to move the target.

17. The lithographic apparatus of claim 14, configured to move the target in substantially the first direction.

18. The lithographic apparatus of claim 17, wherein the target is on the substrate or on a donor structure having a donor material layer transferable from the donor structure onto the substrate.

19. The lithographic apparatus of claim 14, wherein the electro-optical deflector consists of a single-dimension deflector.

20. The lithographic apparatus of claim 14, wherein the electro-optical deflector is configured to deflect the beams in the first direction and the second direction.

21. The lithographic apparatus of claim 14, further comprising, in use, a donor structure located between the modulator and the substrate and onto which, in use, the modulated beams impinge, the donor structure having a donor material layer transferable from the donor structure onto the substrate.

* * * * *